United States Patent [19]

Grondalski

[11] Patent Number: 4,985,832

[45] Date of Patent: Jan. 15, 1991

[54] SIMD ARRAY PROCESSING SYSTEM WITH ROUTING NETWORKS HAVING PLURALITY OF SWITCHING STAGES TO TRANSFER MESSAGES AMONG PROCESSORS

[75] Inventor: Robert S. Grondalski, Maynard, Mass.

[73] Assignee: Digital Equipment Corporation, Maynard, Mass.

[21] Appl. No.: 909,013

[22] Filed: Sep. 18, 1986

[51] Int. Cl.$^5$ .......................... G06F 3/00; G06F 9/00; G06F 11/00; G06F 15/16

[52] U.S. Cl. .................................. 364/200; 364/265; 364/240.6; 370/53; 379/220

[58] Field of Search .................. 364/200, 900; 370/53, 370/54, 60; 379/219, 220

[56] References Cited

U.S. PATENT DOCUMENTS

| | | | |
|---|---|---|---|
| 3,727,006 | 4/1973 | Jacob | 370/54 |
| 3,883,855 | 5/1975 | Brightman et al. | 364/200 |
| 4,022,982 | 5/1977 | Hemdal | 370/54 |
| 4,264,895 | 4/1981 | Mukaemachi et al. | 379/272 |
| 4,314,349 | 2/1982 | Batcher | 364/716 |
| 4,380,046 | 4/1983 | Fung | 364/200 |
| 4,412,303 | 10/1983 | Barnes et al. | 364/900 |
| 4,439,826 | 3/1984 | Lawrence et al. | 364/200 |
| 4,466,060 | 8/1984 | Riddle | 364/200 |
| 4,498,133 | 2/1985 | Bolton et al. | 364/200 |
| 4,627,048 | 12/1986 | Larson | 370/60 |
| 4,630,259 | 12/1986 | Larson et al. | 370/60 |
| 4,638,475 | 1/1987 | Koike | 370/60 |
| 4,651,318 | 3/1987 | Luderer | 370/94 |
| 4,654,784 | 3/1987 | Campanini | 364/200 |
| 4,661,947 | 4/1987 | Lea et al. | 370/60 |
| 4,706,240 | 11/1987 | Payne | 370/60 |
| 4,731,878 | 3/1988 | Vaidya | 455/600 |

OTHER PUBLICATIONS

Massively Parallel Processor, "A New Super-Computer for the 1980's", Goodyear Aerospace Corporation, Akron, Ohio, Oct. 1983.

*Primary Examiner*—Raulfe B. Zache
*Assistant Examiner*—Ayni Mohamed
*Attorney, Agent, or Firm*—Fish & Richardson

[57] ABSTRACT

An array processing system including a plurality of processing elements each including a processor and an associated memory module, the system further including a router network over which each processing element can transfer messages to other random processing elements, a mechanism by which a processor can transmit data to one of four nearest-neighbor processors. In addition, the processing elements are divided into groups each with four processing elements, in which one of the processing elements can access data in the other processing elements' memory modules. The routing network switches messages in a plurality of switching stages, with each stage connecting to the next stage through communications paths that are divided into groups, each group, in turn being associated with selected address signals. A communications path continuity test circuit associated with each path detects any discontinuity in the communications path and disables the path. Thus, the stage may attempt to transfer a message over another path associated with the same address.

42 Claims, 16 Drawing Sheets

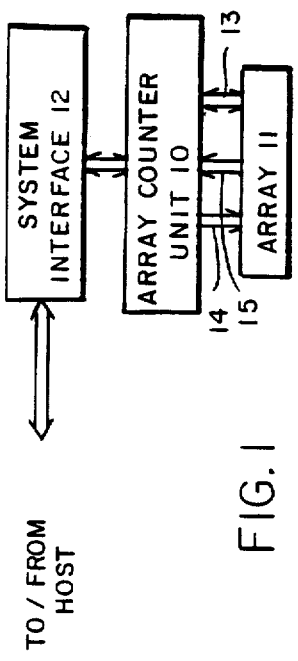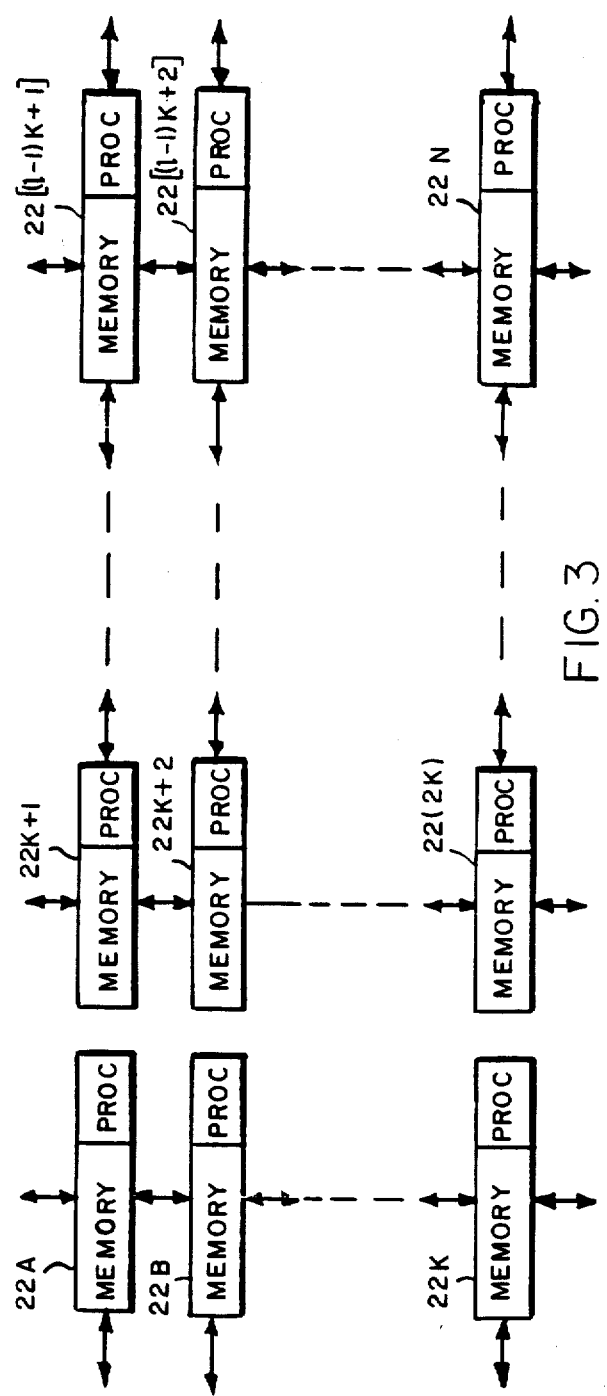

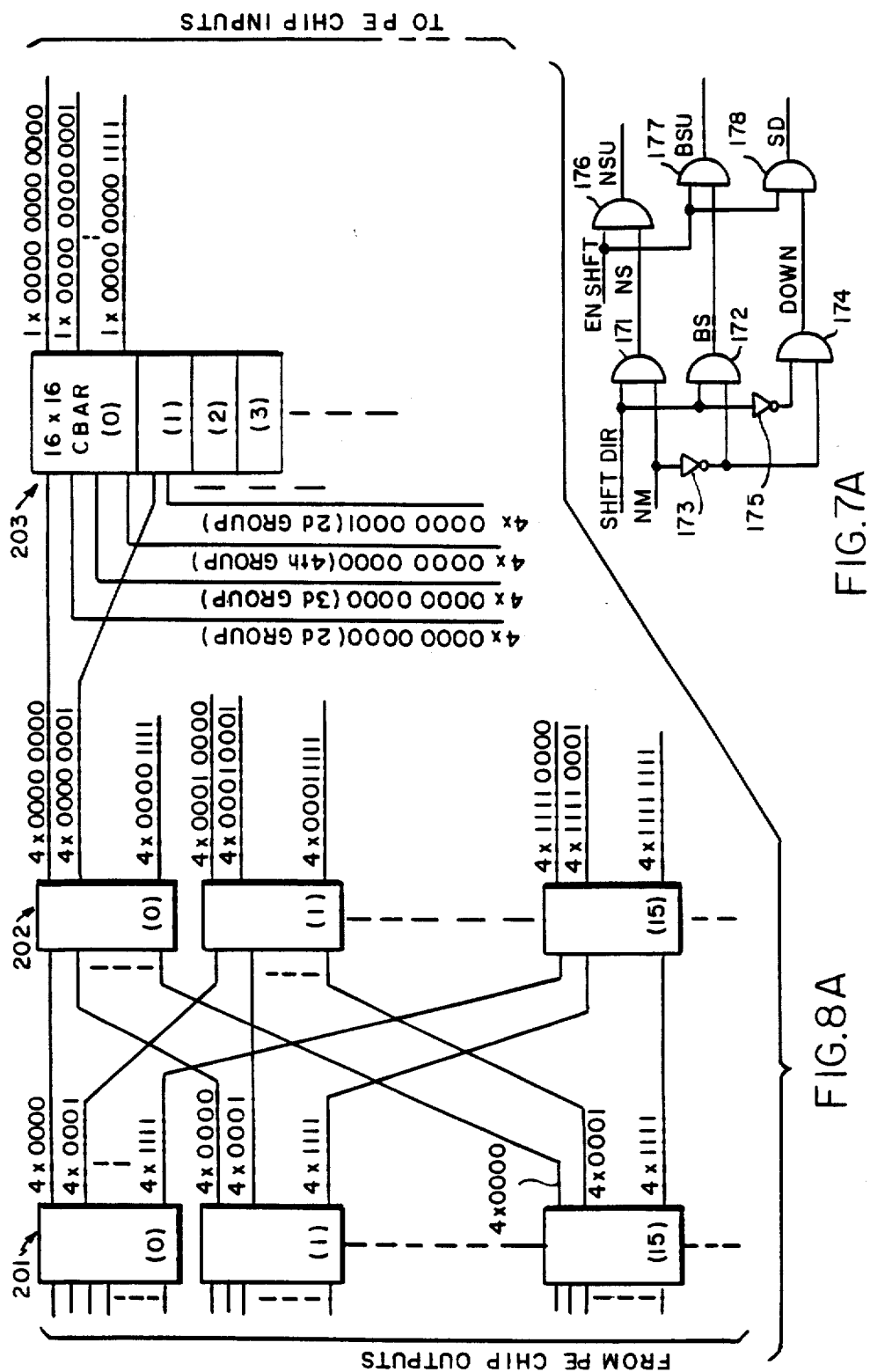

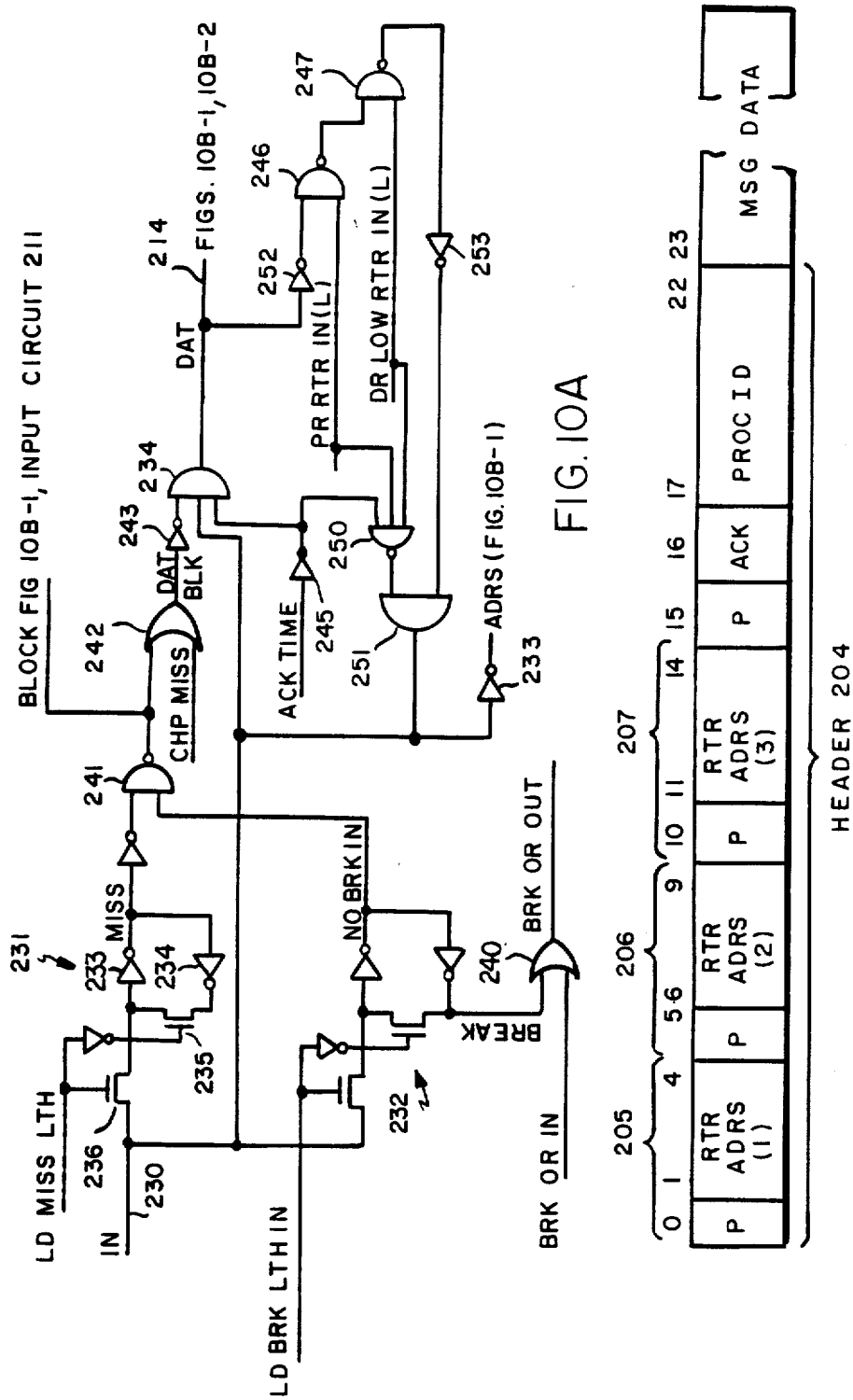

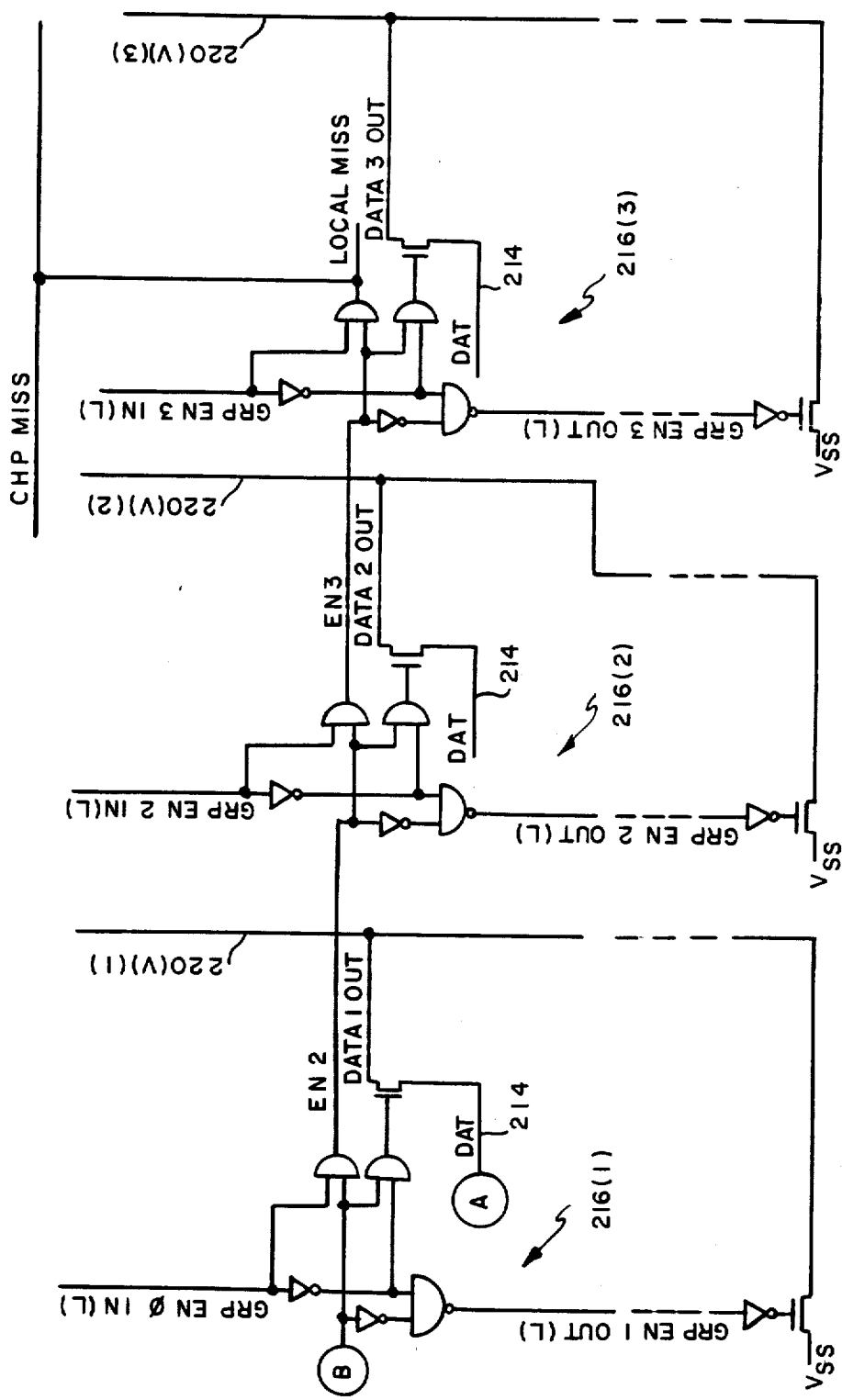

SIMD ARRAY PROCESSING SYSTEM WITH ROUTING NETWORKS HAVING PLURALITY OF SWITCHING STAGES TO TRANSFER MESSAGES AMONG PROCESSORS

BACKGROUND OF THE INVENTION

1. Field of the Invention

The invention relates generally to the field of digital data processing systems, and more particularly to array processing systems which incorporate a large number of processors that are interconnected in a regular connection structure and in which all of the processors receive the same instruction from a common control structure.

2. Description of the Prior Art

A digital data processing system comprises three basic elements, namely, a memory element, an input/output element and a processor element. The memory element stores information in addressable storage locations. This information includes data and instructions for processing the data. The processor element fetches information from the memory element, interprets the information as either an instruction or data, processes the data in accordance with the instructions, and returns the processed data to the memory element. The input/output element, under control of the processor element, also communicates with the memory element to transfer information, including instructions and data to be processed, to the memory, and to obtain processed data from the memory.

Most modern data processing systems are considered "von Neumann" machines, since they are constructed according to a paradigm attributed to John von Neumann. Von Neumann machines are characterized by having a processing element, a global memory Which stores all information in the system, and a program counter which identifies the location in the global memory of the instruction being executed. The processing element is executing one instruction at a time, that is, the instruction that is identified by the program counter. When that instruction has been executed, the program counter is advanced to identify the location of the next instruction to be executed. (In most modern systems, the program counter is actually advanced before the processor has finished processing the current instruction).

Von Neumann systems are conceptually uncomplicated to design and program, since they do only one operation at a time, but they are also relatively slow. A number of advancements have been made to the original von Neumann paradigm to permit the various parts of the system, most particularly the various components of the processor, to operate relatively independently and achieve a significant increase in processing speed. The first such advancement was pipelining of the various steps in executing an instruction, including instruction fetch, operation code decode (a typical instruction includes an operation code which identifies the operation to be performed and in most cases one or more operand specifiers which identify the operands, or data, to be used in executing the instruction), operand fetch, execution (that is, performing the operation set forth in the operation code on the fetched operands), and storing of processed data, which are performed relatively independently by separate hardware in the processor. In a pipelined processor, the processor's instruction fetch hardware may be fetching one instruction while other hardware is decoding the operation code of another, fetching the operands of another, executing yet another instruction and storing the processed data of a fifth instruction. Pipelining does not speed up processing of an individual instruction, but since the processor begins processing a second instruction before it has finished processing the first, it does speed up processing a series of instructions.

Pipelining has also been used within several of the circuits comprising the processor, most notably the circuits which perform certain arithmetic operations, to speed processing of a series of calculations. Like pipelining of instruction processing, pipelining arithmetic operations does not speed up an individual calculation, but it does speed up processing of a series of calculations.

A pipelined processor is obviously much more complicated than a simple processor in a von Neumann system, as it requires not only the various circuits to perform each of the operations (in a simple von Neumann processor, many circuits could be used to perform several operations), but also control circuits to coordinate the activities of the various circuits. However, the speed-up of the system can be dramatic.

More recently, some processors have been provided with execution hardware which include multiple functional units each being designed to perform a certain type of mathematical operation. For example, some processors have separate functional units for performing integer arithmetic and floating point arithmetic, since floating point arithmetic requires handling two parts of a floating point number, namely the fraction and the exponent, while numbers in integer arithmetic have only one part. Some processors, for example the CDC 6600 manufactured by Control Data Corporation, included a number of separate hardware functional units each of which performs one or only several types of mathematical operations, including addition, multiplication, division, branch, and logical operations, all of which may be executing at once. This can be helpful in speeding up certain calculations, most particularly those in which several functional units may be used at one time for performing part of the calculation.

In a processor which incorporates pipelining or multiple functional units (or both, since both may be incorporated into a processor), a single instruction stream operates on a single data stream. That is, each instruction operates on data to produce one calculation at a time. Such processors have been termed "SISD", for "single instruction-single data". However, if a program requires a segment of a program to be used to operate on a number of diverse elements of data to produce a number of calculations, the program causes the processor to loop through that segment for each calculation. In some cases, in which the program segment is short or there are only a few data elements, the time required to perform the calculations on the data is not unduly long.

However, for many types of such programs, SISD processors would require a very long time to perform all of the calculations that are required. Accordingly, processors have been developed which incorporate a large number of processing elements, all operating concurrently on the same instruction, with each processing element processing a separate data stream. These processors have been termed "SIMD" processors, for "single instruction-multiple data".

SIMD processors are useful in a number of applications, including image processing, signal processing, artificial intelligence, database operations and computer simulation of a number of things such as electronic circuits and fluid dynamics. In image processing, each processor performs processing on a pixel ("picture element") to enhance the overall image. In signal processing, the processors concurrently perform a number of the calculations required to produce the Fast Fourier Transform of the signal. In artificial intelligence, the processors perform searches on extensive databases representing the stored knowledge of the application. In database operations, the processors perform searches, as in the artificial intelligence applications, and they also perform sorting operations. In computer simulation of, for example, electronic circuits, each processor represents one part of the circuit, and the processor's calculations indicates the response of the part to signals from other parts of the circuit. Similarly, in simulating fluid dynamics, which can be useful in a number of applications such as weather prediction and the design of airplanes, each processor is associated with one point in space, and the calculations performed provide information about various factors such as fluid flow, temperature, pressure, and so forth.

Typical SIMD processors include two primary components, namely an array of processor elements and a routing network over which the processor elements may communicate the results of a calculation to other processor elements for use in future calculations. In addition, SIMD processors include a control processor for controlling the operations of the processor elements and routing network in response to instructions and data from a host computer system.

Several routing networks have been used in SIMD processors and a number of others have been proposed. In one routing network, which has been used in the Massively Parallel Processor, manufactured by Goodyear Arrowspace Corporation ("Goodyear MPP"), the processor elements are interconnected in a matrix, or mesh, arrangement. In such an arrangement, the processor elements are connected in rows and columns and directly communicate only with their four nearest neighbors. This arrangement can be somewhat slow if communications may be to random processor elements, but the number of wires which are required to make the interconnections is lower than in most other arrangements, on the order of 4n, where "n" is the number of processor elements, assuming only unidirectional transfer of messages over each wire. If each wire can transfer bidirectionally, the number of wires is reduced by half, with a possible reduction in the message transfer rate.

The matrix network is also used on the "Connection Machine", manufactured by Thinking Machines Corporation, but that machine also includes a hypercube network allowing communications between random processor elements (that is, processor elements which are not nearest neighbors). In a hypercube network, each processor chip connects directly to twelve other processor chip. Each processor chip includes several processor elements and circuits which form part of the routing network. The routing circuits on each chip receive messages from the processor elements on the chip for transmission to processor elements on other processor chips. In addition, the routing circuits receive messages from other processor chips. If a message from another processor chip is to be received by a processor element on the chip, it forwards it to that element; however, if the message is to be received by a processor element on another chip, it transmits the message over a wire to another processor another chip. The procedure is repeated until the message reaches the intended recipient. Thus, the routing circuits on each chip must be able to handle not only messages from the processor elements on the chip, but also from messages from other chips which may or may not be addressed to processor elements on the chip.

A hypercube network handles communications fairly rapidly, but it requires a large number of wires, on the order of 12n, if messages are transferred unidirectionally over each wire. For example, if "n" were 4096 (4K, K=1024), the hypercube would require on the order of 48K wires. If the wires transfer messages bidirectionally, only 24K wires would be required, but the volume of message traffic that could be carried would also be reduced. Typically, the larger the number of wires in a routing network, the more expensive is the network, and the greater is the likelihood of failure resulting from broken wires or failed switching elements which interconnect the wires.

Another routing arrangement which has been proposed is a crossbar switch, through which each processor element can communicate with any of the other processor elements directly. The crossbar switch provides the most efficient communications of any of the routing networks proposed. However, a crossbar switch also has the most wires and switching elements, both on the order of $n^2$, and thus is most expensive and most susceptible to failure due to broken wires and switching elements. Using the above example, in which "n" is 4K, the number of wires and switching elements required for the crossbar switch is 16M (M−1,048,576).

Yet another routing arrangement is an omega network, in which switching is performed through a number of serially-connected stages. Each stage has two inputs, each connecting to the outputs of two prior stages or processor chips and has two outputs. The "Butterfly" manufactured by Bolt Beranek and Newman, use an omega network.

The cost of a routing network is directly related to the number of wires, as is the likelihood of failure due to discontinuity in a communications path. To reduce the number of wires and achieve a significant fraction of the efficiency of the crossbar switch, a routing network has been proposed in which a multiple-stage omega network performs some portion of the switching. The output from the omega network is connected to a crossbar switch, which would require many fewer switching connections than would be necessary in the absence of the omega network. Depending on the number of stages in the omega network, the number of wires may be less than in a hypercube, while the transfer efficiency would be greater than a hypercube. For example, if "n" is 4K, and a seven-stage omega network is provided to a crossbar switch, 36K wires (again assuming unidirectional communications over each wire) would be required to form the routing network.

Using a routing network to transfer data does have a number of limitations. The mesh network is useful generally when transferring data only to the adjacent processors, as each transfer requires commands from the controlling program. A hYpercube, crossbar switch, omega, or like network is most useful if message transfers are expected to be to random processors. Some array processors, the Thinking Machine, for example, have two mechanisms for transferring data, one for random transfers and the other for matrix transfers. Under some circumstances, however, it may be faster to provide a processor with direct access to memories associated with other processing elements. This may be useful, for example, when, after performing operations in parallel, a serial operation is to be performed on the just processed data. If one processing element has access to the data in at least some other processing elements' memories, the processor may perform serial operations using that data. Also, the processing element may use those memories to if a problem requires more storage capacity than a single processing element would have.

Typically, array processors are used in performing arithmetic operations on numerical values, which are expressed in "floating point" form. In that form, a floating point number has a fraction portion and an exponent portion, with the value of the number being the value contained in the fraction portion multiplied by the value two raised to the value contained in the exponent portion. When performing arithmetic operations such as addition and subtraction on such numbers, the numbers must be "aligned", that is, they must have the same value of the exponent. To achieve this, the value of the fraction portion of the floating point number must be reduced, which raises the effective value of the number's exponent portion, until the exponent values are equal. After the arithmetic operation, the fraction of the result must be normalized, that is, leading zeroes must be removed by decreasing the value of the fraction portion, while at the same time increasing the value of the result,s exponent. In both the alignment and normalization operations, the fractions are reduced and or increased by shifting their values in the locations in which they are stored.

However, in the alignment and normalization operations, since the values of the numbers processed by the various processing elements are all different, the number of shifts required to effect the alignment or normalization will also be different.

SUMMARY OF THE INVENTION

The invention provides a new and improved array processing system having a plurality of processing elements each with a processor and an associated memory.

In one aspect, the invention provides an array processing system including a plurality of processing elements each including a processor and an associated memory, in which the processing elements are divided into groups each having a selected number of processors and associated memories. In response to control signals, one processor in each group is enabled to obtain data from any of the memories associated with any of the processors in the group. While operating in this mode, the other processors are effectively disabled. This aspect allows computations to be performed in parallel on data in the various memories by all of the processors in the group, and then facilitates the serial processing of that data by one of the processors in the group, without requiring the other processors to transfer the data to the one processor over the interconnection mechanism. In addition, it permits the array to provide larger amounts of memory, using smaller numbers of processors, if necessary to perform a computation.

In another aspect, the invention provides an array processor whose processing elements can process data a bit at a time, in bit mode, or a nibble (four bits) at a time, in nibble mode.

In another aspect, the invention provides a processor having a shift register that can shift both toward a shift out terminal and toward a shift in terminal, and that can shift toward the shift out terminal a bit at a time or a nibble (four bits) at a time. The ability to shift a nibble at a time facilitates the operation in nibble mode. The ability to shift toward the shift in terminal is useful in floating point arithmetic, particularly in equalizing the exponent portion of a number prior to addition or subtraction, and in normalizing the fraction portion of a number after an arithmetic operation.

In yet another aspect, the invention provides a mechanism for quickly and easily generating a status signal for indicating when all of the processors in the array have completed an operation such as normalization following arithmetic operations or transmission of messages.

In still another aspect, the invention provides an array processing system in which the processing elements can receive data from, and transmit data to, other processing elements in a matrix arrangement, and in which they can provide that the data transmitted is the logical OR of the received data and the processing element's own data, to effect a logical OR of the data being transmitted by all of the processing elements along an entire row or column.

In a further aspect, the invention provides an array procssing system having a message transfer mechanism that permits one processing element, which might otherwise have to serially transmit messages to a large number of other processing elements, to use other processing elements as assistants in transmitting messages to the other processing elements, thereby reducing the amount of time required to transmit all of the necessary messages.

In a further aspect, the invention provides an array processing system including a routing network for transferring messages, with each message containing an address identifying the intended recipient. The routing network includes a plurality of switching stages each of which uses a selected number of bits of the address to identify a switching path through each stage. The lines connecting between stages are divided into groups, with each group including a plurality of lines each associated with one encoding of the address bits used by the stage in selecting the switching path. Each switching stage can couple a message having the required address encoding onto any one of the lines in the appropriate group.

In another aspect, the invention provides an array processing system including a routing network in which messages are transferred over communications path, with the routing network including a system for detecting when a communications path has become discontinuous, and for thereafter not using that path.

In yet a further aspect, the invention provides an array processing system including routing network for transferring messages over a communications path, with the routing network including a system for detecting when a communications path has become discontinuous, and for thereafter not using that path. Each message contains an address identifying the intended recipient. The routing network includes a plurality of switching stages each of which uses a selected number of bits of the address to identify a communications path through each stage. The communications paths connecting between stages are divided into groups, with each group including a plurality of paths each associated with one encoding of the address bits used by the stage in selecting the switching path. Each switching stage can couple a message having the required address encoding onto any one of the paths in the appropriate group for transmission to the next stage. If one communications path in a group is not used because it is discontinuous, the stage may transmit a message over any of the other communications paths in the group to the next stage.

In yet another aspect, the invention provides an array processing system having a multiple-stage routing network, in which the first stage is enabled to begin transferring a message, and in which each stage enables the next stage when it is time for that stage to begin transferring the message.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

FIG. 1 is a general organizational diagram depicting the general components of an array processing system, including a processor array constructed in accordance with the invention;

FIG. 3 is another more detailed block diagram of the processor array depicted in FIG. 1, depicting another mechanism for transferring information through the array;

FIG. 8A is a detailed block diagram depicting the routing network used in the information transfer mechanism depicted in FIG. 2 and FIG. 8B depicts the detailed structure of a message transferred through the routing network depicted in FIG. 8A;

FIGS. 9-1 and 9-2 together are a detailed block diagram depicting the organization of a switching chip used in the routing network depicted in FIG. 8A; and FIG. 10A is a detailed circuit diagram of an input circuit of FIG. 9-1 and 9-2;

FIG. 10B-1 and 10B-2 are detailed circuit diagrams which together depict a circuit of an address control circuit of FIG. 9-1 and 9-2.

DESCRIPTION OF AN ILLUSTRATIVE EMBODIMENT

I. General Description Of Array Processor

Figures 1, 9:
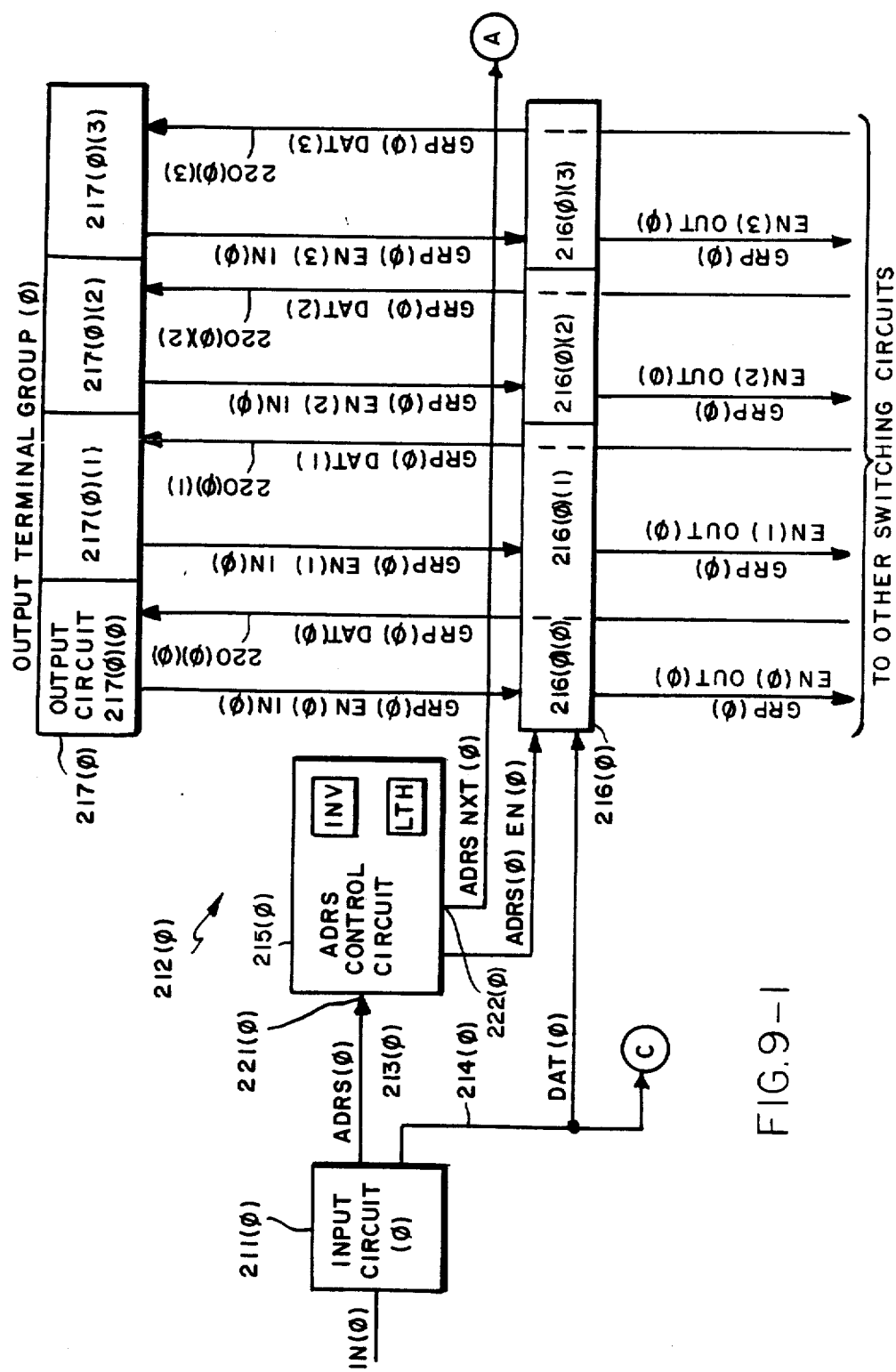
Figures 2, 9:
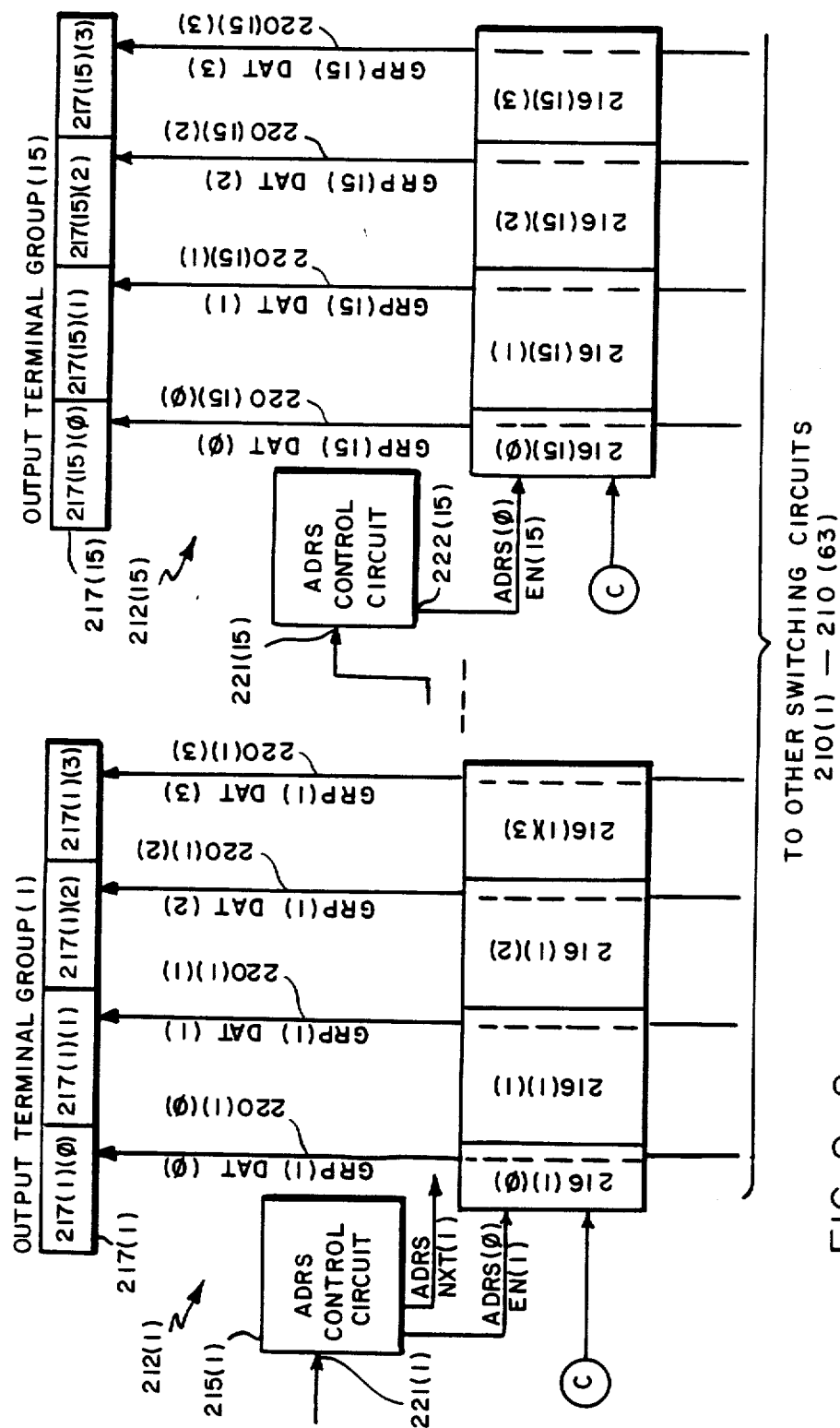

With reference to FIG. 1, an array processor constructed in accordance with the invention includes three major sections, including an array control unit 10, a processor array !1 and a system interface 12. The control unit 10 receives data and instructions from a host data processing system (not shown) through the interface 12, transmits the data to the array 11 over a bus 13 and issues to the array 11 microinstructions over a bus 14. The microinstructions enable the array 11 to process the data in accordance with the host's instructions.

During execution of the microinstructions, the processor array 11 may transmit various status signals back to the array control unit over a status bus 15. These status signals are used by the array control unit 10, as described below, in the selection of the microinstructions to be issued to the processor array. After the processor array performs all of the operations responsive to the microinstructions from the array control unit in processing the instruction from the host data processing system, the control unit 10 then enables the processing array 11 to transmit the processed data to the array control unit 10 over bus 13, and the array control unit may then transmit it to the host through system interface 12.

II. General Organization of Processor Array 11

Processor array 11 includes two general portions, namely a large number of processor elements (PE's) on a plurality of processor element (PE) chips, and a mechanism for transferring information to and from the array control unit 10 and among the processor elements. In one specific embodiment, each PE chip includes thirty-two processing elements. As described in more detail below in connection with FIG. 4, each processor element includes a processor, including circuitry for performing selected arithmetic and logical operations, and an associated memory. In the aforementioned specific embodiment, each memory has a capacity of 1024 bits (1 Kb).

Figure 2:
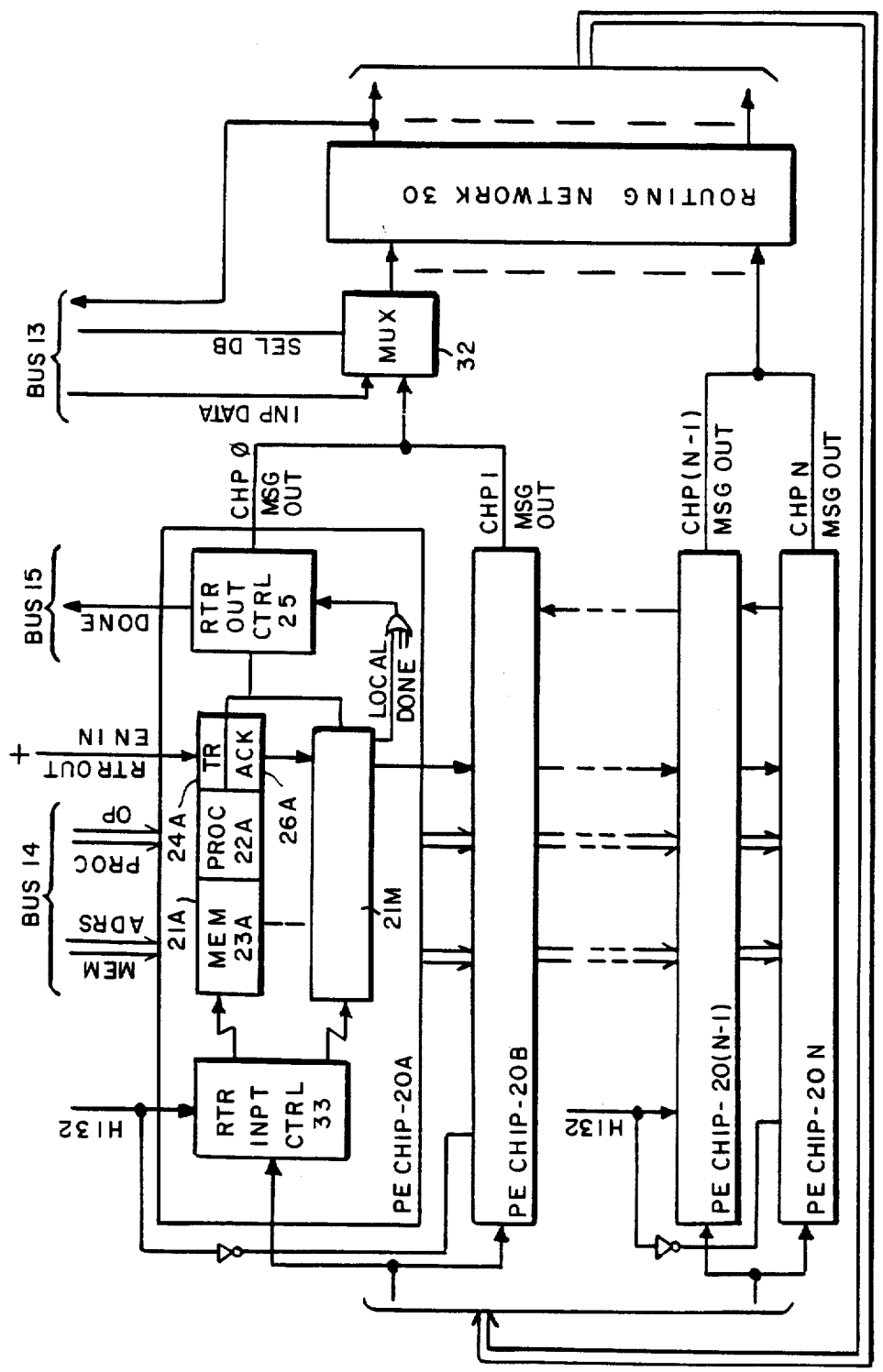
FIG. 2 is a more detailed block diagram of the processor array depicted in FIG. 1, depicting one mechanism for transferring information through the array.
Figure 4:
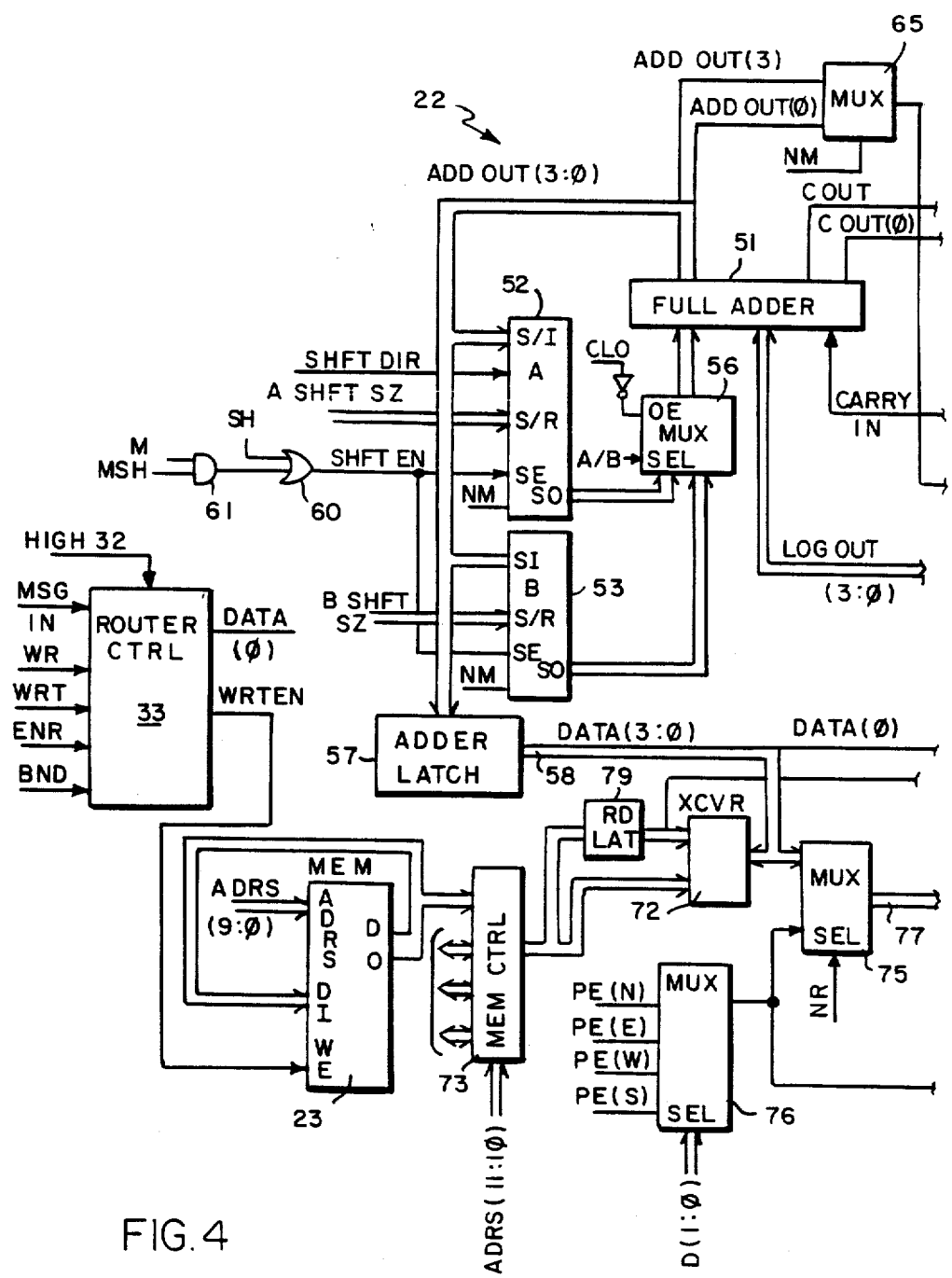
FIG. 4 is a detailed block diagram of a processor element forming part of the processor array depicted in FIG. 1.
Figure 4:
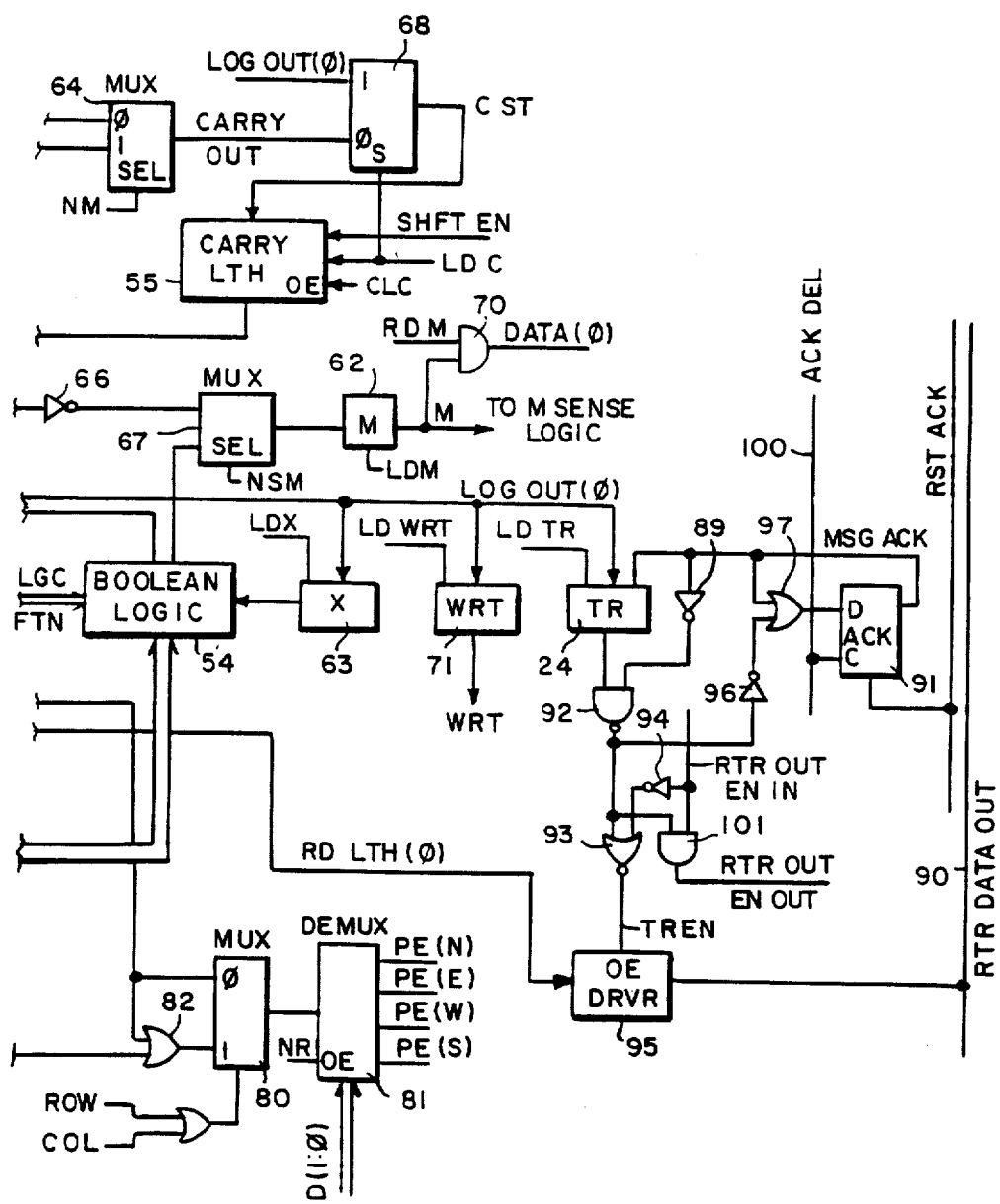

The PE's have two mechanisms for transferring information to other processors. In one mechanism, a "random transfer" mechanism, which is generally depicted in FIG. 2, each PE can send a message to any other PE. In the second mechanism, a "nearest neighbor" mechanism, which is illustrated in FIG. 3, the PE's are interconnected in a "nearest neighbor" mesh manner with four other PE's, and each PE may send information only to one of those four PE's to which it is directly connected. In the random transfer mechanism, communications are maintained over a routing network 30 (see FIG. 2), which is described below connection with FIG. 2 and in more detail in connection with FIGS. 8A through 10C. Circuits for implementing the second mechanism are depicted in FIG. 4.

With reference to FIG. 2, a plurality of PE chips 20A through 20N (generally identified by reference numeral 20) are depicted. Each PE chip 20 has a plurality of PE's. Since the PE chips are similar, only chip 20A is shown in detail. PE chip 20A includes a plurality of PE's 21A through 21M in an ordered heirarchy. Each PE includes a processor 22A through 22M and a memory 23A through 23M. When a PE is enabled to transmit a message, it's TR transmit request flag 24A through 24M is set. When a PE's RTR OUT EN IN router out enable in signal is asserted, the PE is enabled to transmit its message through a router output control circuit.

The RTR OUT EN IN router out enable in signal is a daisy-chained enable signal. When it becomes the PE's turn to send a message, which occurs when its RTR OUT EN IN router out enable in signal is asserted, it transmits its message signals through a router output control circuit 25, which transmits the message from the PE chip 20A as a CHP 0 MSG OUT chip (0) message out signal. An ACK acknowledge flag 26A through 26M, which initially is cleared, is set when a message has been sent and acknowledged. A benefit of providing separate TR transmit request and ACK acknowledge flags, rather than merely having the TR transmit request flag reset in response to the acknowledgement, will be made clear below.

After a PE's message has been transmitted and acknowledged, the PE 22 asserts the RTR OUT EN IN router out enable in signal for the next PE. If that PE's TR transmit request flag 24 is set, and the ACK acknowledge flag 26 is reset, that PE is enabled to transmit a message. Either if the TR transmit request flag 24 is cleared, or if the TR transmit request flag 24 is set but the ACK acknowledge flag 26 is also set, the PE does not transmit a message, but instead asserts the RTR OUT EN IN router out enable in signal for the next PE 22. After messages have been sent and acknowledged for all of the PE's whose TR transmit request flags 24A through 24M were initially set, the control circuit 25 generates a LOCAL DONE signal, which is ORed with LOCAL DONE signals from other PE chips to form a DONE signal. The DONE signal is transmitted over status bus 15 to the array control unit 10, to indicate that all PE's have transmitted messages.

In one specific embodiment, to reduce the number of input terminals to the routing network 30, the PE chips 20A through 20N are paired in their transmission of messages through the routing network. With reference to FIG. 2, the last PE 22(m) on PE chip 20A provides the RTR OUT EN IN router out enable in signal to the first PE 22 on PE chip 20B. Thus, after all message have been transmitted from PE chip 20A and acknowledged, PE chip 20B begins transmitting messages.

The message outputs of selected ones of the PE chips 20A through 20N are connected to multiplexers 32 which selectively couple the outputs of the PE chips or the data signals from the data bus 13 to the routing network. The routing network 30 thus facilitates the transfer of data from the array control unit 10 into the processor array 11. More specifically, with reference to PE chip 20A, the output of circuit 25 of PE chip 20A is connected to one input terminal of a multiplexer 32. The other input terminal of multiplexer 32 is connected to one line of data bus 13. The multiplexer is controlled by a SEL DB select data bus Signal which, when asserted, enables the multiplexer 32 to couple the signals on the line of data bus 13 to the routing network 30. When the SEL DB select data bus signal is not asserted, the multiplexer 32 couples the signals from the PE chips to the routing network 30.

The output signals from the routing network 30 (the routing network will be described below in connection with FIGS. 8A through 10C) are coupled to message input terminals on the PE chips 20A through 20N, and specifically to a router input control circuit 33 shown in PE chip 20A. The router input control circuit first determines whether the or not the message is for a PE on the PE chip on which it resides. This determination is made in response to the first signal received by the router input control circuit and by the condition of a HI 32 signal. As shown in FIG. 2, the HI 32 signal is transmitted in uncomplemented form to one of each pair of PE chips, such as PE chips 20A and 20(N−1), and in complemented form to the other PE chips, such as PE chips 20B and 20N. If the router input control circuit 33 receives the uncomplemented HI 32 signal it accepts the messages for which the first signal is asserted, but if the router input control circuit 33 receives the complemented HI 32 signal, it accepts the messages for which the first signal is negated. The next few signals, as explained below in connection with FIG. 8B, identify the PE 22 which is the intended recipient of the message, and the router input control circuit directs the message to the PE 22 so identified.

The output signals from selected ones of the lines from routing network 30 are also coupled to data bus 13 to carry data output signals to the array control unit 10.

It will be appreciated by the foregoing description that, while a number of messages may be transferred through routing network 30 at one time, which will be termed herein a "minor message cycle", a number of minor message cycles may be required to transfer all messages that are required to be transmitted at one time in response to a program requirement. In particular, at most one PE 22 may transmit a message in a PE chip pair at one time, so if more than one PE 22 on a PE chip pair must transmit a message, at least that number of minor message cycles are required. In addition some messages may be blocked because of contentions in routing network 30 or because multiple messages are being transmitted to the same PE chip pair during a minor message cycle.

As has been noted, providing a separate TR transmit request flag 24A through 24M and ACK acknowledge flag 26A through 26M to control message transfer has a number of benefits. In particular, as described below, in one specific embodiment each message includes a header containing an address which identifies the PE to receive the message and an acknowledgement timeslot for the receiving PE, or more specifically the PE chip 20 containing the receiving PE, to transmit a signal to the transmitting PE indicating receipt of the message. Following the message header, the message data is sent. Placing the acknowledgement timeslot in the header rather than at the end of the message simplifies timing of the acknowledgement time slot, since the header is of fixed length whereas the length of the message data may vary as between messages.

In some applications of the array processor, it is necessary for one PE to send the same message to a number of different PE's. In sending such messages, the transmitting PE iteratively sends the message to each intended recipient. If a large number of PE's are to receive the message, this procedure can take a long time. This time may be considerably reduced if the originating PE first transmits the message to a selected number of other "assistant" PE's, which then, along with the originating PE, send the messages to other PE's. This process continues until all of the intended recipient PE's receive the messages.

At some point during or immediately after the transfer of a message from the originating PE to an assistant PE, it will be necessary for the array control unit 10 (FIG. 1) to transmit control signals to array 11 to enable the setting of the TR transmit request flags so as to enable the assistant PE's to transmit the messages and, if necessary, to enable the originating PE to send messages to other PE's, which may be assistant PE's or final destination PE's. If, during the original message, the acknowledgement of the receipt of the original message enabled the TR transmit request flag 24A through 24M to be reset, the PE would be unable to determine whether the original message had been sent to the first assistant PE, and it would retransmit the message to that PE. Thus, providing separate TR transmit request and ACK acknowledge flags 24A through 24M and 26A through 26M, respectively, facilitates the use of assistant PE's to transmit messages in a "spreading activation" fashion.

The "nearest neighbor" message transfer mechanism is depicted in FIG. 3. With reference to FIG. 3, a plurality of PE's 20A through 20N are depicted organized in an array pattern of a plurality of "k" rows and "l" columns, where N−kl. Each PE 20A through 20N can transmit information, in the form of signals, to its four nearest neighbors in the array. Specifically, for example, the PE 20(k+2) can transmit signals "westwardly" to PE 20B and "northwardly" to PE 20k+1 (shown on FIG. 3), and "southwardly" to PE 20(k+3) and "eastwardly" to 20(2k+2) in a row and column not shown in FIG. 3. The PE's in the leftmost column, as shown in FIG. 3, that is PE's 20A through 20K, can transmit signals westwardly to the rightmost column as shown in FIG. 3, that is, to PE's 20(1k+1) through 20N, and the PE's in the rightmost column can transmit signals eastwardly to the PE's in the leftmost column. Similarly, the PE's in the top row, that is, PE's 20A, 20(k+1) . . . 20(1k+1), can transmit signals northwardly to the PE's in the bottom row, that is PE's 20K, 20(2k) . . . 20N, and the PE's in the bottom row can transmit signals southwardly to the PE's in the top row. The mechanism used by the PE's to transmit in the "nearest neighbor" mode will be described below in connection with FIG. 4.

The nearest neighbor message transfer mechanism may also be used for input of signals, representing data, to the array 11 or output of data from array 11. In particular, with reference to FIG. 4, a multiplexer network (not shown) may be connected at the left side of the array, for example to permit data to be loaded into the leftmost column of PE's data from either the rightmost column or from an external data source. The data is initially latched by the leftmost column and is transmitted to the next column, that is PE's 22(K+1) through 22(2K) as more data is latched by the leftmost column. That process continues until data has been passed throughout the entire array.

The output of data is effectuated by means of the nearest neighbor transfer mechanism by providing a set of output drivers (not shown) which are connected to a set of appropriated receiving and recording circuits. The output drivers may be connected to, for example, the eastward transmission terminals of the rightmost column of the array to receive data signals from the lines which also connect the PE's along that column to the PE's on the leftmost column. To allow data to be retrieved from the array 11, the PE's are enabled to transmit the data in an easterly direction while recording the outputs of the output drivers. After the data from the leftmost column has returned to it, data from all of the PE's in the array will have passed through the rightmost column of PE's and have been transmitted by the drivers.

III. Processing Element

A. General Description (Discussion of FIG. 4)

With reference to FIG. 4, a PE constructed in accordance with the invention includes a full adder 51 which receives input signals from a one of a pair of shift registers, namely A shift register 52 or B shift register 53, from a Boolean logic circuit 54, and from a carry latch 55. A multiplexer 56 selects the output signals from the S/O shift out output terminals of one of the A or B shift registers 52 or 53, in response to an A/B select signal representing a bit in the control microword received from the array control unit 10 over bus 14 (FIG. 1). As is typical in an array processing system, during any given operating cycle, as governed by one or more clock signals (not shown), a single control microword is transmitted by the array control unit 10 to all of the PE's in the array 11 to control the operations of the PE's in the array 11 during that cycle. Depending on the condition of one or more flags, as described below, a PE may or may not perform the operations enabled by the control microword.

If a CLO clear shift register output signal from the control microword is negated, the multiplexer is enabled to couple the output signal from the selected shift register to the connected input of the adder 51. By asserting the CLO signal, the array control unit enables the multiplexer to couple an output signal having an effective value of zero to the input of adder 51. This provides a mechanism for loading a value into a shift register prior to performing an arithmetic operation.

The A and B shift registers 52 and 53 operate in response to a number of control signals from the control microword. Both the A and B shift registers are of variable effective length, that is, the output bit position from which output signals are transmitted to multiplexer 56 can be varied in response to A SHFT SZ (A shift register size) and B SHFT SZ (B shift register size) signals from the control microword. In one embodiment, the A shift register 52 has effective lengths of four, eight, twelve, sixteen, twenty, twenty-four, twenty-eight and thirty-two bits, and may be used for performing integer arithmetic and arithmetic on the fraction portion of floating point numbers. In the same embodiment, the B shift register 53 has effective lengths of four, eight and twelve bits, and may be used for performing arithmetic on the exponent portion of floating point numbers.

The contents of the A and B shift registers 52 and 53 are shifted in response to a SHFT EN shift enable signal generated by an OR gate 60. The OR gate 60 is energized by an SH shift signal from the control microword, and by an asserted signal from an AND gate 61. The AND gate is enabled by an M signal from an M flag 62 and is energized by an MSH (M shift) signal from the control microword. Thus, the array control unit may enable an unconditional shift by asserting the SH shift signal, or it may alternatively enable a shift conditioned on the state of the M flag 62 by asserting the MSH signal in the control microword The PE's operate in either a bit serial mode or a nibble mode, in which a nibble (four bits) is processed during a control cycle. The PE operates in nibble mode when an NM nibble mode signal from the control microword is asserted. When the NM nibble mode signal is asserted, the A and B shift registers 52 and 53 shift four bits in a cycle, otherwise they shift one bit in a cycle. Also, when in nibble mode, the A and B shift registers receive and store four bits in a cycle from their shift in input terminals (designated S/I on the Figure).

Finally, as described in detail below in connection with FIG. 7, the A shift register 52 also can shift in both directions, that is, toward the S/O output terminal or toward the S/I shift in input terminal. The shift direction is selected in response to the SHFT DIR shift direction signal from the control microword. The ability to shift the contents of the shift register toward the S/I input terminal is useful in floating point arithmetic, for example, particularly in normalization, that is, in removing leading zeroes, which are stored in the end of the shift register toward the S/I shift in input terminal.

The Boolean logic circuit 54 couples data signals to the full adder 51 from a four-line data bus 58 or from one of the nearest neighbor PE's. Depending on the state of LGC FTN logic function signals from the control microword, the Boolean logic circuit 54 may perform one of sixteen logical operations between an X flag 63 and signals from the data bus 58 or from the nearest neighbor PE's. If a logical operation is performed between the X flag 63 and the signals on the data bus 58, the logical operation is performed with respect to the signal on each line of the data bus 58 individually. For example, if an AND operation is to be performed, four AND operations are actually performed, one between the X flag 63 and the signal on each of the lines of the data bus 58.

In either bit-serial or nibble mode, the carry latch 55 supplies a one bit CARRY signal to the full adder 51. The carry latch 55 is latches the CARRY signal whenever the SHFT EN shift enable signal from OR gate 60 asserted. A CL C clear carry signal from the control microword, when asserted, forces the output of the carry latch 55 to zero. The CL C clear caryy signal is useful for the same purpose as the CLO clear shift register output signal, namely, initial loading of the carry latch 55 prior to performing an addition operation.

Furthermore, in either bit serial or nibble mode, the full adder 51 generates four ADD OUT (3:0) adder output signals and a C OUT carry out signal. The ADD OUT (3:0) adder output signals are coupled to the S/I shift in terminals of the A and B shift registers 52 and 53 and to an input terminal of an adder latch 57. The C OUT carry out signal represents the carry signal from the high-order adder stage of the full adder 51, that is, the stage that generates the high-order ADD OUT (3) adder output signal.

The C OUT signal and the C OUT (0) carry signal from the low order stage of the adder, which represents the carry from that stage, are coupled to a multiplexer 64 which, in response to the NM nibble mode signal from the control microword, couples one of the signals to an input of a second multiplexer 68. Multiplexer 68, in turn, in response to a LD C load carry signal from the control microword, selects either the CARRY OUT signal from multiplexer 64 or the LOG OUT (0) logic output (0) signal from Boolean logic circuit 54 for storage in the carry latch 55. If the LD C load carry signal is asserted, the multiplexer 68 is conditioned to couple the LOG OUT (0) logic output (0) signal to the carry latch 55 and the carry latch is enabled to latch the signal. This facilitates initializing the carry latch 55 to a known state from through Boolean logic 54. If, on the other hand, the LD C load carry signal is negated, the multiplexer 68 is conditioned to couple the CARRY OUT signal from multiplexer 64 to the input of the carry latch. The CARRY OUT signal is latched if the SHFT EN shift enable signal from the control microword is asserted.

Thus, in nibble mode, the carry latch 55 receives the carry from the high-order stage of the full adder 51, representing the carry from the high order stage of the nibble. In bit-serial mode, the carry latch 55 receives the carry from the low-order stage of the adder. In bit-serial mode, the arithmetic operations in full adder 51 are essentially carried out in the low-order stage, as the signals from the higher-order stages are effectively ignored.

The M flag 62 is also conditioned by signals from the full adder 51 through a multiplexer 65. The multiplexer couples either the ADD OUT (0) signal from the full adder 51, or, if the NM nibble mode signal is asserted, the ADD OUT (3) signal. The signal from the multiplexer is inverted by an inverter 66 and the result coupled to an input terminal of a second multiplexer 67. The multiplexer 67 also includes a second intput terminal which receives the low-order signal from the Boolean logic circuit 54. If an NSM "not sum to M" signal from the control microword is asserted, the multiplexer 67 couples the complement of the high-order signal from the full adder 51 to the M flag 62 for storage in response to an LD M load M signal from the control microword. Otherwise, the M flag 62 is loaded from the signals from the Boolean logic circuit 54. An AND gate 70 couples the condition of the M flag 62 to data bus 58, particularly the low-order DATA (0) line thereof, in response to a RD M read M signal from the control microword.

If the M flag 62 is loaded from the full adder 51, it may be used, for example, in normalization during floating point arithmetic. In this operation, the fraction portion of the floating point number, which is stored in the A shift register 52, is shifted toward the S/O shift out terminal (that is, the high-order end) until the high-order stage contains the value "one". In response to each shift of the contents of the A shift register 52, the exponent, which is in the B shift register 53, is incremented. Since different PE's in array 11 may require different numbers of shifts to normalize the contents of their respective A shift registers 52, the shift operations then depend on the state of the M SH (M conditioned shift) signal from the control microword. Until a "one" reaches the high-order stage of the A shift register 52, the inverter 66 conditions the M flag 62 to be set (that is, store the complement of the zero value from the shift register 52), and thus the M signal is asserted. Thus, the M SH signal enables the A and B shift registers 52 and 53 to operate. However, when a "one" reaches the high-order stage of the A shift register 52, the inverter 66 conditions the M flag to be clear, negating the output M signal. When the M SH (M conditioned shift) signal from the control microword is asserted, the negated M signal disables the shift registers 52 and 53. The M flag 62 can also be used for initial alignment of floating point numbers prior to an addition or subtraction in a similar manner.

Two additional flags are loaded from the low-order output signal from Boolean logic circuit 54, namely a WRT memory write enable flag 71 and the TR transmit request flag 24. The WRT memory write enable flag 71 is loaded in response to an LD WRT load memory write enable signal from the control microword and the TR transmit request flag 24 is loaded in response to an LD TR load transmit request signal from the control microword. The WRT memory write enable flag 71 generates a WRT memory write signal which is coupled to the PE chip's router control circuit 33 which, in turn, generates a WRT EN write enable signal associated with each of the memories 23 on the chip to control writing of data thereto.

The router control circuit 33 enables writing data to the memory under three circumstances. Under normal operation, that is, when the routing network 30 (FIG. 2) is not in use, the router control circuit 33 generates the WRT EN write enable signal for the memory when the WR write signal from the control microword is asserted if the associated PE's WRT flag is set. This enables the associated memory 23 to store the data bits from the data bus 58 through transceiver 72 in the location specified by the address signals in the control microword.

Alternatively, when the routing network is in use and actually transferring data, the router control circuit 33 receives the data as a MSG IN message in signal. Contemporaneously, the ENR enable router signal is asserted. As will be explained below in connection with FIG. 10A, the first six bits received by the PE chip 20 identify the chip of the chip pair, and PE on the chip, to receive the message data. The router control circuit 33 receives the PE identification portion of the MSG IN message in signals, transmits the data portion of the MSG IN message in signals as a DATA (0) signal onto the data bus 58 of the intended recipient PE and asserts the WRT EN write enable signal of the associated recipient.

Finally, the router control circuit 33 also enables the memory 23 to store data when the routing network is in use but between messages. This may occur when, for example, several messages are to be directed to a single PE by several PE's during one major message transfer cycle, and between messages the recipient PE is to perform a calculation on the just received data. As explained above, a major message transfer cycle comprises a plurality of minor message transfer cycles each initiated by the ENR enable router signal and terminated by a BND branch if not done signal. If the DONE signal is not asserted at the end of a minor message transfer cycle, some PE's have messages yet to transfer, and the BND signal from the control microword indicates that the array control unit will return to the beginning of the message transfer sequence. If a calculation is to be performed before the beginning of the next minor message transfer cycle, the ENR enable router signal is negated, but the BND branch if not done signal is delayed until the calculation is performed and the results written into memory 23. In this case, the memory 23 is enabled by the router control circuit 33 if the WRT flag is set and the WR write signal from the control microword is asserted. However, the WRT EN write enable signal will be asserted only for those PE's which just received a message during the current minor message transfer cycle.

The data output from memory 23 is coupled to a memory data output control circuit 73 described below in connection with FIGS. 5A and 5B. In brief, the memory data output control circuit 73 enables four memory modules 23, each normally associated with a separate PE, to be associated with one of the PE's in response to the conditions of the ADRS (11:10) high order address signals from the control microword. Thus, in one embodiment, in which the memory modules 23 each have on the order of 1 Kb (1024 bits), when either of the ADRS (11) or ADRS (10) high order address bits are asserted, one PE has an effective memory of 4 Kb (4096 bits), and the other PE's, which are normally associated with the PE's whose memory modules 23 are available to the one PE, are effectively disabled. This may be useful in several situations, including cases requiring more storage than is normally available to one PE. In addition, this may be useful in cases in which operations are performed in each PE on data in parallel, and then operations are performed serially by one PE using the data stored in all of the memory modules. Making the data in the memory modules directly available to the PE performing the operations serially avoids requiring the PE's to use message transfers to transfer the data to that PE.

The data from the memory data output control circuit 73 is stored in a read data latch 74 and coupled by the latch to transceiver 72. The transceiver 72 in turn couples the data onto data bus 58. The data bus 58, in turn, couples the data to one input terminal of a multiplexer 75. If an NR neighbor signal from the control microword is not asserted, the multiplexer 75 couples the read data from the data bus 58 onto a bus 77 to the input terminal of Boolean logic circuit 54.

A multiplexer 76 selects a data signal from one of the neighboring PE's, in response to the condition of D(1:0) direction signals from the control microword. If the NR neighbor signal from the control microword is asserted, multiplexer 75 couples the signal selected by multiplexer 76 onto the low-order line of bus 77, and transmits negated signals onto the remaining lines of the bus, thereby facilitating the data reception portion of the nearest-neighbor message transfer mechanism described above in connection with FIG. 3.

Data is coupled to the memory modules 23 for storage as follows. Data from the data bus 58 is coupled through transceiver 72 to the data input terminals DI of the associated memory module 23. Depending on the condition of the ADRS (11:10) signals, the memory data output control circuit 73 may instead couple the data from the transceiver 72 to a memory module 23 normally associated with another PE for storage therein.

The data transmission portion of the nearest-neighbor message transfer mechanism, which was described above in connection with FIG. 3, is performed as follows. The DATA (0) signal from data bus 58 is connected to one terminal of a multiplexer 80. If neither the ROW signal nor the COL column signal from the control microword is asserted, the multiplexer 80 couples the DATA (0) signal to the input terminal of a demultiplexer 81. If the NR neighbor mode signal from the control microword is asserted, the demultiplexer 81 couples the DATA (0) signal to the PE determined by the D(1:0) direction signals.

If, on the other hand, either the ROW or the COL column signal from the control microword is asserted, the multiplexer 80 couples the output signal from an OR gate 82 to the demultiplexer 81. The OR gate 82 is enabled by the DATA (0) signal from data bus 58 or the output of multiplexer 76. The signal transferred to the neighboring PE thus represents the logical OR of the signal from a neighboring PE received during the nearest neighbor transfer and the data signal on the low-order line of data bus 58. By this mechanism, the row and column data comparisons may be easily facilitated, which is useful in connection with finding minimum and maximum values along a row or column of PE's If both the ROW and COL signals are asserted at once, the comparisons may be facilitated with respect to all of the PE's in the array 11 at one time.

Also depicted on FIG. 4 is circuitry associated with the PE chip's router control circuit 33 for enabling the PE transfer messages over the routing network. As was noted above in connection with FIG. 2, the PE's on a chip are iteratively enabled to transfer messages over the routing network. Each PE receives an RTR OUT EN IN router out enable in signal which, when asserted, enables the PE to transmit message data signals over a common bus line 90 as RTR DATA OUT router data out signals. After the message is acknowledged, the PE generates an RTR OUT EN OUT router out enable out signal which is coupled to the next PE in line as that PE's RTR OUT EN IN router out enable in signal.

Specifically, when the TR transmit request flag is set, if an acknowledge flip-flop 91, representing the ACK acknowledge flag 26, is clear, and so an MSG ACK message acknowledge signal is negated. In response, an inverter 89 enables a NAND gate 92 to couple a low signal to one input of a NOR gate 93. When the PE's RTR OUT EN IN router out enable in signal is asserted, an inverter 94 couples a second low input signal to the other input terminal of NOR gate 93, thereby enabling the NOR gate to assert the TR EN transmit enable signal. The TR EN signal, in turn, controls the output enable terminal of a driver 95. When the TR EN transmit enable signal is asserted, driver 95 couples the DATA (0) data signal from data bus 58 onto the line 90 as the RTR DATA OUT router data out signal.

The low signal from NAND gate 92 is complemented by an inverter 96 which energizes an OR gate 97, which, in turn, energizes the D data input terminal of acknowledge flip-flop 91. At the end of the message transfer, an ACK DEL delayed acknowledgement signal is asserted over a common line 100 to all of the PE's, the flip-flop 91 is set, thereby asserting the MSG ACK message acknowledge signal. In response, the inverter 89 disables NAND gate 92, which then generates a high output signal. Inverter 96 then couples a low signal to OR gate 97, but the second input signal to the OR gate, which comprises the now asserted MSG ACK message acknowledge signal, maintains the acknowledgement flip-flop set if the ACK DEL delayed acknowledgement signal is later asserted.

The high output signal from NAND gate 92 also disables NOR gate 93 and enables an AND gate 101. The disabled NOR gate 93 negates the TR EN transmit enable signal, in turn turning off driver 95. The enabled AND gate 101 transmits the asserted RTR OUT EN OUT router out enable out signal to the next PE.

It will be appreciated that if the TR transmit request flag 24 is not set, indicating that the PE is not enabled to transmit a message over routing network 30 (FIG. 2), the TR transmit request flag couples a low signal to the NAND gate 92. Thus, the output signal from NAND gate 92 will be high, disabling the NOR gate 93 and enabling AND gate 101 to assert the RTR OUT EN OUT router out enable out signal.

After all of the messages are transferred during a major transfer cycle, all of the acknowledgement flip-flops are reset by the assertion of an RST ACK reset acknowledgement signal from the control microword from array control unit 11.

In one embodiment, the RTR OUT EN IN router out enable in signal is always asserted if the PE is the first PE in the hierarchy on a PE chip of the chip pair which transmits first, as described above in connection with FIG. 2. Accordingly, in that embodiment, the PE can begin transmitting a message immediately after its TR transmit request flag 24 is set.

It will be appreciated that the assertion of the RTR OUT EN IN router out enable in signal need not move only down the PE hierarchy on the PE chip. In particular, if a TR request flag 24 of a PE 22 is not set when its RTR OUT EN IN router out enable in signal is asserted, it will immediately assert its RTR OUT EN OUT router out enable out signal to enable the next PE in the hierarchy. However, if, during the major message transfer cycle, the PE receives a message which causes its TR transmit request flag 24 to be set, since (a) its ACK acknowledge flag has not been set, and (b) its RTR OUT EN IN router out enable in is still asserted, AND gate 101 will be disabled so as to negate the RTR OUT EN OUT router out enable out signal to the succeeding PE's in the hierarchy, and the driver 95 will immediately be enabled to couple the RD LTH (0) signal onto output line 90 as the RTR DATA OUT router data out signal. This mechanism facilitates the "spreading activation" of messages described above.

B. Memory Interconnection

As has been noted, the array 11 can operate in either a 1 Kb mode in which each PE has an associated 1 Kb memory module 23 (FIGS. 2 and 4), or a 4 Kb mode. In the 4 Kb mode, the PE's are divided into groups of four PE's with one PE having access to its associated 1 Kb memory module 23 as well as to the 1 Kb memory modules that are normally (that is, in 1 Kb mode) associated with the three other PE's. This allows operations to proceed in parallel by all of the PE's, and then permits the results, which are contained in all of the memory modules 23 to be accessed by one PE for future processing, without requiring the results to be transferred by way of messages. FIGS. 5A and 5B depict circuits for facilitating this operation.

Figure 5A:
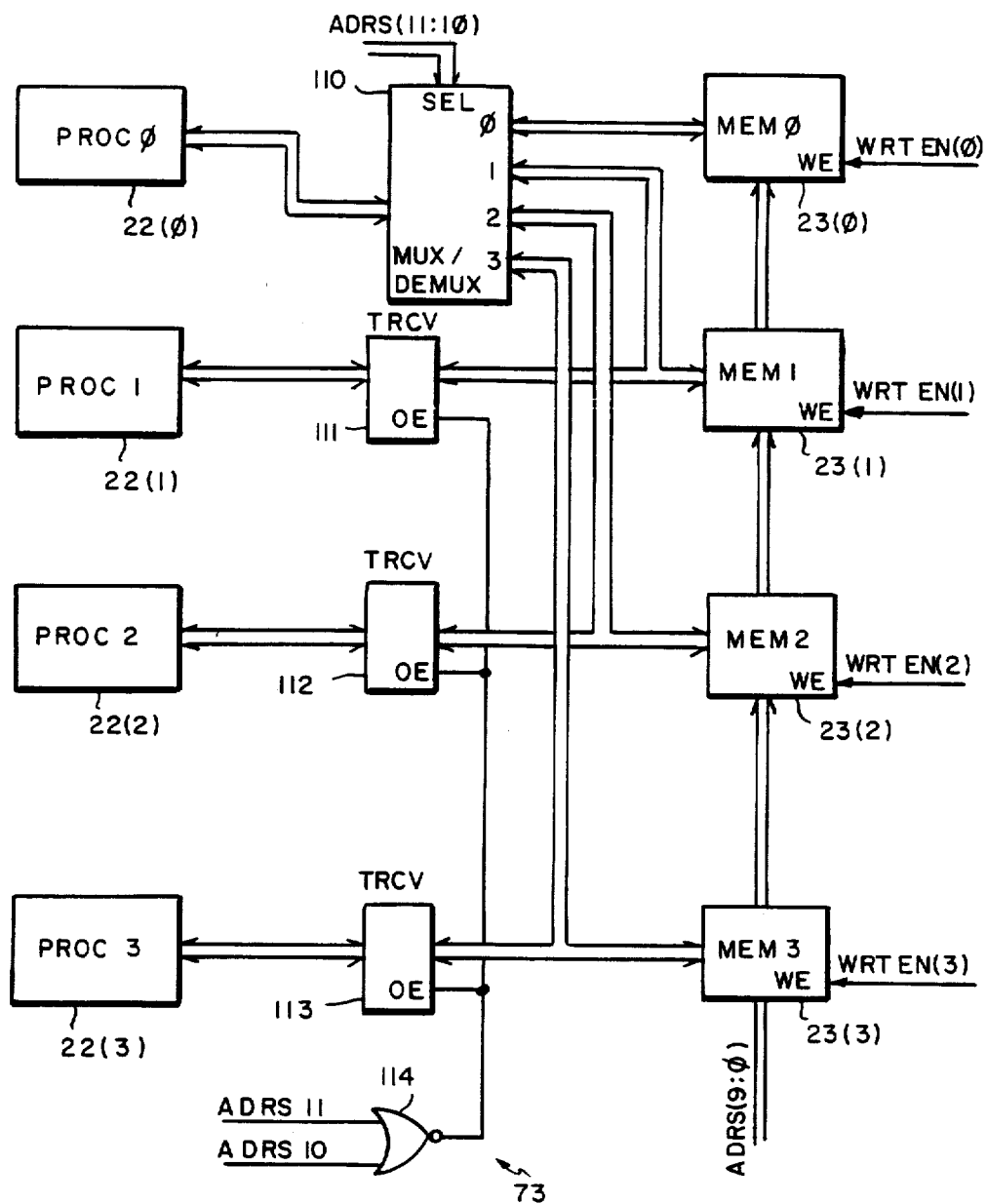
FIG. 5A is a block diagram depicting the interconnections between several processor elements and memory elements in the processor array depicted in FIG. 1.

With reference to FIG. 5A, a group of four processors 22(0) through 22(3) are connected to four memory modules 23(0) through 23(3) through memory control circuit 73. A multiplexer/demultiplexer 110 selectively couples data signals between all of memory modules 23(0) through 23(3) and PE 22(0), and a plurality of transceivers 111 through 113 each couple data signals between one memory module 23(1) through 23(3) and one associated PE 22(1) through 22(3). The ADRS (9:0) low order address signals from the control microword are coupled to all of the memory modules 23(0) through 23(3) in parallel to select one location in each of the memory modules, and ADRS (11:10) high order address signals from the control microword control the memory control circuit 73.

If the ADRS (11:10) signals are both negated, the array 11 (FIG. 1) operates in the 1 Kb mode. In that mode multiplexer/demultiplexer 110 transfers data signals between the PE 22(0) and memory module 23(0). The negated ADRS (11) and ADRS (10) signals energize a NOR gate 114, which, in turn, energizes output enable terminals on each of the transceivers 111 through 113. This enables the transceivers to couple data signals between memory modules 23(1) through 23(3) and respective processors 22(1) through 22(3).

If, on the other hand, either of the ADRS (11) or ADRS (10) signals are asserted, the array 11 operates in 4 Kb mode. In that case, NOR gate 114 disables the transceivers, which enables them to transmit data signals to the processors 22(1) through 22(3) having zero values. The ADRS (11:10) address signals enable the multiplexer/demultiplexer to transfer data signals between one of the memory modules 22(0) through 22(3), as determined by the binary value of the encoded ADRS (11:10) address signals, and PE 22(0).

Figure 5B:
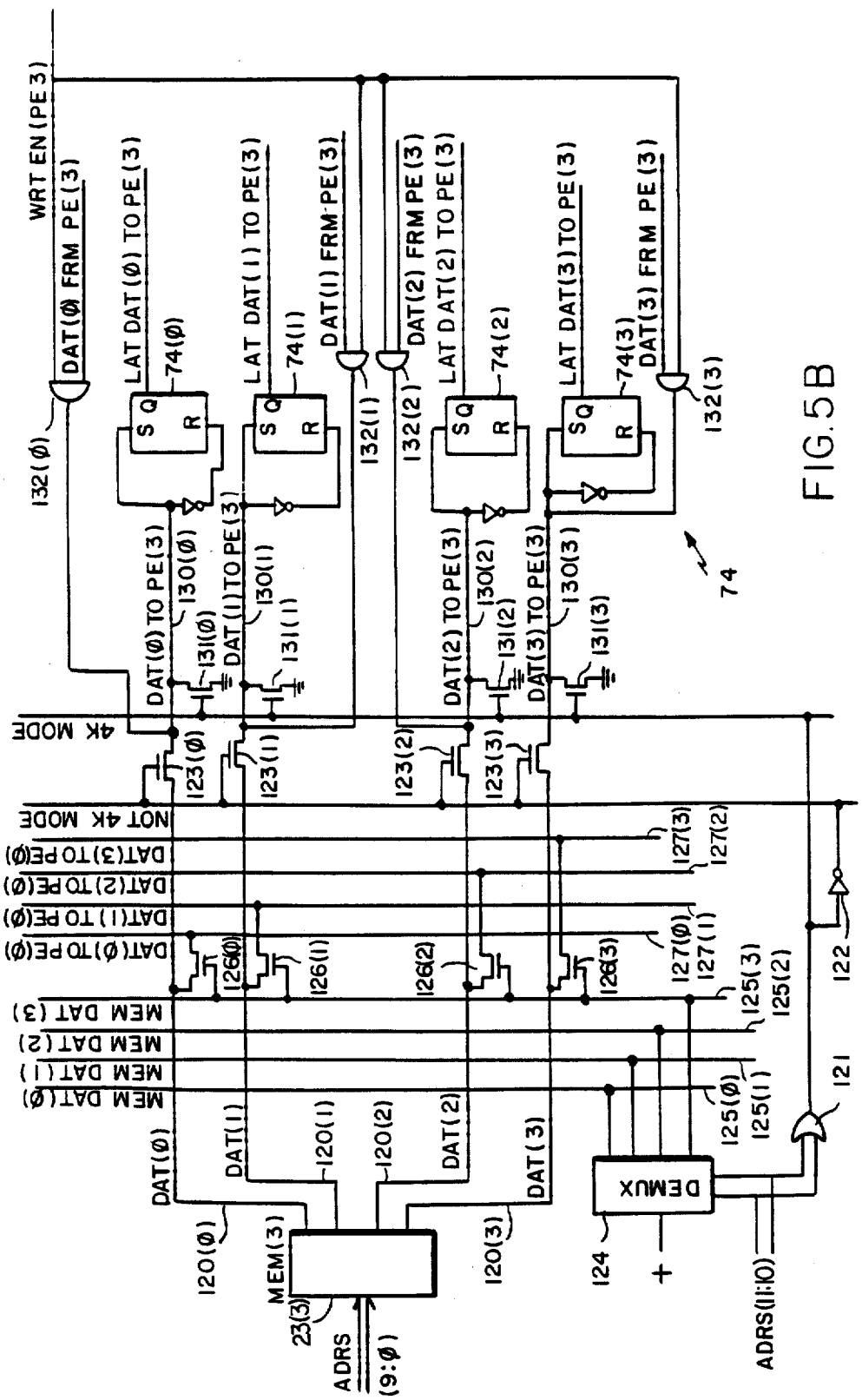
FIG. 5B is a schematic circuit diagram depicting a circuit of a portion of the memory control circuit depicted in FIG. 5A.

FIG. 5B depicts a schematic diagram illustrating one embodiment of a circuit of the portion of the memory control circuit 73 between memory module 23(3) and PE 22(3), and showing the circuit for coupling data signals to PE 22(0). When a location, as identified by the ADRS (9:0) address signals from the control microword, is being read, memory module 23(3) transmits four data bit signals, identified as DAT(0) through DAT(3) on respective lines 120(0) through 120(3). The DAT(0) data signal corresponds to the contents of the bit location identified by the ADRS (9:0) address signals, and the other DAT(1) through DAT(3) signals correspond to the contents of the bit locations having the respective next sequential bit address locations.

If the array 11 is not in the 4 Kb mode, an OR gate 121 will be de-energized so as to negate a 4K MODE signal, and an inverter 122 will generate an asserted NOT 4K MODE signal. The negated 4K MODE signal turns on four pass transistors 123(0) through 123(3), which couples the respective DAT(0) through DAT(3) data signals to lines 130(0) through 130(3) as DAT (0)-(3) TO PE (3) signals for storage in read latch 74, which is represented by four latches 74(0) through 74(3). The latches store the respective signals and couple them to the PE 22(3) as LAT DAT (0)-(3) TO PE (3) signals.

If the array is in the 4 Kb mode, the ADRS(11:10) address signals enable the OR gate 121 to assert the 4K MODE signal and negate the NOT 4K MODE signal. The negated NOT 4K MODE signal de-energizes transistors 123(0) through 123(3), thereby blocking the transmission of the DAT(0) through DAT(3) signals to lines 130(0) through 131(3), and the asserted 4K MODE signal energizes transistors 131(0) through 131(3) to ground the lines 130(0) through 130(3) and negate all of the DAT (0)-(3) TO PE (3) signals. As a result all of the latches 74(0) through 74(3) are reset, resulting in negated LAT DAT (0)-(3) TO PE (3) data signals coupled to PE 22(3).

In addition, if both ADRS(11:10) address signals are asserted, indicating the data signals from memory module 23(3) are to be coupled to PE 22(0), a demultiplexer 124 energizes a line 125(3) to assert a MEM DAT (3) memory data signal, which energizes pass transistors 126(0) through 126(3). Energized pass transistors 126(0) through 126(3) couple the DAT(0) through DAT(3) data signals o lines 120(0) through 120(3) onto lines 127(0) through 127(3) as DAT (0)-(3) TO PE (0) signals, which are coupled to PE 22(0).

Data may be written from the PE 22(3) to memory module 23(3) if the NOT 4K MODE signal is asserted when the WRT EN (PE3) write enable signal is asserted by router control circuit 33 (FIG. 4) The WRT EN (PE3) signal enables AND gates 132(0) through 132(3), which couple the DAT (0)-(3) FRM PE(3) data signals from the PE(3) to lines 130(0) through 130(3), respectively. The asserted NOT 4K MODE signal turns on the transistors 123(0) through 123(3), enabling them to couple the DAT (0)-(3) FRM PE(3) data signals onto lines 120(0) through 120(3), after which they are stored in memory module 23(3).

The memory control circuits 73 associated with processors 22(1) and 22(2) are similar to that depicted in FIG. 5B except that transistors 126(0) through 126(3) are connected to lines 125(1) and 125(2), respectively, and controlled by the MEM DAT (1) and MEM DAT (2) signals from demultiplexer 124.

Figure 5C:
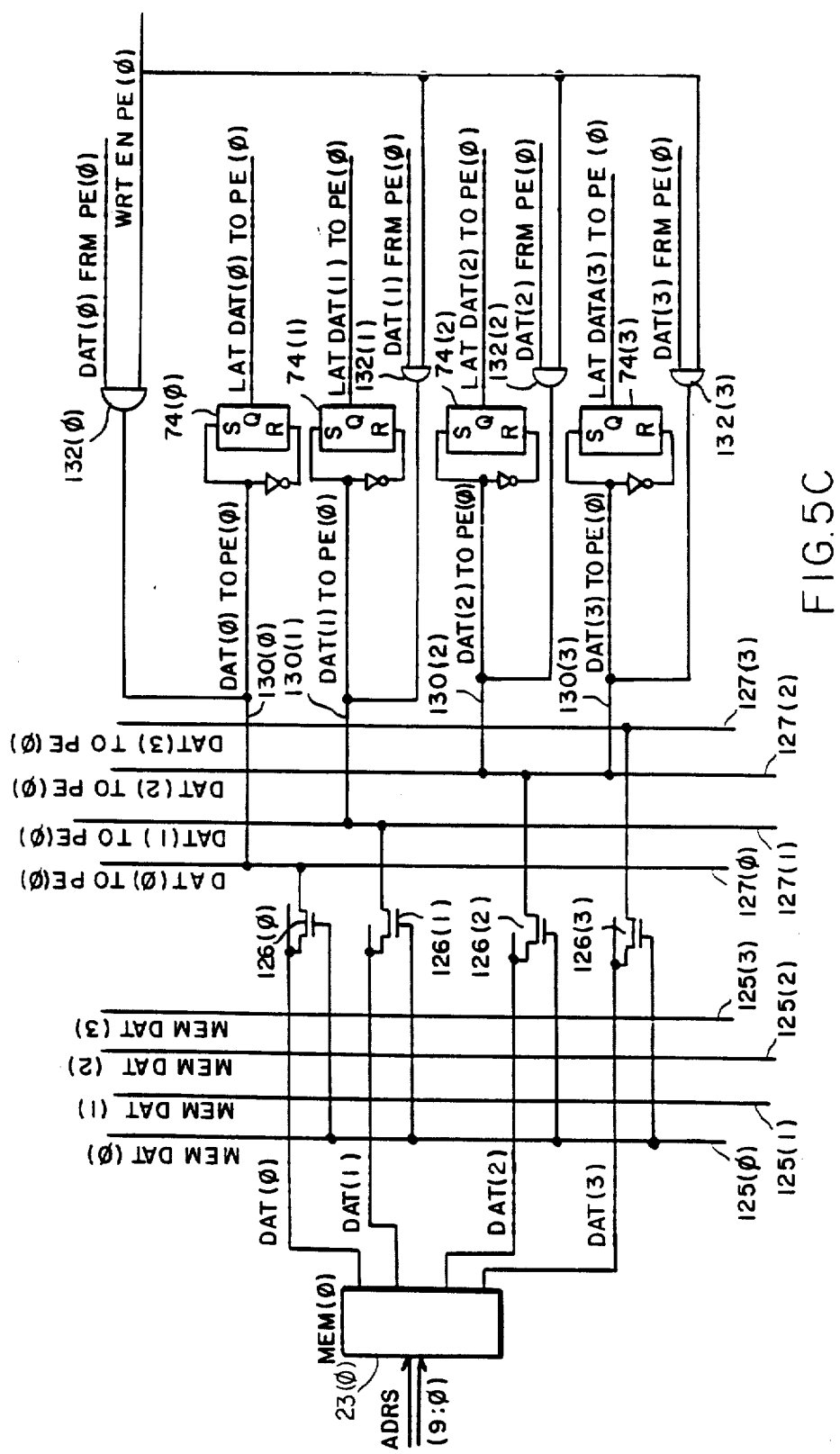
FIG. 5C is a schematic circuit diagram of a circuit of the memory control circuit associated with 1 PE depicted in FIG. 5A.

FIG. 5C depicts the circuit of the memory control circuit 73 associated with PE 22(0). It can be seen that the memory control circuit 73 depicted in FIG. 5C is similar to the circuit depicted in FIG. 5B, except that there are no transistors 123(0) through 123(3) or 131(0) through 131(3); instead, the lines 130(0) through 130(3) are connected directly to lines 127(0) through 127(3), respectively, and the DAT (0)-(3) TO PE (0) data signals control the latches 74(0) through 74(3) directly. Furthermore, transistors 126(0) through 126(3) are controlled by the MEM DAT (0) signal from demultiplexer 124 to couple the DAT(0) through DAT(3) signals from memory module 23(0) directly onto the lines 127(0) through 127(3) when the MEM DAT (0) signal is asserted. The MEM DAT (0) signal is asserted by demultiplexer 124 when the ADRS (11) and ADRS (10) signals are both negated, that is, when the array 11 is not in the 4 Kb mode.

C. Status Signal Generation

As was noted above in the discussion regarding FIGS. 2 and 4, the array control unit 10 (FIG. 1) uses a DONE status signal transmitted over status bus 15 to determine if various operations have been completed by the PE's 21 in array 11 and to control further processing. The DONE status signal is asserted, for example, during message transfer over routing network 30 (FIG. 2) when all of the PE's which have messages to send (that is, whose TR transmit request flags 24) have received acknowledgements that their messages have been received during a major message transfer cycle. The DONE status signal is also asserted during normalization during floating point arithmetic when the fraction portion of the floating point numbers in all of the PE's have been normalized.

In both the transfer of messages and normalization, until the DONE signal is asserted, the array control unit 10 repetitively transmits sequences of control microwords which enable the array 11 to engage in a message transfer operation or in a normalization operation. Whether or not a particular PE actually engages in the operation depends on the state of various ones of the PE's flags. As has been described, whether or not a PE engages in a message transfer depends on the state of the TR transmit request flag 24, the ACK acknowledge flag 26 and the PE's RTR OUT EN IN router out enable in signal (see FIG. 4). Furthermore, whether or not a PE engages in a normalization operation depends on the condition of the PE's M flag 62 (FIG. 4).

Figure 6:
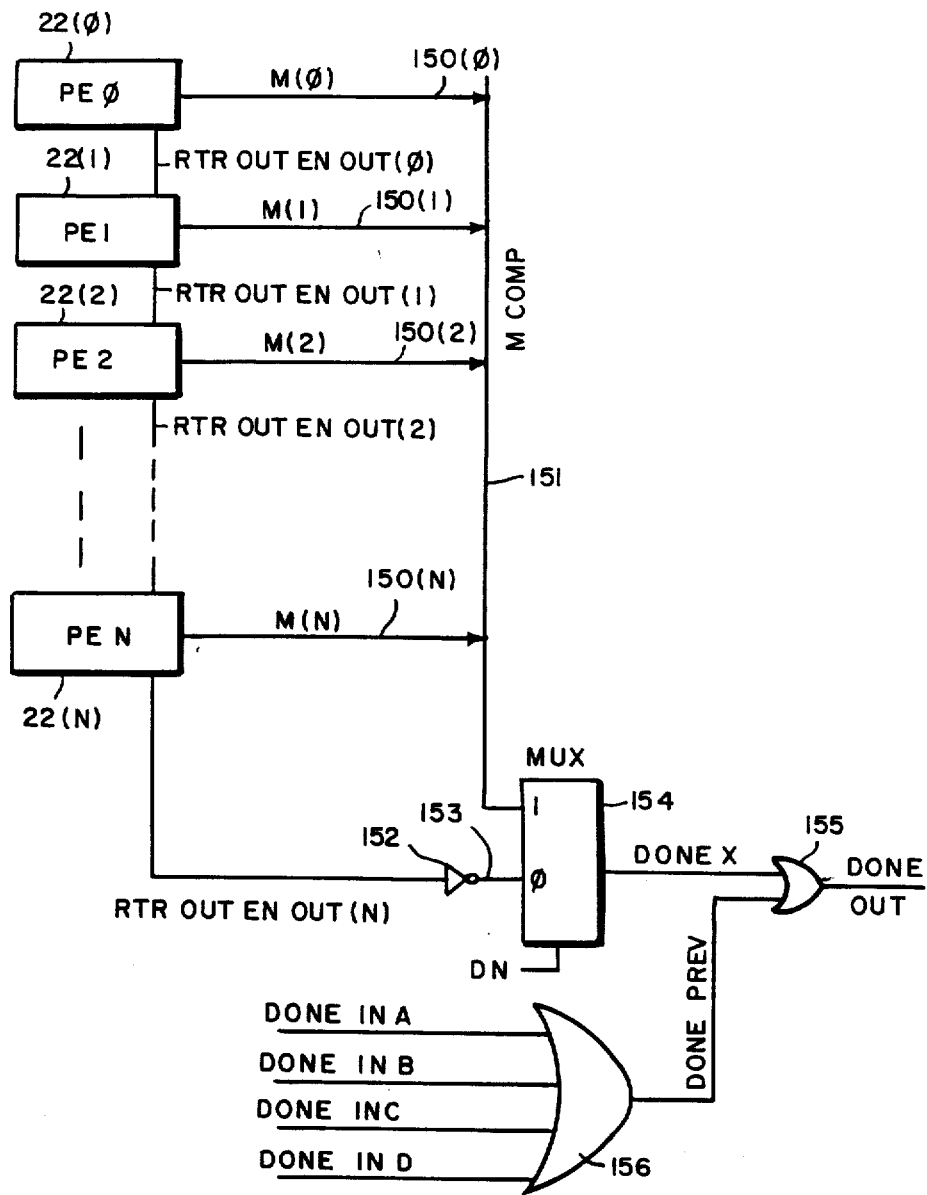
FIG. 6 is a block diagram depicting generation of various status signals on each processor chip used by the array control unit depicted in FIG. 1.

FIG. 6 depicts circuitry within a PE chip 20 for generating a DONE OUT signal which is used by array 11 (FIG. 1) in connection with generating the DONE status signal. With reference to FIG. 6, each PE 22(0) through 22(N) on the PE chip 20 has extending therefrom a wire 150(0) through 150(N) which carries signals M(0) through M(N). The asserted or negated condition of each signal M(0) through M(N) corresponds to the set or cleared condition of the PE's M flag 62 (FIG. 4). Thus, if a PE's M flag 62 is set, the PE's M (x) signal ("x" a value from zero to N) is asserted, otherwise the M(x) signal is negated.

All of wires 150(0) through 150(N) are connected to a common wire 151 in a wired-OR configuration. Wire 151 carries an M COMP composite "M" signal whose asserted or negated condition depends on the conditions of the M(0) through M(N) signals from all of the PE's on the chip. Thus, if the M flag 62 (FIG. 4) of any of processors 22(0) through 22(N) is set, the PE's corresponding M(x) signal is asserted, and the M COMP signal is asserted. If the M flag 62 of all of processors 22(0) through 22(N) is cleared, all of the M(0) through M(N) signals will be negated, and the M COMP signal will be negated. As described above in connection with FIG. 4, when a PE has completed the normalization operation, its M flag 62 will be cleared; thus, when the M COMP composite M signal is negated, all of the PE's on the chip will have completed the normalization operation.

As also described above in connection with FIG. 4, as each PE 22(x) receives acknowledgement of a message transmitted through routing network 30 (FIG. 2), it asserts its RTR OUT EN OUT (x) router out enable out signal, which enables the next PE 22(x+1) on the chip to transmit its message. If the PE 22(x) is not enabled to transmit a message, that is, if its TR transmit request flag 24 is cleared, when it receives the RTR OUT EN IN router out enable in signal from the preceeding PE 22(x−1) (which corresponds to that PE's RTR OUT EN OUT router out enable out signal), it asserts its RTR OUT EN OUT router out enable out signal immediately. Thus, when the last PE 22(N) asserts its RTR OUT EN OUT (N) router out enable out [PE 22(N)] signal, all of the PE's on the chip which were enabled to transmit messages over the routing network have transmitted the messages and have received acknowledgements that those messages have been received.

With reference to FIG. 6, the inverter 152 generates the complement of the RTR OUT EN OUT (N) router out enable out [PE 22(N)] signal from PE 22(N) places it on a line 153. Thus, the signal on line 53 is at a low voltage level when the RTR OUT EN OUT (N) router out enable out [PE 22(N)] signal is asserted (high voltage level). Lines 151 and 153 are connected to two input terminals of a multiplexer 154, which is controlled by a DN done select signal from the control microword. The DN done select signal enables the multiplexer to couple the signal on one of lines 151 or 153 to its output terminal as a DONE X signal, which, in turn, is coupled to one input terminal of an OR gate 155. If the signal on the one of lines 151 or 153, as selected by the DN done select signal, is asserted, the DONE X signal is also asserted, otherwise, the DONE X signal is negated. If the DONE X signal is asserted, the OR gate 155 also asserts the DONE OUT signal.

The OR gate 155 has a second input terminal which receives a DONE PREV done previous signal from an OR gate 156. OR gate 156, in turn receives as input signals DONE IN A through DONE IN D, each of which corresponds to a DONE OUT signal from another PE chip. The DONE OUT signal from the PE chip 20 depicted in FIG. 6 may also be directed as an input signal to an OR gate corresponding to OR gate 156 on another PE chip. The resulting connection, an "OR" tree, results in one DONE OUT signal from one PE which is coupled to array control unit as the DONE signal. Thus, when the DONE signal is in a low voltage condition, depending on the condition of the DN done select signal, either all of the M COMP composite M signals in all of the PE chips are negated, indicating that all of the M flags 62 are cleared, or all of the RTR OUT EN OUT (N) router out enable out signals are asserted, indicating that all messages have been transmitted and acknowledged. Thus, when the DONE signal is in a low voltage condition, the array 11 has completed the major message transfer cycle, or the operation (such as floating point number normalization) which was governed by the M flags 62 in the PE's.

D. Shift Register

As described above in connection with FIG. 4, the A shift register 52 (FIG. 4) can shift not only toward its S/O output terminal, but also toward its S/I input terminal. This capability permits the contents of the shift register to be easily shifted prior to such operations as floating point addition and subtraction, which requires the fraction portion of the floating point number having a lower valued exponent to be shifted so as to represent a lower value.

Figure 7:
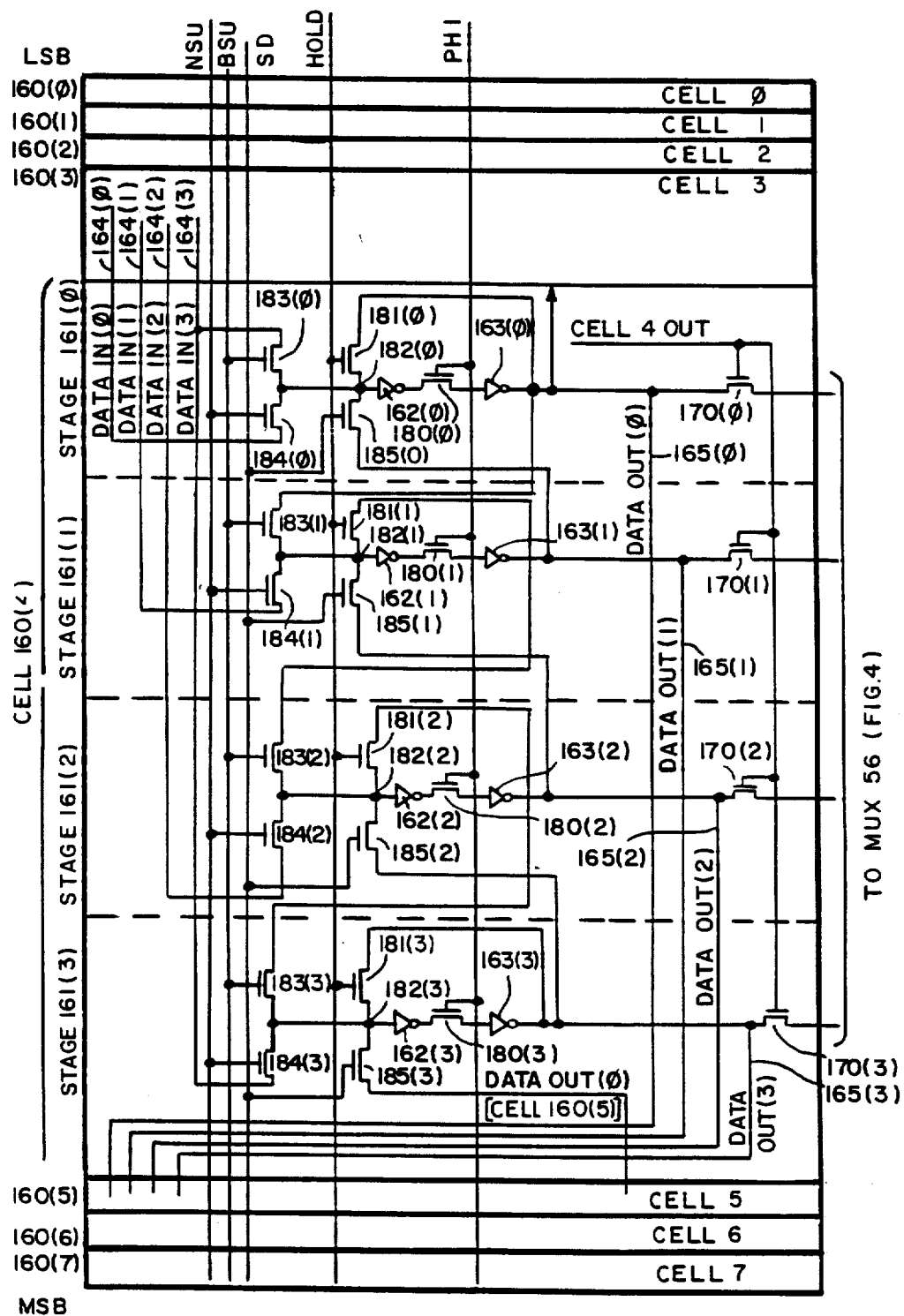
FIG. 7 is a detailed circuit diagram of a shift register which forms part of the processor element depicted in FIG. 4.

FIG. 7 depicts a schematic circuit of a portion of the A shift register 52. The A shift register 52 includes, in one embodiment, eight cells 160(0) through 160(7), each of which includes four stages. Each stage stores one data bit. Cell 160(0) contains the least significant data bits (indicated by the legend "LSB" in the Figure) and the succeeding cells 161(1), 161(2), and so forth, contains successively more signficant data bits, so that, depending on the A SHFT SZ shift register size signals from the control microword (see FIG. 4) cell 160(7) may contain the most significant data bits (as indicated by the legend "MSB" in the Figure). Data is shifted into A shift register 52 through cell 160(0). The cell from which data bits are shifted out depends on the condition of the A SHFT SZ A shift register shift size signals from the control microword (see FIG. 4).

Since the circuits of the cells are similar, the circuit of only cell 160(4) will be described in detail. The cell 160(4) includes four stages 161(0) through 161(3) each of which includes a pair of inverters, including input inverters 162(0) through 162(3) and output inverters 163(0) through 163(3). Stage 161(0) stores the low-order data bit of the data in the cell, and stage 161(3) stores the high-order data bit of the data in the cell.

The pair of inverters 162(n) and 163(n) ("n" is an integer from 0 to 3) in each stage are connected through control transistors 180(n) and 181(n) to form a flip-flop which actually stores the data bit. In each stage, the output of inverter 162(n) is coupled through a control transistor 180(n), which is normally held on by an asserted PH 1 control signal, to the input of inverter 163(n). The output of inverter 163(n) is coupled through control transistor 181(n) to a node 182(n), to which the input of inverter 162(n) is also connected. The transistor 181(n), which is normally held on by an asserted HOLD control signal, controls the feedback from the output of inverter 163(n) to the input of inverter 162(n) which enables the inverters to latch the input at node 182(n) in a known manner.

During shift operations, the HOLD signal is negated, turning off transistor 181(n) and breaking the feedback path. In addition, the PH 1 timing is also negated, turning off transistor 180(n). Transistor 180(n), when off, isolates the output inverter 163(n) from the input inverter 162(n). This allows the output inverter 163(n) of the stage to transmit a signal representing the stored data bit at the same time that the input inverter 162(n) of the stage receives a signal representing a signal representing a data bit from another stage as described below.

Cell 160(4) receives four bits of data, comprising signals DATA IN (0) through DATA IN (3), from cell 160(3) on respective lines 164(0) through 164(3). Cell 160(4) transmits four bits of data, comprising signals DATA OUT (0) through DATA OUT (3), on respective lines 165(0) through 165(3), to stage 160(5). In addition, if the stage 160(4) is one from which data signals are transmitted to multiplexer 56 (FIG. 4), each stage includes a pass transistor 170(0) through 171(3), connected to lines 165(0) through 165(3) and controlled by a CELL 4 OUT signal, in the A SHFT SZ A shift register 52 size signals. When the CELL 4 OUT signal is asserted, the transistors 170(0) through 170(3) are enabled to couple the DATA OUT (0) through DATA OUT (3) signals to the A shift register input terminal of multiplexer 56.

The direction and amount of shift in A shift register 52 are controlled by the SHFT DIR shift direction signal and the NM nibble mode signal, both of which are provided by the control microword from the array control unit 10 and by an EN SHFT enable shift timing signal, in addition to the timing control signals HOLD and PH 1. A shift register 52 generates three additional control signals in response to the SHFT DIR and NM signals. Specifically, A shift register 52 includes an AND gate 171 which receives the SHFT DIR and NM signals and generates an NS nibble shift signal, which, when, asserted, enables one input of an AND gate 176. If the NS signal is asserted, when the EN SHFT enable shift timing signal is then asserted, AND gate 176 asserts an NSU nibble shift up signal. As will be described below, when the NSU signal is asserted, the A shift register 52 is conditioned to shift the data bits up a nibble (4 bits) at a time, that is, to the cell 160 which stores the next most significant data bits. Thus, when NSU nibble shift up signal is asserted, the data bits are conditioned to be shifted from cell to cell, and are stored in the same stages in each cell. The data bits shifted into cell 160(0) are provided by full adder 51.

A second AND gate 172 generates a BS bit shift signal in response to the complement of the NM nibble mode signal, as inverted in inverter 173, and the SHFT DIR shift direction signal. Thus, when the NM nibble mode signal is negated and the SHFT DIR shift direction signal is asserted, the BS bit shift signal from AND gate 172 will be asserted. When the EN SHFT enable shift timing signal is asserted, AND gate 177 asserts the BSU bit shift up signal. Since, however, the NM signal is negated, the NS nibble shift signal from AND gate 171 will be negated and the NSU nibble shift up signal from AND gate 176 will remain negated when the EN SHFT enable shift signal is asserted. However, as will be described below, when the BSU bit shift up signal is asserted, the A shift register 52 is conditioned to shift the data bits up a stage at a time. The data bit in the most significant stage in each cell is shifted into the least significant stage of the next more significant cell. The data bit shifted into the least significant stage [corresponding to stage 161(0)] is provided by the ADD OUT (0) signal from full adder 51 (see FIG. 4).

Another AND gate 174 generates a DOWN signal in response to the complement of the NM nibble mode signal and the complement of the SHFT DIR shift direction signal, as inverted in inverter 175. When the EN SHFT enable shift timing signal is next asserted, an AND gate 178 enabled by the DOWN and EN SHFT enable shift signal asserts the SD shift down signal. Thus, when both the SHFT DIR shift direction signal and the NM nibble mode signal are negated, the DOWN signal is asserted. In addition, with the SHFT DIR and NM signals both negated, both the NSU and BSU nibble and bit shift up signals from AND gates 176 and 177 are negated. As will be described below, when the SD shift down signal is asserted, the A shift register 52 is conditioned to shift the data bits down a stage at a time. The data bit in the least significant stage in each cell, except for the most significant stage in cell 160(7), is shifted into the the most significant stage of the next lesser significant cell. A data bit having the value zero is stored in the most significant stage [corresponding to stage 161(3)] of the most significant cell 160(7).

Each stage 161(0) through 161(3) further includes three transistors, namely transistors 183(n), 184(n) and 185(n) each enabled by one of the BSU bit shift up, NSU nibble shift up, and SD shift down control signals, respectively. When a control signal is asserted, the enabled transistor couples a signal representing the state of a data bit from another stage to the input node 182(n) of its respective stage.

In response to the assertion of the BSU bit shift up signal, with reference first to stage 161(0), the transistor 183(0) is turned on, coupling the DATA IN (3) data signal on line 164(3) to node 182(0). The DATA IN (3) data signal corresponds to the data bit from the most significant stage of cell 160(3). Further, in response to the BSU bit shift up signal, transistors 183(1) through 183(3) are turned on, coupling the DATA OUT (0) through DATA OUT (2) signals to nodes 182(1) through 182(3). As a result, the data bits in each of the stages, namely the most significant stage of cell 160(3) and the stages 161(0) through 161(2) are shifted up one stage and are stored in stages 161(0) through 161(3) of cell 160(4).

In response to the assertion of the NSU nibble shift up signal, transistors 184(0) through 184(3) are turned on, coupling the DATA IN (0) through DATA IN (3) data signals on lines 164(0) through 164(3), respectively to nodes 182(0) through 182(3). The DATA IN (0) through DATA IN (3) data signals correspond to the data bits from the respective stages of cell 160(3). As a result, the data bits in each of the stages of cell 160(3) are shifted up one cell (four stages) and are stored in stages 161(0) through 161(3) of cell 160(4).

In response to the assertion of the SD shift down signal, transistors 185(0) through 185(2) are turned on, coupling the DATA OUT (1) through DATA OUT (3) data signals on lines 165(1) through 165(3), respectively to nodes 182(0) through 182(2) for storage in stages 161(0) through 161(2). In addition, transistor 185(3) is turned on to couple the DATA OUT (0) [CELL 160(5)] data signal from the least significant stage in cell 160(5) [that is, the stage corresponding to stage 161(0)] to node 182(3) for storage in stage 161(3). A transistor in the most significant stage of cell 160(3) corresponding to transistor 185(3) receives the DATA OUT (0) data out signal from stage 161(0) for storage therein. As a result, the data bits in each of the stages are shifted down one stage.

IV. Routing Network 30

A. General Description

As described above with reference to FIG. 2, the routing network 30 is used to transmit messages between PE's which are typically not likely to be on the same PE chip. A general organizational diagram of one embodiment of a routing network constructed in accordance with the invention is depicted in FIG. 8A. With reference to FIG. 8A, the routing network 30 comprises a plurality of identical switching chips (each switching chip is depicted as a rectangle in the Figure) organized in three switching stages 201, 202 and 203. The internal switching circuits of chips 200(n) will be described below in connection with FIGS. 9 and 10A through 10C.

Before proceeding further, it would be helpful to describe the format of a message transmitted through routing network 30. With reference to FIG. 8B, a message begins with a header 204 of twenty-three bits, namely bits (0) through (22), which identify the intended recipient PE, followed by the message data bits beginning with bit (23). The header includes three router control fields, identified by reference numerals 205–207, each of which controls the switching through one of the switching stages 201–203, respectively. Each switching stage 201–203 retires one router control field, that is, it does not pass the bits in that field on to the next switching stage or to the recepient PE chips.

Each router control field begins with a protocol bit P (which is asserted at a low voltage level) which indicates that message bits follow. If the protocol bit P is not received at an input terminal, the switching chips ignore succeeding signals at that input terminal during the minor message transfer cycle. The four bits following each protocol bit are RTR ADRS router address bits which are used by the router to establish a switching path through the stage as described below in connection with FIGS. 9 and 10A through 10C. If a switching path is established through all of the switching stages, a protocol bit P (bit 15) is transmitted to the PE chip pair (see FIG. 2) connected to the output line from stage 203. In response, during bit 16, the PE chips generate an ACK acknowledgement signal which is transmitted over the switching path established through the routing network 30. At this time, the switching chips condition the switching path to receive a signal from the recipient PE chip pair and couple it to the PE chip 20 which is originating the message. The PE chip 20 originating the message uses the ACK acknowledgement signal to set the transmitting PE's ACK acknowledgement flag 26 (FIGS. 2 and 4).

After the transfer of the ACK acknowledgement signal, a six-bit PROC ID processor identification is transmitted over the switching path. The first bit identifies the PE chip 20 in the chip pair which contains the PE to receive the message, and the last five bits identify the PE on the identified chip. The next bits are the message bits which are coupled by the PE chip's router control circuit 33 (FIGS. 2 and 4) to the PE.

With reference again to FIG. 8A, the first two switching stages 201 and 202 are divided into four switching groups, one of which is depicted in the Figure. The last switching stage 203 operates as a crossbar switch to switch the outputs from the four switching groups to the PE chips. Since the four switching groups are identical, only the one depicted in the Figure will be described in detail. That switching group includes sixteen switching chips, identified by reference numerals 201(0) through 201(15) in switching stage 201, and an additional sixteen switching chips, identified by reference numerals 202(0) through 202(15) in switching stag 202.

Each switching chip 201(n) and 202(n) ("n" is an integer) has sixty-four input terminals, generally identified by reference numeral 210, and sixty four output terminals, generally identified by reference numeral 211. The sixty-four output terminals are grouped into sixteen output groups each having four output terminals. Each of the sixteen output groups is identified by one encoding of the four RTR ADRS router address bits in the portion of the header 204 (FIG. 8B) that is retired by the switching chip. On receiving at an input terminal RTR ADRS router address bits having a particular encoding, the switching chip attempts to open a switching path from that input terminal to one of the four output terminals in the output group identified by that encoding If RTR ADRS router address bits received at four or fewer input terminals of the switching chip identify a particular output group, switching paths can be established to the output group from all of the input terminals. If, on the other hand RTR ADRS router address bits identifying a particular output group are received at more than four input terminals, at most four switching paths can be established to the output group and the other messages, for which switching paths cannot be established, are blocked.

The output terminals of the switching chips 201(0) through 201(15) included in the first switching stage 201 are connected to the input terminals of the switching chips 202(0) through 202(15) of the second switching stage as follows. All of the output terminals of the chips 201(0) through 201(15) in groups associated with the "0000" encoding of the RT ADRS router address retired by switching chips 201(0) through 201(15) are connected to the input terminals of switching chip 202(0). This is depicted in the Figure by the wires identified by the legends "4×0000" extending from the right sides of switching chips 201(0) through 201(15) to the left side of switching chip 202(0). (In the legend "4×0000" in FIG. 8A, the first number, "4", indicates that the associated line includes 4 connecting wires, and the second number "0000" indicates that the wires are associated with the "0000" encoding of the first four RTR ADDRS router address signals, which are retired by the switching stage 201.)

Similarly, all of the output terminals of the chips 201(0) through 201(15) in groups associated with the "0001" encoding of the RTR ADRS router address retired by switching chips 201(0) through 201(15) are connected to the input terminals of switching chip 202(1), as depicted in FIG. 8A by the wires identified by the legends "4 x 0001" extending from the right sides of switching chips 201(0) through 201(15) to the left side of switching chip 202(1). This interconnection pattern between the switching chips in the first two stages 201 and 202 is repeated for all of the other switching chips 202(2) through 202(15); as depicted in the Figure, the input terminals of switching chip 202(15) are connected to the output terminals of switching chips 201(0) through 201(15) that are in groups associated with the "1111" encoding of the RTR ADRS router address retired by the switching chips 201(0) through 201(15). Thus, the output terminal groups in each of the switching chips 201(0) through 201(15) are connected to diverse ones of the switching chips 202(0) through 202(15) in the second switching stage 202, with the connection depending on the RTR ADRS router address that is retired by the switching chips in the first stage.

As described above, the sixty-four output terminals of each of the switching chips 202(0) through 202(15) in the second switching stage 202 are also divided into sixteen groups each having four terminals. Like switching chips 201(0) through 201(15), each output terminal group of switching chips 202(0) through 202(15) is associated with one encoding of the four RTR ADRS router address signals retired by those chips. The output terminal groups of switching chip 202(0), for example, connect to wires having the legends "4×0000 0001"

through "4×0000 1111", with "4" indicating the number of wires (with each wire being connected to one output terminal), the first block of four digits "0000" indicating the RTR ADRS router address bits retired by the first switching stage 201, and the second block of four digits "0000" and "1111" indicating the RTR ADRS router address bits that are retired by the switching chips 202(0) through 202(15). The wires attached to the output terminal groups of switching chips 202(1) through 202(15) are identified by similar legends.

As described above, switching stages 201 and 202 are divided into four switching groups (one group is depicted in the Figure) the outputs of which are switched by crossbar stage 203. The other three switching groups of switching stages 201 and 202 include chips corresponding to switching chip 202(0) having output terminal groups associated with the RTR ADRS router address bits "0000 0000" through "0000 1111", chips correpsonding to switching chip 202(1) having output terminal groups associated with the RTR ADRS router address bits "0001 0000" through "0001 1111", and so on.

The crossbar switching stage 203 includes sixteen crossbar switching blocks of sixteen crossbar switching chips 203(0) through 203(255) [only switching chips 203(0) through 203(3) are shown in the Figure], with each crossbar switching block switching the output signals from output terminal groups in the corresponding switching chips in each of the switching groups. Each of the sixteen crossbar switching chips in each crossbar switching block, in turn, switches the outputs from corresponding terminal groups in corresponding stage 202 switching chips from all of the four groups. Thus, crossbar switching chip 203(0) is connected to, and switches the outputs from, the "4×0000 0000" output terminal groups from switching chip 202(0) and corresponding switching chips in each of the other switching groups.

Similarly, crossbar switching chip 203(1) is connected to, and switches the outputs from, the "4×0000 0001" terminal groups from switching chip 202(0) and corresponding switching chips in each of the other switching groups. In addition, the last crossbar switching chip in the crossbar switching block associated with switching chip 202(0) (and corresponding switching chips in the other switching groups), namely crossbar switching chip 203(15), is connected to, and switches the outputs from, the "4×0000 1111" terminal groups from switching chip 202(0) and corresponding switching chips in each of the other switching groups.

The crossbar switching chips 203(16) through 203(255) in each of the other crossbar switching blocks is similarly connected to the other switching chips 202(1) through 202(15), and corresponding switching chips in the other switching groups.

Each crossbar switching chip operates as a crossbar switch. That is, the crossbar switching chip associates each of its sixteen output terminals with one encoding of the final four RTR ADRS router address bits which it receives from the switching stage 202 switching chips. Thus, for example, switching chip 203(0) has sixteen output terminals each connected to a wire having the legend "1×0000 0000 0000" through "1×0000 0000 1111". In this case, the leading "1" indicates that there is one wire, the first group of digits, namely the first group of "0000", corresponds to the RTR ADRS router address bits retired by switching stage 201, the second group of digits, namely the second group of "0000", corresponds to the RTR ADRS router address bits retired by switching stage 202, and the third group of digits, which range from "0000" through "1111", corresponds to the RTR ADRS router address bits received and retired by the crossbar switching chip 203(0).

The output terminals of the other crossbar switching chips 203(1) through 203(255) have similar associations with the RTR ADRS router address bits. It will be appreciated by those skilled in the art that:

(1) each of the sixteen output terminals of each crossbar switching chip 203(0) through 203(255) is associated with one encoding of the third group of RTR ADRS router address bits (that is the third group of digits associated with each output line from the crossbar switching chips depicted in FIG. 8A,)

(2) each of the sixteen crossbar switching chips in each crossbar switching block is associated with one encoding of the second group of RTR ADRS router address bits (that is the second group of digits associated with each output line from the crossbar switching chips depicted in FIG. 8A,), and (3) each of the sixteen crossbar switching blocks is associated with one encoding of the first group of RTR ADRS router address bits (that is the first group of digits associated with each output line from the crossbar switching chips depicted in FIG. 8A,).

Accordingly, the routing network depicted in FIG. 8A provides switching paths from the input terminals of the switching chips of stage 201 to the output terminals of crossbar switching chips of crossbar stage 203 for all possible encodings of the RTR ADRS router address bits.

The routing network 30 depicted in FIG. 8A has a number of advantages, in particularly relating to the association of multiple output terminals from switching stages 201 and 202 into groups associated with the same encoding of the RTR ADRS router address bits. This significantly reduces the number of switching stages that are required, reducing the number of switching chips and wires interconnecting the chips. This, in turn, serves to enhance the reliability of the routing network, since the failure rate is directly related to the number of chips and, particularly, wires interconnecting those chips.

In addition, by associating multiple wires in a terminal group with each encoding of the RTR ADRS router address bits, if a wire, or its associated driving circuitry on the chip, is defective, the switching chips will still be able to transmit over the remaining wires in the terminal group. The message traffic that can be accommodated will be somewhat reduced, but the messages can still be transferred through the routing network 30.

B. Switching Chip

The internal organization and circuitry within a switching chip 201($n$) or 202($n$) will now be described in connection with FIGS. 9 and 10A through 10C. As will be made clear in the following discussion, the same chip as described herein can also be used as a crossbar switching chip in the crossbar stage 203.

FIG. 9 depicts the general circuit organization of a portion of the switching chip constructed in accordance with the invention. With reference to FIG. 9, a switching chip includes a plurality of switching circuits each associated with one input terminal. One such switching circuit, designated by the reference numeral 210(0), is shown in FIG. 9. In one embodiment, a switching chip includes sixty-four switching circuits. All of the switching circuits are identical, and so only one is depicted in the Figure. Each of the switching circuits is associated with one of the input terminals; switching circuit 210(0) is associated with the input (0) terminal, and generally switching circuit 210((u) ("u" is an integer) is associated with the input (u) terminal.

Switching circuit 210(0) includes an input (0) circuit 211(0), sixteen coupling groups 212(0) through 212(15) [generally designated 212(v)] and sixteen output terminal groups 217(0) through 217(15) [generally designated 217(v)]. Each output terminal group includes four output circuits generally identified by the reference numeral 217(v)(w). The input (0) circuit 211(0), the circuit of which is described below in connection with FIG. 10A, receives an IN(0) input signal from a PE chip pair if the chip is in stage 201 (see FIG. 8A) or from a preceeding switching stage if the chip is in stages 202 or 203. In response to the IN(0) input signal the input (0) circuit 211(0) transmits an ADRS(0) address signal onto a line 213(0) representing complement of the the RTR ADRS router address bits to be retired by the chip and a DAT(0) data signal onto a line 214(0) representing the remaining bits of the message.

Each coupling group 212(v) includes an address decoding and control circuit 215(0) through 215(15) [generally designated by reference numeral 215(v)] and a coupling circuit 216(0) through 216(15) [generally 216(v)]. One circuit for a coupling group will be described in detail below in connection with FIGS. 10B-1 and 10B-2. Line 213(0) from input (0) circuit 211 couples the ADRS(0) address signal to the address circuit 215(0) in coupling group 212(0) and line 214(0) couples the DAT(0) data signal to all of the 216(v) coupling circuits in parallel. In response to the four RTR ADRS router address bits retired by the switching chip, one of the address control circuits 215(v) in switching circuit 210(0) will assert an ADRS(v)EN(u) signal. For example, if the IN(0) signal received by input (0) circuit 211(0) has RTR ADRS router addres bits having the encoding "0000", address control circuit 215(0) will assert the ADRS(0)EN(0) signal.

Each coupling circuit includes four coupling modules generally designated by reference numeral 216(v)(w), with the (v) index identifying the coupling circuit and the (w) index identifying the module within the circuit. For example, the coupling modules of coupling circuit 216(0) depicted in FIG. 9 are designated by the reference numerals 216(0)(0) through 216(0)(3), the coupling modules of coupling circuit 216(1) being designated by the reference numerals 216(1)(0) through 216(1)(3), and so forth.

The coupling modules 216(v)(0) through 216(v)(3) in each switching circuit 210(0) through 210(63) are connected to one of sixty-four data lines 220(0)(0) through 220(15)(3) [generally designated by reference numeral 220(v)(w)]. Data line 220(0)(0) is connected in parallel to all of the coupling modules 216(0)(0) in all of the switching circuits 210(0) through 210(63), data line 220(0)(1) is connected in parallel to all of coupling modules 216(0)(1) in all of the switching circuits 210(0) through 210(63) and so forth.

At any one time only one of the coupling modules connected to one data line 220(v)(w) is enabled, as described below, to couple a data signal, corresponding to the DAT(u) data signal from its respective input (v) circuit 211(v), onto the data line 220 as a GRP(v)DAT(w) group data signal. The output terminal group circuit 217(v) receives the GRP(v)DAT(w) group data signals relating to its terminal group and couples them as the switching chip's output signals.

Eachcoupling module 216(v)(w) is enabled to couple the DAT(u) data signal onto the respective data line 220(u)(v) in response to two enabling signals. One enabling signal, the ADRS(v)EN(u) coupling group enabling signal, generated by the address control circuit 215(v) in response to the decoding of the RTR ADRS router address bits from the ADRS(u) signal.

The second signal which enables a coupling module 216(v)(w) in switching circuit 210(u) is a GRP(v)EN/(w)IN(w) enabling signal. For clarity in FIG. 9, only the GRP(0)EN(0)IN(0) through GRP(0)EN(3)IN(0) enabling signals associated with output terminal group circuit 217(0) are depicted. In an actual circuit, the other output terminal group circuits 217(1) through 217(15) would also generate corresponding enabling signals which would be coupled to coupling modules 216(n)(0) through 216(n)(3) in coupling circuits 216(1) through 216(15).

Four daisy chain GRP(v)EN(w) enabling signals are originated by each output terminal group circuit 217(v) used by the coupling modules 216(v)(w) in the switching circuits 210(u). The GRP(v)EN(w) enabling signals are normally asserted by the output terminal group circuits 217(v). However, under some circumstances, such as, for example, if a communications path to the next stage is disrupted due to a broken wire or the like, the output terminal group circuit 217(v) negates the corresponding GRP(v)EN(w) enabling signal. Circuitry for detecting the presence of a disrutped communication path is described below in connection with FIGS. 10A and 10C.

The signals from the output terminal group circuits 217(v) are initially coupled to the coupling modules 216(v)(w) of the switching circuit 210(0) as a GRP(v)EN(w)IN(0) enabling signal depicted on FIG. 9. If a coupling module 216(v)(w) in switching circuit 210(0) receives an asserted GRP(v)EN(w)IN(0) enabling signal, and is enabled by the ADRS(u)EN(v) signal from the address control circuit, it transmits a negated GRP(v)EN(w)OUT(0) enabling signal to coupling module 216(u)(v) of switching circuit 210(1). In that case, the coupling module will couple the DAT(0) signal onto the 220(u)(v) data line. On the other hand, if a coupling module 216(u)(v) is not enabled by the ADRS(u)EN(v) signal from the address control circuit, it asserts a GRP(v)EN(w)OUT(0) enabling signal, which is coupled to coupling module 216(v)(w) of switching circuit 210(1). The coupling modules 216(v)(w) of that, and other switching circuits 210(2) through 210(63) operate similarly.

Thus the GRP(v)EN(w) enabling signals, originating from the output terminal groups 217(v), are passed through the coupling modules 216(v)(w) in a daisy-chained manner. If a coupling module 216(v)(w) is enabled by the associated address control circuit 215(v) and receives the GRP(v)EN(w) enabling signal in an asserted condition [that is, its GRP(v)EN(w)IN(u) signal is asserted], the coupling module uses the associated data line 220(v)(w) and blocks the GRP(v)EN(w) enabling signal [that is, it transmits the GRP(v)EN(w)OUT(u) enabling signal to the next switching circuit in a negated condition].

In any coupling group 216(v), only one coupling module 16(v)(w) will be enabled to couple the DAT(u) signal onto the associated data line 220(v)(w). Thus, for example, if the leftmost coupling module 216(0)(0) (as depicted in FIG. 9) is enabled by the ADRS(0)EN(0) signal from the address control circuit 215(v), but is disabled by a negated GRP(0)EN(0)IN(0) signal, it in turn enables the coupling module 216(0)(1) to its immediate right. If that coupling module 216(0)(1), is enabled by an asserted GRP(0)EN(1)IN(0) signal, it will couple the DAT(0) signal onto the data line 221(0)(1). However, if the GRP(0)EN(1)IN(0) signal is negated, that coupling module 216(0)(1) will enable the coupling module 216(0)(2) to it its immediate right. Essentially, the ADRS(0)EN(0) enabling signal from address control circuit 215(0) is essentially daisy-chained through the coupling modules 216(0)(0) through 216(0)(3).

For any received message, in any switching circuit 210(u) at most one of the ADRS(v)(EN(u) enabling signal from one of the address control circuits 215(v) will be asserted. That is, for any message only one coupling circuit 216(v) in any switching circuit 210(u) will be enabled by an address control circuit 215(v). The circuit of an address control circuit 215(v) will be described below in connection with FIG. 10B-1. In brief, each address control circuit 215(v) includes an input terminal 221(v) and an output terminal 222(v). Each address control circuit 215(v) receives through its input terminal 221(v) an input signal which is related to the ADRS(u) address signal, which in turn is related to the RTR ADRS router address bits. The address control circuit 215(v) also includes a latch and an inverter. As long as the latch is reset, the address control circuit couples, through the inverter, the complement of the signal at its input terminal 221(v) to the output terminal 222(v). If the latch is set, it remains set throughout the message, and causes the inverter to be bypassed, thus enabling the true value of the signal at the input terminal 221(v) to be coupled to the output terminal 222(v).

As depicted in FIG. 9, the address control circuits 215(v) in a switching circuit 210(u) are connected serially, so that each input terminal 221(1) through 221(15) of address control circuits 215(1) through 215(15) is connected to the output terminal 222(0) through 222(14), respectively, of the address control circuit 215(0) through 215(14) to its left. Initially, all of the latches are reset. Accordingly, if the IN(0) signal carries an initial RTR ADRS router address bit having the binary value "0", the ADRS(0) signal received by at input terminal 221(0) is asserted. As a result, the inverter in the address, control circuit 215(v) provides an negated output signal at its output terminal 222(0), which is coupled to the input terminal 221(1) of address control circuit 215(1).

Address control circuit 215(1), in turn receives the negated input terminal through its input terminal 221(1) and its inverter couples an asserted output signal to the output terminal 222(1), which is, in turn, coupled to the input terminal 222(2) of address control circuit 215(2). The remaining address control circuits 215(v) of switching circuit 210(0) operate similarly. Thus, when the address control circuit 215(15) receives an input signal through its input terminal 221(15), the input signals to address control circuits 215(v) having an even-numbered or zero index (v) will be asserted, and the input signals to the address control circuits having an odd-numbered index (v) will be negated.

At this point, the latches in the address control circuits 215(v) latch the input signal. If the input signal to an address control circuit 215(v) is asserted, the latch remains cleared, otherwise the latch is set. After a latch is set, it enables its address control circuit's inverter to be by-passed, and so the signal received at it's input terminal 221(v) will be coupled directly to the output terminal 222(v). If the latch is set, the address control circuit 215(v) is also inhibited from asserting the ADRS(v)EN(u) coupling circuit enabling signal.

The input (0) circuit then transmits an ADRS(0) signal related to the second RTR ADRS router address bit to the input terminal 221(0) of address control circuit 215(0). The address control circuits 215(v) ("v" an even number or zero) whose latches are cleared operate in the same manner as described above and transmit a signal at their output terminals 222(v) which is the complement of the signal at their input terminals 221(v). At the same time, the address controls circuits 215(v) ("v" an odd number) whose latches are set pass the signal which they receive at their input terminals 221(v) to their output terminals 222(v). Thus, the input signals at the address control circuits 215(0) and others 215(v) whose indexes (v) are divisible by four asserted. Contrariwise, the input signals to the other address control circuits 215(v) whose latches are not already set [that is, circuits 215(v) where (v) is an even number but not divisible by four] are negated.

At this point, the latches again latch the input signals. This process is repeated for the third and fourth RTR ADRS router address bits which are received. It will be appreciated that in response to each RTR ADRS router address bit, the latches in one-half of the address control circuits 215(v) are set. Accordingly, after four RTR ADRS router address bits are received and processed by the circuit depicted in FIG. 9, the latch of only one address control circuit will be cleared, and the others will all be set. In the example above in which the RTR ADRS router address bits have the encoding "0000", only the latch of address control circuit 215(0) will be cleared, and that address control circuit will assert the ADRS(0)EN(0) signal. The operations in response to other encodings of the RTR ADRS router address bits are similar, except that each different encodings enables latches of a different address control circuit 215(v) to remain cleared, enabling that address control circuit to assert its ADRS(v)EN(0) signal.

C. Description of Specific Circuits

Figures 1, 10B:
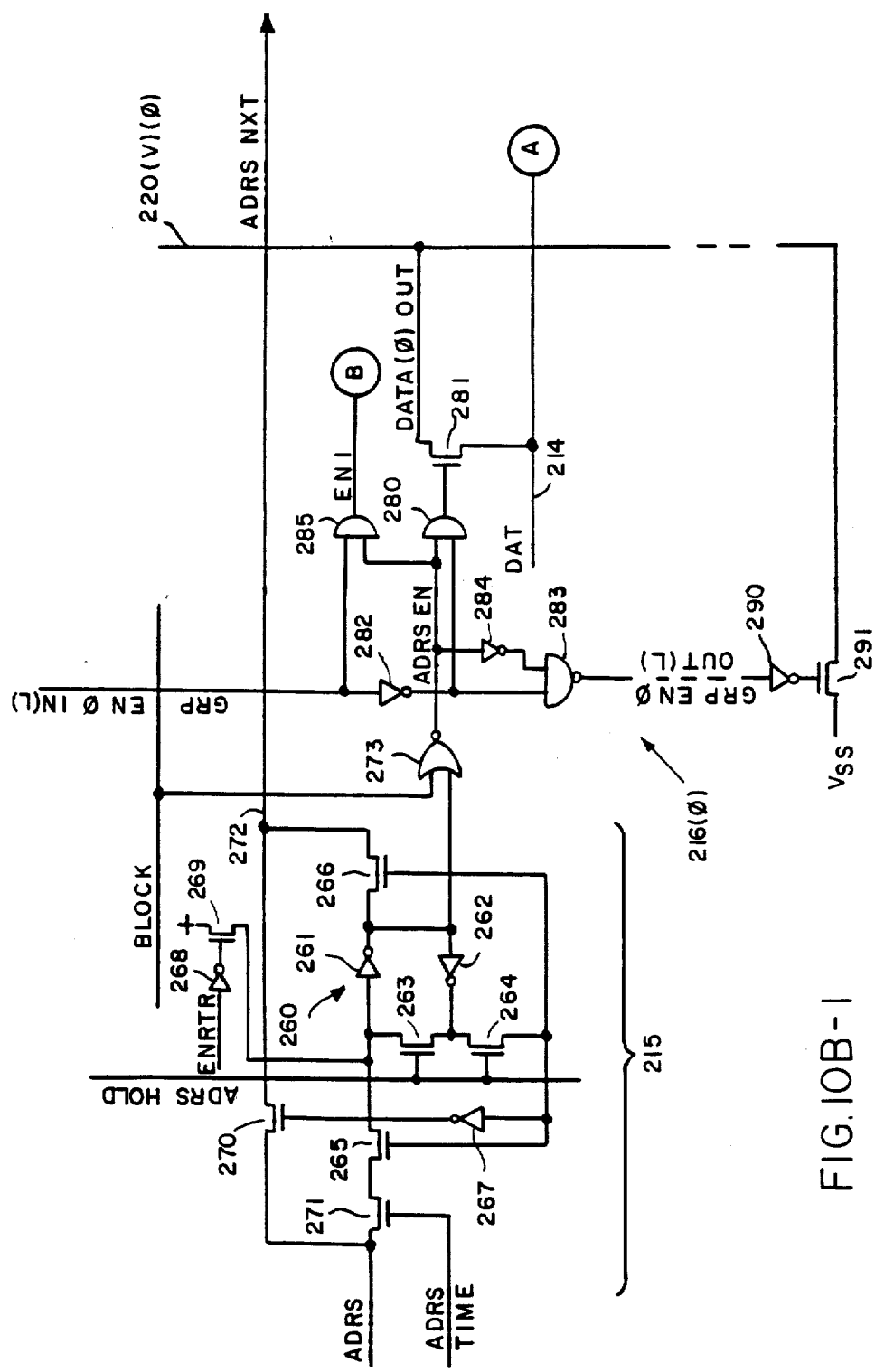
Figure 10C:
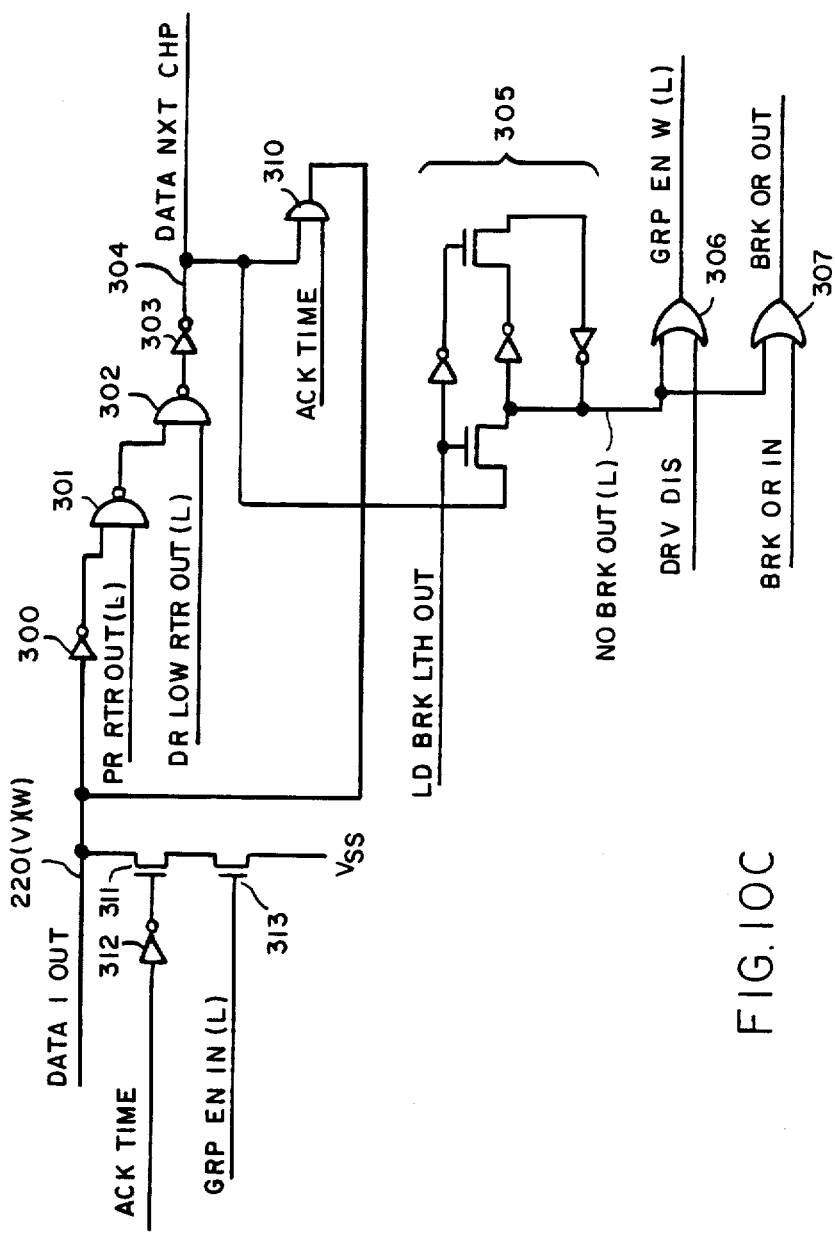

With this background, specific circuits for various portions of the switching chip depicted in FIG. 9 will be described. FIG. 10A depicts a circuit of an input (u) circuit, FIGS. 10B-1 and 10B-2, together comprising FIG. 10B, depict a circuit of an address control circuit 215(v) and its related coupling group 216(v). FIG. 10C depicts a circuit relating to a data line 220(v)(w) that comprises part of an output terminal group 217(v).

In the following description, the index (u), which is used in the description of FIG. 9, has not been used in connection with the signal names and reference numerals.

i. Input Circuit 211

With reference to FIG. 10A, an input circuit 211 receives an IN input signal on an input line 230. The IN input signal is coupled to two latches, namely a miss latch 231 and a break latch 232, to an inverter 233 and to one input terminal of an AND gate 234. In response to the IN input signal, the inverter 233 generates an ADRS signal which is coupled to the address control circuit depicted in FIG. 10B-1.

As has been described above in connection with FIG. 8B, the first signal bit received by the switching chip, and thus the first input signal received by the input circuit 211, is a protocol bit, labeled P in FIG. 8B. If the bit has a binary value of one, that is, if the IN signal is asserted during the P bit time, a message is being received through the input circuit 211. If, on the other hand, the bit has a binary value of zero, that is, if the IN signal is negated during the P bit time, no message is being transferred through input the input circuit. Miss latch 231 latches the condition of the IN signal during the P bit time, which is defined by an LD MISS LTH load miss latch timing signal which derived from a RTR CTRL router control signal (not shown) from the array control unit 10 (FIG. 1).

In particular, the RTR CTRL router control signal is transmitted to the switching chips of the first stage 201 (FIG. 8A) of the routing network 30 (FIG. 2). When the switching chips 201(0) through 201(63) of that stage have retired all of the bits of the first router control field 205 (FIG. 8B) and are prepared to transmit to the next stage 202, they transmit a RTR CTRL NXT router control next stage signal to the switching chips 202(0) through 202(63). This process is repeated as between switching chips of stage 202 and crossbar stage 203, and as between chips of crossbar stage 203 and the input terminals of PE chips 20 (FIG. 2). Thus, the array control unit 10 may initiate a transfer through the routing network with the single RTR CTRL router control signal coupled only to the first switching stage, with each stage controlling timing of the next stage. This arrangement simplifies expansion of the routing network, as the array control unit does not have to be informed of any minimum or maximum number of switching stages.

The miss latch 231 includes two inverters 233 and 234, with the output of inverter 233, which, provides a MISS signal, being connected to the input of inverter 234. The output of inverter 234 is connected through a pass transistor 235 to the input of inverter 233. The IN input signal is also coupled to the input of inverter 233 through a pass transistor. The pass transistors are, in turn, controlled by the LD MISS LTH load miss latch timing signal. Transistor 236 is on, that is, conducting, when the LD MISS LTH load miss latch timing signal is asserted, and otherwise is off. Transistor 235, on the other hand, is controlled by the complement of the LD MISS LTH load miss latch timing signal, and is on, that is, conducting, when the LD MISS LTH load miss latch timing signal is negated, and otherwise off.

Thus, when the LD MISS LTH load miss latch timing signal is asserted, transistor 236 is turned on and transistor 235 is turned off. Transistor 236 couples the IN input signal to the input of inverter 233. The MISS signal from inverter 233 is the complement of the received IN signal while the LD MISS LTH load miss latch timing signal is asserted. Inverter 234 receives the MISS signal from inverter 233 and complements it again. When the LD MISS LTH load miss latch timing signal is again negated, at the end of the time defining the P protocol bit (FIG. 8B), transistor 236 turns off, isolating the input of inverter 233 from the IN input signal.

At the same time, however, transistor 235 turns on, coupling the output signal from inverter 234 to the input of inverter 233. Since the output signal from inverter 234 has the same condition as the IN signal while the LD MISS LTH load miss latch timing signal was asserted, the MISS signal from inverter 233 remains in the same condition; that is, the IN signal is latched in the miss latch 231. The MISS signal represents the complement of the P bit, that is, the complement of the IN input signal when the LD MISS LTH load miss latch timing signal was last asserted. When the LD MISS LTH load miss latch timing signal is next asserted, transistor 235 is turned off, isolating the input of inverter 233 from the output of inverter 234 and permitting the IN input signal to be coupled to the input of inverter 233 through transistor 236.

If the MISS signal is asserted, the IN signal during the P protocol bit time was negated, and so no message is being received through the input circuit 211. If, on the other hand, the MISS signal is negated, the IN signal was asserted during the P protocol bit time, and a message is being received through the input circuit 211.

The break latch 232 is constructed in a manner similar to miss latch 232 and operates in the same way in response to a LD BRK LTH IN load break latch in timing signal from the array control unit 10 (FIG. 1). The break latch is used to latch the IN input signal while the communication path from the preceeding chip is tested to determine if it has been disrupted due to a broken wire or otherwise, as described below. If the communication path is disrupted, the break latch 232 asserts a BREAK signal and negates its complement, a NO BRK no break signal. The BREAK signal is coupled to an input of OR gate 240 which generates a BRK OR OUT break OR out signal. Or gate 240 receives a BRK OR IN break OR input signal from a similar circuit in an input circuit 211 on the switching chip or, as described below in connection with FIG. 10C, an output terminal group circuit 217(v). The OR gates 240 are connected in an OR chain which drives an illumination device (not shown) so that, if any communications path to which the chip is connected is disrupted, the illumination device is energized.

The NO BRK no break signal is coupled to a NAND gate 241, to which the complement of the MISS signal is also coupled. If either a miss condition occurs, or the communication pathway to input terminal 230 is disrupted, NAND gate 240 asserts a BLOCK signal which is coupled to the address control circuits 216(v), as described below in connection with FIG. 10B-1. In brief, the BLOCK signal, when asserted, inhibits the address control circuits connected to the input circuit 211 from asserting the ADRS(v)EN(u) coupling circuit enabling signals.

As described below in connection with FIG. 10B-2, a CHP MISS chip miss signal is asserted if no coupling circuit in a switching circuit 210(u) is enabled to couple the DAT(u) data signal onto a data output line 220. An OR gate 242 is energized to assert a DAT BLK data blocking signal when either the BLOCK signal or the CHP MISS chip miss signal is asserted. The complement of the DAT BLK data blocking signal is generated by an inverter 243 whose output is coupled to AND gate 234. Thus, if the DAT BLK data blocking signal is asserted, the AND gate 234 is disabled, inhibiting the AND gate 234 from coupling the IN input signal received on line 230 to line 214 as the DAT signal.

AND gate 234 is also disabled by an inverter 245 when an ACK TIME signal is asserted, which occurs when the ACK acknowledge bit of a message (see FIG. 8B) is expected to be transferred from the destination PE to the originating PE. The ACK TIME signal is provided by the array control unit 10. Thus, when the ACK TIME signal is asserted, the AND gate 234 isolates line 214 from the signal on line 230. Conversely, the AND gate is enabled to couple the IN signal on line 230 onto line 214 as the DAT signal when both the ACK TIME signal is negated, which occurs at times other than during the acknowledgement bit time, and when the DAT BLK data block signal is not asserted, indicating that a coupling module is enabled to couple the DAT signal onto an output data line 220(v)(w).

The remaining circuitry on FIG. 10A performs two functions. In particular, during the time for transferring the message acknowledgement bit, which occurs when the ACK TIME acknowledgement time signal is asserted, the signal representing the ACK bit is received by the input circuit over line 214. Circuitry is provided to couple the signal onto line 230 during the acknowledgement time. In addition, circuitry is provided to perform the communications path continuity test, which occurs in response to a PR RTR IN(L) precharge router in (asserted low) signal and a DR LOW RTR IN(L) drive low router in signal, both of which are provided by the array control unit 10 (FIG. 1).

During the acknowledgement bit transfer time, the ACK TIME signal is asserted, which disables AND gate 234. The PR RTR IN(L) precharge router in (asserted low) and the DR LOW RTR IN(L) drive low router in (asserted low) signals are both negated, and thus are at a high voltage level, thus enabling one input each of NAND gates 246 and 247 and two inputs a NAND gate 250. Since the ACK TIME signal is asserted, the inverter 245 couples a low input signal to the third input of NAND gate 250. The output of NAND gate 250 thus is at a high voltage level, which enables an AND gate 251, whose output is connected to line 230.

The DAT signal on line 214, which at this time represents the ACK acknowledgement bit, is complemented in an inverter 252, inverted twice through the two enabled NAND gates 246 and 247, and complemented again in a second inverter 253, whose output is coupled to the second input of AND gate 251. Thus, the signal provided by inverter 253 to AND gate 251 has the same sense as the DAT signal on line 214. Since AND gate 251 is enabled by the NAND gate 250, it couples the signal from inverter 253 onto line 230. Thus, during the acknowledgement bit time, the DAT signal, which represents the ACK acknowledgement bit, is coupled from line 214 to line 230, that is, through the input circuit 211.

At other times than the acknowledgement bit time, however, the ACK TIME signal is negated. Inverter 245 thus couples a high input signal to NAND gate 250. Since the other input signals to NAND gate 250 are normally negated and thus at a high voltage level, the output of NAND gate 250 is low, thus disabling AND gate 251. Accordingly, as long as the PR RTR IN(L) precharge router in (asserted low) and DR LOW RTR IN(L) drive low router in (asserted low) signals are negated, during times other than the acknowledgement bit time, AND gate 251 is inhibited from coupling the signal from inverter 253 to line 230.

The communications path continuity test is performed by circuitry in both the input circuit 211 depicted in FIG. 10A and the output terminal group described below in connection with FIG. 10C, and will be described below in connection with FIG. 10C.

ii. Address Control Circuit 215 And Coupling Circuit 216

FIGS. 10B-1 and 10B-2 depict the circuit diagram of an address control circuit and four coupling modules 216(0) through 216(3) [generally identified by reference numeral 216(w)] comprising one coupling circuit 216.

a. Address Control Circuit 215

As described above, the address control circuit 215 includes a latch 260 comprising two inverters 261 and 262. The output of inverter 261 is connected to the input of inverter 262, and the output of inverter 262 is connected to a pass transistor 263, which, when it is turned on by an ADRS HOLD address hold timing signal, couples the output signal from inverter 262 to the input of latch 261. Another pass transistor 264 also controlled by the ADRS HOLD address hold timing signal, couples the output signal from inverter 262 to control two pass transistors 265 and 266, and to an inverter 267 which controls a pass transistor 270.

An EN RTR enable router timing signal from the array control unit 10 (FIG. 1), when negated, through an inverter 268 turns on a transistor 269. This places a high signal at the input of inverter 261. When the router chip is enabled, the array control unit 10 asserts the EN RTR enable router timing signal, turning off transistor 269 and isolating the input of inverter 261 from the high input. Thus, immediately after the EN RTR enable router signal is asserted, latch 260 is in the condition such that the input of inverter 261, and thus the output of inverter 262 are high. In addition, the ADRS HOLD address hold timing signal is asserted. In this condition, the high output signal from inverter 262 enables the pass transistors 265 and 266 to be in the on, or conducting, condition, and pass transistor 270 to be in the off, or non conducting condition by inverter 267.

In response to the assertion of an ADRS TIME address time signal, which is asserted to define each RTR ADRS router address bit (see FIG. 8B) in the IN input signal (FIG. 10A), a pass transistor 271 is turned on, allowing the ADRS address signal from inverter 233 (FIG. 10A) to be coupled through transistor 271 and transistor 265. While the ADRS TIME signal is asserted, the ADRS HOLD address hold signal is negated, turning off transistors 263 and 264. While transistor 264 is turned off, transistors 265 and 266 and inverter 267 are held in the condition they were in by residual charge which remains on their inputs. However, the ADRS signal overcomes any residual charge on the input to inverter 261, and thus inverter 261 couples, at its output, a signal corresponding to the complement of the ADRS address signal.

Since at this point pass transistor 266 is maintained on by its residual charge, it couples the output signal from inverter 261 to a line 272, which carries an ADRS NXT address next signal to the next address control circuit 215 in the switching circuit 210 (see FIG. 9). It will be appreciated that the inverter 261 included in the latch circuit 260, which comprises the latch described above in connection with FIG. 9, is also used as the inverter described above in connection with FIG. 9.

It will also be appreciated that, if the ADRS address signal is in a high condition while the ADRS TIME address time signal is asserted, the output signals from inverters 261 will be maintained in the conditions which they had when the address control circuit was initialized in response to the EN RTR enable router initialization signal. However, if the ADRS address signal is in a low condition, the input to inverter 261 will be low, as will the output of inverter 262. Thus, when the ADRS TIME signal is next negated, and the ADRS HOLD address hold signal is asserted, the output of inverter 262 will be in a low condition. Transistor 264, which is turned on by the ADRS HOLD address hold signal, couples the low output signal to transistors 265 and 266, turning them off, and to inverter 267, turning on transistor 270.

Since transistor 270 is turned on, the ADRS address signal is coupled onto line 272 as the ADRS NXT signal to the next address control circuit, bypassing the inverter 261 as described above in connection with FIG. 9. In addition, since transistor 265 is turned off, the ADRS address signal is blocked in the path to inverter 261 when the ADRS TIME address timing signal is next asserted, thereby isolating the latch 260 from the ADRS address signal. It will be appreciated that, once a low ADRS signal is received by latch 260, the latch 260 remains isolated from the ADRS address signal until the EN RTR enable router initialization signal is asserted, which enables transistor 265 to be turned on.

The output of transistor 261 is coupled to one input of a NOR gate 273. If the latch 260 receives four consecutive asserted signals (that is, signals at a high voltage level) through transistors 265 every time the ADRS TIME signal is asserted, which corresponds to the four RTR ADRS bits that are retired by the switching chip on which the circuit is resident (see FIG. 8B), the output signal from inverter 261 is in a low voltage condition. If the BLOCK signal from input circuit 211 (FIG. 10A) is negated (in a low voltage condition), NOR gate 273 is energized to assert (high) an ADRS EN enabling signal, which corresponds to the ADRS($v$)EN($u$) enabling signal described above in connection with FIG. 9.

Thus, if the address control circuit 215 receives an asserted ADRS address signal during the four consecutive asserted ADRS TIME address time enabling signals which define the four RTR ADRS bits, and if the P protocol bit (see FIG. 8B) has been received, which ensures that the BLOCK signal will be negated, the ADRS EN address enabling signal will be asserted. Otherwise, the ADRS EN address enabling signal will be negated.

b. Coupling circuit 216

The coupling circuit 216 includes four coupling modules 216(0) through 216(3) which are depicted in FIGS. 10B-1 and 10B-2. Coupling module 216(0) is shown in FIG. 10B-1 and the other coupling modules are depicted on FIG. 10B-2. Since the four coupling modules are similar, only coupling module 216(0) will be described in detail.

With reference to FIG. 10B-1, coupling module 261(0) receives the ADRS EN address enabling signal from the address control circuit 215 and a GRP EN 0 IN (L) group enable (asserted low) signal [which corresponds to the GRP($v$)EN($w$) group enable signal described above in connection with FIG. 9]. If the ADRS EN address enable signal is asserted (high) but the GRP EN 0 IN (L) group enable signal is asssserted (that is, also low), an AND gate 280 is asserted, which turns on a transistor 281, which in turn couples the DAT signal from FIG. 10A onto output data line 220($v$)(0).

The asserted (low) GRP EN 0 IN (L) group enable in signal is complemented by an inverter 282 to enable one input of a NAND gate 283. The second input of NAND gate 283 is the complement of the ADRS EN address enable signal from an inverter 284. If the ADRS EN signal is asserted, the output signal from inverter 284 is negated. As will be described below, with the input signals to NAND gate 283 in that condition, the NAND gate 283 generates a high (negated) GRP EN 0 OUT (L) group enable out (asserted low) output signal, which inhibits the succeeding coupling modules connected to the data output line 220($v$)(0) from coupling data signals onto the data line.

When the ADRS EN address enable signal from address control circuit 215 is negated, the GRP EN 0 OUT (L) group enable out signal has the same condition as the GRP EN 0 IN (L) group enable in signal. If the ADRS EN address enabling signal is negated, the AND gate 280 is disabled and transistor 281 is maintained in the off condition. Thus, the transistor 281 blocks the DAT signal from being coupled onto dataline 220($v$)(0). At the same time, the negated ADRS EN signal is complemented to a high voltage condition by inverter 284, which enables one input of NAND gate 283. If the GRP EN 0 IN (L) group enable in signal is asserted (low), inverter 282 couples a high signal to the other input of NAND gate 283. With the input signals in that condition, NAND gate 283 asserts the GRP EN 0 OUT (L) group enable out signal, allowing another coupling module 216(0) in another switching circuit 210 (FIG. 9) to use the data line 220($v$)(0).

If, on the other hand, the GRP EN 0 IN (L) group enable in signal is negated (high), the inverter 282 couples a low input signal to the NAND gate 283, enabling the NAND gate to transmit a high, or negated, GRP EN 0 OUT (L) group enable signal. Thus, when the ADRS EN address enable signal is negated, the asserted or negated condition of the GRP EN D OUT (L) group enable out signal to the succeding coupling module connected to the data line 220($v$)(0) is the same as the condition of the received GRP EN 0 IN (L) group enable in signal.

If the ADRS EN address enable signal is asserted, but the GRP EN 0 IN (L) group enable signal is negated (high), an AND gate 285 is energized to assert an EN 1 enabling signal, which is coupled to coupling module 216(1) and is used by that coupling module in the same way that the coupling module 216(0) uses the ADRS EN address enable signal. If the GRP EN 0 IN (L) group enable signal is asserted (low), the AND gate 285 is disabled and the EN 1 enabling signal is negated. Thus, it will be appreciated that if a coupling module 216($w$) is enabled by the ADRS EN address enable signal from the address control circuit 215, or by the EN W ("W" being 1 or 2), if it is inhibited from coupling the DAT data signal onto its respective data line 220($v$)($w$) by the negated GRP EN W IN (L) group enable signal, it will assert the EN W (W being 1, 2, or 3) to enable the next coupling module to its right. However, if a coupling module 216($w$) is enabled by both the ADRS EN address enable or EN W enabling signals and the GRP EN W IN (L) group enable signal, it will negate the EN W signal to the next coupling module to its right.

Also depicted in FIGS. 10B-1 and 10B-2 is circuitry for terminating the data lines 220($v$)(0) through 220($v$)(3) to ensure that the voltage level of the signals on those lines does not float if no coupling module couples its associated DAT data signals onto the data lines. If the GRP EN W OUT (L) group enable out signal from the last coupling module 216(0) associated with a data line 220($v$)(0) is asserted, that is, in a low voltage condition, an inverter 290 energizes a transistor 291, which causes a ground level signal to be placed on the data line 220($v$)(0). This ground level signal is coupled to the next switching chip in the routing network, or to the routing network input terminal of a PE chip. The ground level signal provides a negated signal during the P protocol bit time (FIG. 8B), enabling the miss latch 231 to be set in the input circuit 211.

As has been mentioned, the switching chips described in connection with FIGS. 9 and 10A through 10C can also perform crossbar switching, and thus are useful in the crossbar switching stage 203 (FIG. 8A). This is accomplished if only the GRP EN 0 IN (L) group enabling signal is asserted by the output terminal group and the other signals, namely the GRP EN 1 IN (L) through GRP EN 3 IN (L) group enabling signals are negated.

c. Output Terminal Group

Each output data line 220(v)(w) has an associated output circuit 217(v)(w) in the output terminal group 217(w) (FIG. 9), which also generates the GRP EN W (L) group enable signal. The circuit in an output terminal group associated with one output data line will be described in connection with FIG. 10C.

With reference to FIG. 10C, the output data line is connected to an inverter 300, which complements the DATA OUT signal and couples it to one input of a NAND gate 301. The NAND gate is controlled by a PR RTR OUT (L) precharge router out (asserted low) signal which is used in connection with the communication path continuity test described below. The PR RTR OUT (L) precharge router out signal is normally negated, that is, at a high voltage level, and in that condition, the output signal from the NAND gate 301 is the same as the DATA OUT signal.

The output of NAND gate 301 is coupled to a second NAND gate 302, which is controlled by a DR LOW RTR OUT (L) drive low router out (asserted low) signal, which also is used in connection with the communication path continuity test. The DR LOW RTR OUT (L) drive low router out (asserted low) signal is also normally negated, thus providing an output signal which is the complement of the output of NAND gate 301. The output of NAND gate 302 is again complemented in an inverter 303 which couples a DATA NXT CHP data next chip output signal onto an output line 304, which is connected to the next switching stage or to the router input of a PE chip pair. It will be appreciated that, as long as the PR RTR OUT (L) precharge router out and DR LOW RTR OUT (L) drive low router out signals are negated, the DATA NXT CHP data next chip output signal provided by inverter 303 corresponds to the DATA OUT signal input to inverter 300.

The output line 304 is also connected to a break latch 305, which is constructed in the same way as break latch 232 (FIG. 10A) and operates in response to a signal from line 304 and a LD BRK LTH OUT load break latch out timing signal from array control unit 10 (FIG. 1). Break latch 305 is used in connection with the communications path continuity test described below. If there is no disruption of the communications path, break latch 305 asserts a NO BRK OUT (L) no break out (asserted low) signal, which enables one input of an OR gate 306. OR gate 306 is also enabled by a DRV DIS output driver disable signal from other circuitry (not shown) in the array processor which controls the communications paths through routing network 30 (FIG. 2). If the DRV DIS driver disable signal is negated (low) and the NO BRK OUT (L) no break out signal is asserted (low), OR gate 306 generates the GRP EN W (L) group enable signal, which is coupled to a coupling module as depicted on FIGS. 10B-1 and 10B-2. The NO BRK OUT (L) no break out signal is also coupled to an OR gate 307, which performs the same function as OR gate 240 described in connection with the input circuit 211 (FIG. 10A).

During times other than the ACK acknowledgement bit time (FIG. 8A), the ACK TIME signal is negated. When the ACK TIME signal is negated, an AND gate 310 is disabled, isolating the data line 220(v)(w) from the output line 304. However, when the ACK TIME signal is asserted, AND gate 310 is enabled to couple the signal received from downstream circuitry, either a switching chip in a succeeding switching stage (FIG. 8A) or a PE chip, to the data line 220(v)(w). With reference to FIG. 10B-1, it will be appreciated that the transistor 281, when enabled by energized AND gate 280 to couple the DAT data signal from line 214 (FIG. 10A) onto data line 220(v)(0), is also capable of coupling the signal representing the ACK acknowledgement bit in the reverse direction from line 220(v)(0) onto line 214.

If the GRP EN N (L) group enable signal is negated (that is, in a high voltage condition), a transistor 313 is turned on. While the ACK TIME timing signal is negated, an inverter 312 also turns on another transistor 311. Transistor 311 and 313 are connected in series between line 220(v)(w) and a ground level signal represented by the legend Vss. Thus, when the two transistors are turned on, a ground level signal in placed on data line 220(v)(w) so that the voltage level of the signal on the data line does not float while the GRP EN N (L) group enable signal inhibits the coupling modules 216(v)(w) from coupling DAT data signals onto the data line. When the ACK TIME acknowledgment timing signal is asserted, inverter 312 turns off the transistor 311, which isolates the data line 220(v)(w) from the ground level signal.

d. Communications Path Continuity Test

As has been mentioned the input circuit 211 depicted in FIG. 10A and the output circuit 217(v)(w) depicted in FIG. 10C includes circuitry for performing a communications path continuity test between switching chips and for inhibiting transfers in the event of a disruption in the continuity of the communications path. With reference to FIGS. 10A and 10C, the test is performed in three stages, each initiated by means of a timing signal. First, the communications line, that is, line 230 or line 304 (it will be appreciated that line 304 corresponds to line 230 in the switching chip of the next stage), is precharged to a high voltage level by either the input circuit 211 or the output circuit. This occurs in response to the PR RTR IN (L) precharge router in (low) signal, if the precharge operation is performed by the input circuit 211, or the PR RTR OUT (L) precharge router out (low) signal if the precharge operation is performed by the output circuit.

After the communications line has been precharged, the other circuit (that is, the output circuit if the input circuit 211 precharged the line, or the input circuit 211 if the output circuit precharged the line) places a signal on the communications line which drives the line to a low voltage condition. This occurs in response to the DR LOW RTR IN (L) drive low router in (low) or DR LOW RTR OUT (L) drive low router out (low) signal. Finally, the break latch 232 or 305 in the circuit which initially precharged the line is enabled by a LD BRK LTH IN or LD BRK LTH OUT signal latches the state of the signal on the communications line. If the low signal reaches the break latch the communications line is continuous and the break latch asserts a NO BRK IN or NO BRK OUT no break signal. On the other hand, if the low signal fails to reach the break latch, the communications path is disrupted, and so the NO BRK IN or NO BRK OUT signal will be negated. The test performed by both the input circuit 211 and the output circuit at both ends of the communications path so that break latches in both circuits can be properly conditioned.

In the following description, the output line 304 is taken as the other end of input line 230; otherwise stated, input circuit 211 is in the next switching stage from the output circuit depicted in FIG. 10C. With this background, with reference to FIGS. 10A and 10C, when the PR RTR IN (L) precharge router in (low) signal is asserted (low), the output signal from NAND gate 246 is driven high. Since the DR LOW RTR IN (L) drive low router in (low) signal is negated (that is, high) NAND gate 246 couples a low signal to inverter 253, which inverted to a high signal and coupled to one input of AND gate 251.

Since the PR RTR IN (L) precharge router in signal is asserted (low), NAND gate 250 also couples a high signal to the second input of AND gate 251. As a result, AND gate 251 is energized, forcing line 230 to a high voltage level.

The output circuit depicted in FIG. 10C then places a low signal on line 304. This occurs when the DR LOW RTR OUT (L) drive low router out (low) signal is asserted. When that occurs, NAND gate 302 transmits a high signal, which is complemented to a low voltage level by inverter 303.

Returning to FIG. 10A, when the signal from the output circuit depicted in FIG. 10C should have reached the input circuit, the LD BRK LTH IN signal is asserted, enabling break latch 232. If the communications line between the input circuit 211 and the output circuit is not disrupted, the signal on line 230 is at a low voltage level, which is inverted by the break latch circuit to provide the asserted (high) NO BRK IN no break in signal. On the other hand, if the communications path is disrupted, the low signal from inverter 303 will not reach the break latch. Instead, the signal on line 230 will be high, which is inverted to form the negated (low) NO BRK IN no break in signal.

Similar operations are performed to load the break latch 305 in the output circuit depicted in FIG. 10C. In particular, when the PR RTR OUT (L) precharge router out (low) signal is asserted (low), the output signal from NAND gate 301 is driven high. Since the DR LOW RTR OUT (L) drive low router out (low) signal is negated (that is, high) NAND gate 302 couples a low signal to inverter 303, which is inverted to a high signal to precharge line 304.

The input circuit depicted in FIG. 10A then places a low signal on line 230. This occurs when the DR LOW RTR IN (L) drive low router in (low) signal is asserted. When that occurs, NAND gate 247 transmits a high signal, which is complemented to a low voltage level by inverter 253. The low signal from inverter 253 disables AND gate 251, causing a low signal to be placed on line 230.

Returning to FIG. 10C, when the signal from the input circuit depicted in FIG. 10A should have reached the output circuit, the LD BRK LTH OUT signal is asserted, enabling break latch 305. If the communications line between the input circuit 211 and the output circuit is not disrupted, the signal on line 304 is at a low voltage level, which is inverted by the break latch circuit 305 to provide the asserted (high) NO BRK OUT no break out signal. On the other hand, if the communications path is disrupted, the low signal from AND gate 251 will not reach the break latch 305. Instead, the signal on line 304 will be high, which is coupled through latch 305 to provide the negated NO BRK OUT(L) no break out (asserted low) signal.

The foregoing description has been limited to a specific embodiment of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. A routing network for transferring messages, each message including an address and data, among a plurality of processing elements in an array processing system, said routing network comprising: I. a series of initial switching stages each including:
   A. a plurality of switching elements, each comprising a plurality of output terminal groups, each group comprising a plurality of output terminal means, each output terminal group being identified by a decoding of a selected portion of an address;
   B. a plurality of data lines each connected to an output terminal means, wherein all of said data lines, from each said switching element in said switching stage, connected to said output terminal means belonging to said output terminal group identified by the same said address decoding, are also connected to the same switching element in the next switching stage;
   C. circuit means for receiving a message and coupling it onto a selected one of said data lines, said circuit means including:
      i. input circuit means for receiving an input message and having an address output terminal for transmitting said address and a data output terminal for transmitting said data;
      ii. a plurality of address control circuits for decoding the address from the address output terminal of said input circuit means, each address control circuit generating an address enabling signal in response to a predetermined encoding of the address;
      iii. a plurality of coupling means groups each connected to an address control circuit for receiving an enabling signal therefrom, each coupling means group including a coupling means each connected to a data line, one of said coupling means within a coupling means group coupling said data from said input circuit means onto a data line in response to the receipt of said address enabling signal from said address circuit means; and II. a crossbar switch stages for receiving messages from the output terminal groups of the last of the series of initial switching stages, for performing a switching operation in connection with the messages, and for coupling the switched messages to the processing elements.

2. A routing network as defined in claim 1 in which the coupling means within said coupling means group are interconnected in a predetermined order, with a high order coupling means being connected to receive said address enabling signal from said address control circuit, and each coupling means being connected to transmit the address enabling signal to the next lower order coupling means if it does not couple said data from said input circuit means onto a data line.

3. A routing network as defined in claim 2 in which each output terminal means includes means for generating a coupling enabling signal in response to a selected condition, each coupling means including:
  A. coupling enabling signal receiving means for receiving a coupling enabling signal;
  B. data coupling means responsive to the receipt of a coupling enabling signal and an address enabling signal for coupling data from said input circuit means onto a data line; and
  C. coupling enabling signal transmitting means connected to said coupling enabling signal receiving means and said data coupling means for transmitting the coupling enabling signal to another coupling means in response to the receipt of a coupling enabling signal if said data coupling means does not couple data from said input circuit means onto a data line.

4. A routing network as defined in claim 3 in which said data coupling means comprises:
  A. pass transistor means connected to said input circuit means and said data line for transferring data between said input circuit means, data output terminal and said data line in response to a pass transistor control signal;
  B. control signal generating means connected to receive said coupling enabling signal and said address enabling signal for generating said pass transistor control signal in response to the coincidence of said address enabling signal and said coupling enabling signal.

5. A routing network as defined in claim 4 in which said coupling means further includes coincidence means connected to receive said coupling enabling signal and said address enabling signal for transmitting an address enabling signal to said next lower order coupling means in response to the coincidence of the assertion of said address enabling signal and the negation of said coupling enabling signal.

6. A routing network as defined in claim 1 in which said input circuit means further includes block signal generating means for generating a block signal in response to a selected condition, said address control circuits being disabled in response to the receipt of a block signal.

7. A routing network as defined in claim 6 in which each said address control circuit includes:
  A. block signal receiving means connected to said input circuit means for receiving said block signal;
  B. address decoding means connected to said input circuit means for generating an address decode signal in response to a selected decoding of the address from said input circuit means;
  C. address enabling signal generating means connected to said block signal receiving means and said address decoding means for generating said address enabling signal in response to the receipt of said address decode signal and the absence of said block signal.

8. A routing network as defined in claim 6 in which said address includes a protocol bit, said input circuit including protocol means for detecting said protocol bit and for generating a mess signal if said protocol bit is not detected, said block signal generating means being connected to said protocol means for generating said block signal in response to the generation of said miss signal.

9. A routing network as defined in claim 6 in which said each input circuit means is connected to a message transfer wire for receiving a message thereover, said input circuit including broken wire detection means for detecting the condition of the message transfer wire and generating a broken wire signal in response thereto, said block signal generating means being connected to said broken wire detection means for generating said block signal in response to the generation of said broken wire signal.

10. A routing network as defined in claim 9 in which each said output terminal means is also connected to a message transfer wire, said message transfer wire transferring messages between said output terminal means of one of said initial switching stages and said input means of succeeding one of said initial switching stages, said output terminal means also including broken wire detection means,
  A. each said broken wire detection means including:
    i. broken wire signal generating means connected to said message transfer wire for transmitting a signal over said message transfer wire;
    ii. broken wire latch means connected to said message transfer wire for latching a signal received over said message transfer wire and generate said broken wire signal in response to the condition of the latched signal; and
  B. said routing network further including broken wire control means connected to said broken wire signal generating means and said broken wire latch means in each broken wire detection means for separately enabling said broken wire generating means in said input means and said output terminal means to transmit a signal on the message transfer line, and the broken wire latch means in the other of input means and said output terminal means to latch the condition of the signal on the message transfer line.

11. A routing network as defined in claim 1 in which said address comprises a predetermined number of serial address bit signals, and wherein said address control circuits in each circuit means are connected in series ordered relationship from the circuit means' input circuit means, each address control circuit including:
  A. address bit signal receiving means for receiving an address bit signal from said input circuit or from another address control circuit in said series order;
  B. address bit complement means connected to said address bit signal receiving means for generating a complement address bit signal in response to the address bit signal received by said address bit signal receiving means;
  C. multiplexer means connected to said address bit signal receiving means and said address bit complement means for selectively coupling either the address bit signal or the complement address bit signal to the next address control circuit in the series order; and
  D. control means connected to said address bit signal receiving means and said multiplexer means for controlling said multiplexer means, said control means including:
    i. address bit signal coupling means connected to said address bit signal receiving means for coupling said address bit signal received by said address bit signal receiving means;

ii. latch means connected to said address bit signal coupling means and said multiplexer means for latching the address bit signal received from said address bit signal coupling means and for controlling said address bit signal coupling means and said multiplexer means in response thereto, said latch means controlling said address bit signal coupling means to couple address bit signals thereto while said address bit signals have a selected condition and contemporaneously enabling said multiplexer means to couple the complement address bit signal to the next address control circuit, and to disable said address bit signal coupling means on receipt of an address bit signal having another condition and contemporaneously enabling said multiplexer means to couples said address bit signal to the next address control circuit.

12. A routing network as defined in claim 1 for transferring messages each including an acknowledge bit in response to an acknowledge transfer enabling signal, each output terminal means includes means connected to its data line and an output terminal for coupling data signals from said data line to said output terminal, and output gate means connected to said output terminal and said data line for coupling said acknowledge bit from said output terminal to said data line in response to said acknowledge transfer enabling signal, each of said input circuit means including input gate means connected to said data output terminal and for coupling said acknowledge bit from said data output terminal to said input terminal in response to the receipt of said acknowledge transfer enabling signal.

13. A routing stage for transferring messages among a plurality of processing elements in a routing network, the routing stage including:
  A. a plurality of switching elements, each comprising a plurality of output terminal groups each comprising a plurality of output terminal means, each output terminal group being identified by a decoding of a selected portion of an address;
  B. a plurality of data lines each connected to an output terminal means, wherein all said data lines, from each said switching element in said switching stage, connected to said output terminal means belonging to said output terminal group identified by the same said address decoding, are also connected to same said switching element in the next subsequent routing stage;
  C. circuit means for receiving a message and coupling it onto a selected one of said data lines, said circuit means including:
    i. input circuit means for receiving an input message and having an address output terminal for transmitting said address and a data output terminal for transmitting said data;
    ii. a plurality of address control circuit for decoding the address from address output terminal of said input circuit means each address control circuit generating an address enabling signal in response to a predetermined encoding of the address; and
    iii. a plurality of coupling means groups each connected to an address control circuit for receiving an enabling signal therefrom, each coupling means group including a plurality of coupling means each connected to a data line, one of said coupling means within a coupling means group coupling said data from said input circuit means onto a data line in response to the receipt of said address enabling signal from said address circuit means.

14. A routing network as defined in claim 13 in which the coupling means within said coupling means group are interconnected in a predetermined order, with a high order coupling means being connected to receive said address enabling signal from said address control circuit, and each coupling means being connected to transmit the address enabling signal to the next lower order coupling means if it does not couple said data from said input circuit means onto a data line.

15. A routing stage as defined in claim 14 in which each output terminal means includes means for generating a coupling enabling signal in response to a selected condition, each coupling means including:
  A. coupling enabling signal receiving means for receiving a coupling enabling signal;
  B. data coupling means responsive to the receipt of a coupling enabling signal and an address enabling signal for coupling data from said input circuit means onto a data line; and
  C. coupling enabling signal transmitting means connected to said coupling enabling signal receiving means and said data coupling means for transmitting the coupling enabling signal to another coupling means in response to the receipt of a coupling enabling signal if said data coupling means does not couple data from said input circuit means onto a data line.

16. A routing network as defined in claim 15 in which said data coupling means comprises:
  A. pass transistor means connected to said input circuit means and said data line for transferring data between said input circuit means' data output terminal and said data line in response to a pass transistor control signal;
  B. control signal generating means connected to receive said coupling enabling signal and said address enabling signal for generating said pass transistor control signal in response to the coincidence of said address enabling signal and said coupling enabling signal.

17. A routing network as defined in claim 16 in which said coupling means further includes coincidence means connected to receive said coupling enabling signal and said address enabling signal for transmitting an address enabling signal to said next lower order coupling means in response to the coincidence of an assertion of said address enabling signal and the negation of said coupling enabling signal.

18. A routing stage as defined in claim 13 in which said input circuit means further includes block signal generating means for generating a block signal in response to a selected condition, said address control circuit being disabled in response to the receipt of a block signal.

19. A routing stage as defined in claim 18 in which each said address control circuit includes:
  A. block signal receiving means connected to said input circuit means for receiving said block signal;
  B. address decoding means connected to said input circuit means for generating an address decode signal in response to a selected decoding of the address from said input circuit means;
  C. address enabling signal generating means connected to said block signal receiving means and said address decoding means for generating said address enabling signal in response to the receipt of said address decode signal and the absence of said block signal.

20. A routing stage as defined in claim 18 in which said address includes a protocol bit, said input circuit including protocol means for detecting said protocol bit and for generating a miss signal if said protocol bit it not detected, said block signal generating means being connected to said protocol means for generating said block signal in response to the generation of said miss signal.

21. A routing stage as defined in claim 18 in which said each input circuit means is connected to a message transfer wire for receiving a message thereover, said input circuit including broken wire detection means for detecting the condition of the message transfer wire and generating a broken wire signal in response thereto, said block signal generating means being connected to said broken wire detection means for generating said block signal in response to the generation of said broken wire signal.

22. A routing stage as defined in claim 21 in which each said output terminal means is also connected to a message transfer wire, said message transfer wires transferring messages between said output terminal means and said input means, said output terminal means also including broken wire detection means,
   A. each said broken wire detection means including:
      i. broken wire signal generating means connected to said message transfer wire for transmitting a signal over said message transfer wire;
      ii. broken wire latch means connected to said message transfer wire for latching a signal received over said message transfer wire and generate said broken wire signal in response to the condition of the latched signal; and
   B. said routing network further including broken wire control means connected to said broken wire signal generating means and said broken wire latch means in each broken wire detection means for separately enabling said broken wire signal generating means in said input means and said output terminal means to transmit a signal on the message transfer line, and the broken wire latch means in the other of input means and said output terminal means to latch the condition of the signal on the message transfer line.

23. A routing stage as defined in claim 13 in which said address comprises a predetermined number of serial address bit signals, and wherein said address control circuits in each circuit means are connected in series ordered relationship for the circuit means' input circuit means, each address control circuit including:
   A. address bit signal receiving means for receiving an address bit signal from said input circuit or from another address control circuit in said series order;
   B. address bit complement means connected to said address bit signal receiving means for generating a complement address bit signal in response to the address bit signal received by said address bit signal receiving means;
   C. multiplexer means connected to said address bit signal receiving means and said address bit complement means for selectively coupling either the address bit signal or the complement address bit signal to the next address control circuit in the series order; and
   D. control means connected to said address bit signal receiving means and said multiplexer means for controlling said multiplexer means, said control means including:
      i. address bit signal coupling means connected to said address bit signal receiving means for coupling said address bit signal received by said address bit signal receiving means;
      ii. latch means connected to said address bit signal coupling means and said multiplexer means for latching the address bit signal received from said address bit signal coupling means and for controlling said address bit signal coupling means and said multiplexer means in response thereto, said latch means controlling said address bit signal coupling means to couple address bit signals thereto while said address bit signals have a selected condition and contemporaneously enabling said multiplexer means to couple the complement address bit signal to the next address control circuit, and to disable said address bit signal coupling means on receipt of an address bit signal having another condition and contemporaneously enabling said multiplexer means to couples said address bit signal to the next address control circuit.

24. A routing stage as defined in claim 13 for transferring messages each including an acknowledge bit in response to an acknowledge transfer enabling signal, each output terminal means includes means connected to its data line and an output terminal for coupling data signals from said data line to said output terminal, and output gate means connected to said output terminal and said data line for coupling said acknowledge bit from said output terminal to said data line in response to said acknowledge transfer enabling signal, each of said input circuit means including input gate means connected to said data output terminal and for coupling said acknowledge bit from said data output terminal to said input terminal in response to the receipt of said acknowledge transfer enabling signal.

25. A routing network for transferring messages among a plurality of processing elements in an array processing system, said routing network switching messages in a plurality of initial switching stages and terminating in a crossbar switch stage, each processing element transmitting an address and data with each message, each of said initial switching stages including:
   A. a plurality of output terminal groups each comprising a plurality of output terminal means, each output terminal group being identified by a decoding of a selected portion of an address, and each output terminal means includes means for generating a coupling enabling signal in response to a selected condition;
   B. a plurality of data lines each connected to an output terminal means;
   C. circuit means for receiving a message and coupling it onto a selected one of said data lines, said circuit means including:
      i. input circuit means for receiving an input message and having an address output terminal for transmitting said address and a data output terminal for transmitting said data;
      ii. a plurality of address control circuits for decoding the address from address output terminal of said input circuit means, each address control circuit generating an address enabling signal in response to a predetermined encoding of the address; and iii. a plurality of coupling means groups each connected to an address control circuit for receiving an enabling signal therefrom, each coupling means group including a plurality of coupling means each connected to a data line, one of said coupling means within a coupling means group coupling said data from said input circuit means onto a data line in response to the receipt of said address enabling signal from said address circuit means, wherein said coupling means within said coupling means group are interconnected in a predetermined order, with a high order coupling means being connected to receive said address enabling signal from said address control circuit, and each coupling means being connected to transmit the address enabling signal to the next lower order coupling means if it does not couple said data from said input circuit means onto a data line, each coupling means including:

a. coupling enabling signal receiving means for receiving a coupling enabling signal;

b. data coupling means responsive to the receipt of a coupling enabling signal and an address enabling signal for coupling data from said input circuit means onto a data line; and c. coupling enabling signal transmitting means connected to said coupling enabling signal receiving means and said data coupling means for transmitting the coupling enabling signal to another coupling means in response to the receipt of a coupling enabling signal if said data coupling mean does not couple data from said input circuit means on to a data line.

26. A routing network as defined in claim 25 in which said data coupling means comprises:

A. pass transistor means connected to said input circuit means and said data line for transferring data between said input circuit means' data output terminal and said data line in response to a pass transistor control signal;

B. control signal generating means connected to receive said coupling enabling signal and said address enabling signal for generating said pass transistor control signal in response to the coincidence of said address enabling signal and said coupling enabling signal.

27. A routing network as defined in claim 26 in which said coupling means further includes coincidence means connected to receive said coupling enabling signal and said address enabling signal for transmitting an address enabling signal to said next lower order coupling means in response to the coincidence of the assertion of said address enabling signal and the negation of said coupling enabling signal.

28. A routing network for transferring messages among a plurality of processing elements in an array processing system, said routing network switching messages in a plurality of initial switching stages and terminating in a crossbar switch stage, each processing element transmitting an address and data with each message, said address including a protocol bit, each of said initial switching stages including:

A. a plurality of output terminal groups each comprising a plurality of output terminal means, each output terminal group being identified by a decoding of a selected portion of an address;

B. a plurality of data lines each connected to an output terminal means;

C. circuit means for receiving a message and coupling it onto a selected one of said data lines, said circuit means including:

i. input circuit means for receiving an input message and having an address output terminal for transmitting said address and a data output terminal for transmitting said data, said input circuit means further includes:

a. block signal generating means for generating a block signal in response to a selected condition;

b. protocol means for detecting said protocol bit and for generating a miss signal if said protocol bit is not detected, said block signal generating means being connected to said protocol means for generating said block signal in response to the generation of said miss signal;

ii. a plurality of address control circuits for decoding the address from address output terminal of said input circuit means, each address control circuit generating an address enabling signal in response to a predetermined encoding of the address, said address control circuits being disabled in response to the receipt of a block signal; and iii. a plurality of coupling means groups each connected to an address control circuit for receiving an enabling signal therefrom, each coupling means group including a plurality of coupling means each connected to a data line, one of said coupling means within a coupling means group coupling said data from said input circuit means onto a data line in response to the receipt of said address enabling signal from said address circuit means.

29. A routing network for transferring messages among a plurality of processing elements in an array processing system, said routing network switching messages in a plurality of initial switching stages and terminating in a crossbar switch stage, each processing element transmitting an address and data with each message, each of said initial switching stages including:

A. a plurality of output terminal groups each comprising a plurality of output terminal means, each output terminal group being identified by a decoding of a selected portion of an address;

B. a plurality of data lines each connected to an output terminal means;

C. circuit means for receiving a message and coupling it onto a selected one of said data lines, said circuit means including:

i. input circuit means for receiving an input message and having an address output terminal for transmitting said address and a data output terminal for transmitting said data, said each input circuit means is connected to a message transfer wire for receiving a message thereover, said input circuit means further includes:

a. block signal generating means for generating a block signal in response to a selected condition;

b. broken wire detection means for detecting the condition of the message transfer wire and generating a broken wire signal is response thereto, said block signal generating means being connected to said broken wire detection means for generating said block signal in response to the generation of said broken wire signal;
ii. a plurality of address control circuits for decoding the address from address output terminal of said input circuit means, each address control circuit generating an address enabling signal in response to a predetermined encoding of the address, said address control circuit being disabled in response to the receipt of a block signal; and
iii. a plurality of coupling means groups each connected to an address control circuit for receiving an enabling signal therefrom, each coupling means group including a plurality of coupling means each connected to a data line, one of said coupling means within a coupling means group coupling said data from said input circuit means onto a data line in response to the receipt of said address enabling signal from said address circuit means.

30. A routing network as defined in claim 29 in which each said output terminal means is also connected to a message transfer wire, said message transfer wires transferring messages between said output terminal means of one of said initial switching stages and said input means of succeeding one of said initial switching stages, said output terminal means also including broken wire detection means,
  A. each said broken wire detection means including:
    i. broken wire signal generating means connected to said message transfer wire for transmitting a signal over said message transfer wire;
    ii. broken wire latch means connected to said message transfer wire for latching a signal received over said message transfer wire and generate said broken wire signal in response to the condition of the latched signal; and
  B. said routing network further including broken wire control means connected to said broken wire signal generating means and said broken wire latch means in each broken wire detection means for separately enabling said broken wire generating means in said input means and said output terminal means to transmit a signal on the message transfer line, and the broken wire latch means in the other of input means and said output terminal means to latch the condition of the signal on the message transfer line.

31. A routing network for transferring messages among a plurality of processing elements in an array processing system, said routing network switching messages in a plurality of initial switching stages and terminating in a crossbar switch stage, each processing element transmitting an address and data with each message, each of said initial switching stages including:
  A. a plurality of output terminal groups each comprising a plurality of output terminal means, each output terminal group being identified by a decoding of a selected portion of an address;
  B. a plurality of data lines each connected to an output terminal means;
  C. circuit means for receiving a message and coupling it onto a selected one of said data lines, said circuit means including:
    i. input circuit means for receiving an input messages and having an address output terminal for transmitting said address and a data output terminal for transmitting said data;
    ii. a plurality of address control circuits for decoding the address from address output terminal of said input circuit means, each address control circuit generating an address enabling signal in response to a predetermined encoding of the address, wherein said address comprises a predetermined number of serial address bit signals, and wherein said address control circuits in each circuit means are connected in series ordered relationship from the circuit means' input circuit means, each address control circuit including:
      a. address bit signal receiving means for receiving an address bit signal from said input circuit or from another address control circuit in said series order;
      b. address bit signal complement means connected to said address bit signal receiving means for generating a complement address bit signal in response to the address bit signal received by said address bit signal receiving means;
      c. multiplexer means connected to said address bit signal receiving means and said address bit complement means for selectively coupling either the address bit signal or the complement address bit signal to the next address control circuit in the series order; and
      d. control means connected to said address bit signal receiving means and said multiplexer means for controlling said multiplexer means, said control means including:
        (i.) address bit signal coupling means connected to said address bit signal receiving means for coupling said address bit signal received by said address bit signal receiving means;
        (ii.) latch means connected to said address bit signal coupling means and said multiplexer means for latching the address bit signal received from said address bit signal coupling means and for controlling said address bit signal coupling means and said multiplexer means in response thereto, said latch means controlling said address bit signal coupling means to couple address bit signals thereto while said address bit signals have a selected condition and contemporaneously enabling said multiplexer means to couple the complement address bit signal to the next address control circuit, and to disable said address bit signal coupling means on receipt of an address bit signal having another condition and contemporaneously enabling said multiplexer means to couple said address bit signal to the next address control circuit;
        (iii.) a plurality of coupling means groups each connected to an address control circuit for receiving an enabling signal therefrom, each coupling means group including a plurality of coupling means each connected to a data line, one of said coupling means within a coupling means group coupling said data from said input circuit means onto a data line in response to the receipt of said address enabling signal from said address circuit means.

32. A routing network for transferring messages among a plurality of processing elements in an array processing system, said routing network switching messages in a plurality of initial switching stages and terminating in a crossbar switch stage, each processing element transmitting an address and data with each message, each of said initial switching stages including:
A. a plurality of output terminal groups each comprising aplurality of output terminal means, each output terminal group being identified by a decoding of a selected portion of an address;
B. a plurality of data lines each connected to an output terminal means;
C. circuit means for receiving a message and coupling it onto a selected one of said data lines, said circuit means including:
i. input circuit means for receiving an input message and having an address output terminal for transmitting said address and a data output terminal for transmitting said data;
ii. a plurality of address control circuits for decoding the address from address output terminal of said input circuit means, each address control circuit generating an address enabling signal in response to a predetermined encoding of the address; and
iii. a plurality of coupling means groups each connected to an address control circuit for receiving an enabling signal therefrom, each coupling means group including a plurality of coupling means each connected to a data line, one of said coupling means within a coupling means group coupling said data from said input circuit means onto a data line in response to the receipt of said address enabling signal from said address circuit means;

wherein each said message includes an acknowledge bit in response to an acknowledge transfer enabling signal, each output terminal means includes means connected to its data line and an output terminal for coupling data signals from said data line to said output terminal, and output gate means connected to said output terminal and said data line for coupling said acknowledge bit from said output terminal to said data line in response to said acknowledge transfer enabling signal, each of said input circuit means including input gate means connected to said data output terminal and for coupling said acknowledge bit from said data output terminal to said input terminal in response to the receipt of said acknowledge transfer enabling signal.

33. A routing stage for transferring messages among a plurality of processing elements in a routing network, the routing stage including:
A. a plurality of output terminal groups each comprising a plurality of output terminal means, each output terminal group being identified by a decoding of a selected portion of an address, and each output terminal means includes means for generating a coupling enabling signal in response to a selected condition;
B. a plurality of data lines each connected to an output terminal means;
C. circuit means for receiving a message and coupling it onto a selected one of said data lines, said circuit means including:
i. input circuit means for receiving an input message and having an address output terminal for transmitting said address and a data output terminal for transmitting said data;
ii. A plurality of address control circuits for decoding the address from address output terminal of said input circuit means, each address control circuit generating an address enabling signal in response to a predetermined encoding of the address; and
iii. a plurality of coupling means groups each connected to an address control circuit for receiving an enabling signal therefrom, each coupling means group including a plurality of coupling means each connected to a data line, one of said coupling means within a coupling means group coupling said data from said input circuit means onto a data line in response to the receipt of said address enabling signal from said address circuit means, wherein said coupling means within said coupling means group are interconnected to a predetermined order, with a high order coupling means being connected to receive said address enabling signal from said address control circuit, and each coupling means being connected to transmit the address enabling signal to the next lower order coupling means if it does not couple said data from said input circuit means onto a data line, each coupling means including:
a. coupling enabling signal receiving means for receiving a coupling enabling signal;
b. data coupling means responsive to the receipt of a coupling enabling signal and an address enabling signal for coupling data from said input circuit means onto a data line, said data coupling means comprises:
(i.) pass transistor means connected to said input circuit means and said data line for transferring data between said input circuit menas' data output terminal and said data line in response to a pass transistor control signal;
(ii.) control signal generating means connected to receive said coupling enabling signal and said address enabling signal for generating said pass transistor control signal in response to the coincidence of said address enabling signal and said coupling enabling signal;
c. coupling enabling signal transmitting means connected to said coupling enabling signal receiving means and said data coupling means for transmitting the coupling enabling signal to another coupling means in response to the receipt of a coupling enabling signal if said data coupling means does not couple data from said input circuit means onto a data line.

34. A routing network as defined in claim 33 in which said coupling means further includes coincidence means connected to receive said coupling enabling signal and said address enabling signal for transmitting an address enabling signal to said next lower order coupling means in response to the coincidence of an assertion of said address enabling signal and the negation of said coupling enabling signal.

35. A routing stage for transferring messages among a plurality of processing elements in a routing network, the routing stage including:
- A. a plurality of output terminal groups each comprising a plurality of output terminal means, each output terminal group being identified by a decoding of a selected portion of an address, said address including a protocol bit;
- B. a plurality of data lines each connected to an output terminal means;
- C. circuit means for receiving a message and coupling it onto a selected one of said data lines, said circuit means including:
  - i. input circuit means for receiving an input message and having an address output terminal for transmitting said address and a data output terminal for transmitting said data said input circuit means further includes:
    - a. block signal generating means for generating a block signal in response to a selected condition;
    - b. a protocol means for detecting said protocol bit and for generating a miss signal if said protocol bit it not detected, said block signal generating means being connected to said protocol means for generating said block signal in response to the generation of said miss signal;
  - ii. a plurality of address control circuits for decoding the address from address output terminal of said input circuit means, each address control circuit generating an address enabling signal in response to a predetermined encoding of the address said address control circuit being disabled in response to the receipt of a block signal; and
  - iii. a plurality of coupling means groups each connected to an address control circuit for receiving an enabling signal therefrom, each coupling means group including a plurality of coupling means each connected to a data line, one of said coupling means within a coupling means group coupling said data from said input circuit means onto a data line in response to the receipt of said address enabling signal from said address circuit means.

36. A routing stage for transferring messages among a plurality of processing elements in a routing network, the routing stage including:
- A. a plurality of output terminal groups each comprising a plurality of output terminal means, each output terminal group being identified by a decoding of a selected portion of an address;
- B. a plurality of a data lines each connected to an output terminal means;
- C. circuit means for receiving a message and coupling it onto a selected one of said data lines, said circuit means including:
  - i. input circuit means for receiving an input message and having an address output terminal for transmitting said address and a data output terminal for transmitting said data said each input circuit means is connected to a message transfer wire for receiving a message thereover, said input circuit means further includes:
    - a. block signal generating means for generating a block signal in response to a selected condition;
    - b. broken wire detection means for detecting the condition of the message transfer wire and generating a broken wire signal in response thereto, said block signal generating means being connected to said broken wire detection means for generating said block signal in response to the generation of said broken wire signal;
  - ii. a plurality of address control circuits for decoding the address from address output terminal of said input circuit means, each address control circuit generating an address enabling signal in response to a predetermined encoding of the address, said address control circuit being disabled in response to the receipt of a block signal; and
  - iii. a plurality of coupling means groups each connected to an address control circuit for receiving an enabling signal therefrom, each coupling means group including a plurality of coupling means each connected to a data line, one of said coupling means within a coupling means group coupling said data from said input circuit means onto a data line in response to the receipt of said address enabling signal from said address circuit means.

37. A routing stage as defined in claim 36 in which each said output terminal means is also connected to a message transfer wire, said message transfer wires transferring messages between said output terminal means and said input means, said output terminal means also including broken wire detection means,
- A. each said broken wire detection means including:
  - i. broken wire signal generating means connected to said message transfer wire for transmitting a signal over said message transfer wire;
  - ii. broken wire latch means connected to said message transfer wire for latching a signal received over said message transfer wire and generate said broken wire signal in response to the condition of the latched signal; and
- B. said routing network further including broken wire control means connected to said broken wire signal generating means and said broken wire latch means in reach broken wire detection means for separately enabling said broken wire signal generating means in said input means and said output terminal means to transmit a signal on the message transfer line, and the broken wire latch means in the other of input means and said output terminal means to latch the condition of the signal on the message transfer line.

38. A routing stage for transferring messages among a plurality of processing elements in a routing network, the routing stage including:
- A. a plurality of output terminal groups each comprising a plurality of output terminal means, each output terminal group being identified by a decoding of a selected portion of an address;
- B. a plurality of data lines each connected to an output terminal means;
- C. circuit means for receiving a message and coupling it onto a selected one of said data lines, said circuit means including:
  - i. input circuit means for receiving an input message and having an address output terminal for transmitting said address and a data output terminal for transmitting said data;

ii. a plurality of address control circuits for decoding the address from address output terminal of said input circuit means, each address control circuit generating an address enabling signal in response to a predetermined encoding of the address, wherein said address comprises a predetermined number of serial address bit signals, and wherein said address control circuits in each circuit means are connected in series ordered relationship form the circuit means' input circuit means, each address control circuit including:

a. address bit signal receiving means for receiving an address bit signal from said input circuit or from another address control circuit in said series order;

b. address bit signal complement means connected to said address bit signal receiving means for generating a complement address bit signal in response to the address bit signal received by said address bit signal receiving means;

c. multiplexer means connected to said address bit signal receiving means and said address bit signal complement means for selectively coupling either the address bit signal or the complement address bit signal to the next address control circuit in the series order; and d. control means connected to said address bit signal receiving means and said multiplexer means for controlling said multiplexer means, said control means including:

(i.) address bit signal coupling means connected to said address bit signal receiving means for coupling said address bit signal received by said address bit signal receiving means;

(ii.) latch means connected to said address bit signal coupling means and said multiplexer means for latching the address bit signal received from said address bit signal coupling means and for controlling said address bit signal coupling means and said multiplexer means in response thereto, said latch means controlling said address bit signal coupling means to couple address bit signals thereto while said address bit signals have a selected condition and contemporaneously enabling said multiplexer means to couple the complement address bit signal to the next address control circuit, and to disable said address bit signal coupling means on receipt of an address bit signal having another condition and contemporaneously enabling said multiplexer means to couple said address bit signal to the enxt address control circuit;

(iii.) a plurality of coupling means groups each connected to an address control circuit for receiving an enabling signal therefrom, each coupling means group including a plurality of coupling means each connected to a data line, one of said coupling means within a coupling means group coupling said data from said input circuit means onto a data line in response to the receipt of said address enabling signal from said address circuit means.

39. A routing stage for transferring messages among a plurality of processing elements in a routing network, the routing stage including:

A. a plurality of output terminal groups each comprising a plurality of output terminal means, each output terminal group being identified by a decoding of a selected portion of an address;

B. a plurality of data lines each connected to an output terminal means;

C. circuit means for receiving a message and coupling it onto a selected one of said data lines, said circuit means including:

i. input circuit means for receiving an input message and having an address output terminal for transmitting said address and a data output terminal for transmitting said data;

ii. a plurality of address control circuits for decoding the address from address output terminal said input circuit means, each address control circuit generating an address enabling signal in response to a predetermined encoding of the address; and iii. a plurality of coupling means groups each connected to an address control circuit for receiving an enabling signal therefrom, each coupling means group including a plurality of coupling means each connected to a data line, one of said coupling means within a coupling means group coupling said data from said input circuit means onto a data line in response to the receipt of said address enabling signal from said address circuit means;

wherein each said message includes an acknowledge bit in response to an acknowledge transfer enabling signal, each output terminal means includes means connected to its data line and an output terminal for coupling data signals from said data line to said output terminal, and output gate means connected to said output terminal and said data line for coupling said acknowledge bit from said output terminal to said data line in response to said acknowledge transfer enabling signal, each of said input circuit means including input gate means connected to said data output terminal and for coupling said acknowledge bit from said data output terminal to said input terminal in response to the receipt of said acknowledge transfer enabling signal.

40. A routing stage for transferring messages among a plurality of processing elements in a routing network, the routing stage including:

A. a plurality of output terminal groups each comprising a plurality of output terminal means, each output terminal group being identified by a decoding of a selected portion of an address, and each output terminal means includes means for generating a coupling enabling signal in response to a selected condition;

B. a plurality of data lines each connected to an output terminal means;

C. circuit means for receiving a message and coupling it onto a selected one of said data lines, said circuit means including:

i. input circuit means for receiving an input message and having an address output terminal for transmitting said address and a data output terminal for transmitting said data;

ii. a plurality of address control circuits for decoding the address from address output terminal of said input circuit means, each address control circuit generating an address enabling signal in response to a predetermined encoding of the address; and iii. a plurality of coupling means groups each connected to an address control circuit for receiving an enabling signal therefrom, each coupling means group including a plurality of coupling means each connected to a data line, one of said coupling means within a coupling means group coupling said data from said input circuit means onto a data line in response to the receipt of said address enabling signal from said address circuit means, wherein said coupling means within said coupling means group are interconnected in a predetermined order, with a high order coupling means being connected to received said address enabling signal from said address control circuit, and each coupling means being connected to transmit the address enabling signal to the next lower order coupling means if it does not couple said data from said input circuit means onto a data line, each coupling means including:

a. coupling enabling signal receiving means for receiving a coupling enabling signal;

b. data coupling means responsive to the receipt of a coupling enabling signal and an address enabling signal from coupling data from said input circuit means onto a data line; and c. coupling enabling signal transmitting means connected to said coupling enabling signal receiving means and said data coupling means for transmitting the coupling enabling signal to another coupling means in response to the receipt of a coupling enabling signal if said data coupling means does not couple data from said input circuit means onto a data line.

41. A routing network for transferring messages among a plurality of processing elements in an array processing system, said routing network switching messages in a plurality of initial switching stages and terminating in a crossbar switch stage, each processing element transmitting an address and data with each message, each of said initial switching stages including:

A. a plurality of output terminal groups each comprising a plurality of output terminal means, each output terminal group being identified by a decoding of a selected portion of an address, and each output terminal means includes means for generating a coupling enabling signal in response to a selected condition;

B. a plurality of data lines each connected to an output terminal means;

C. circuit means for receiving a message and coupling it onto a selected one of said data lines, said circuit means including:

i. input circuit means for receiving an input message and having an address output terminal for transmitting said address and a data output terminal for transmitting said data;

ii. a plurality of address control circuits for decoding the address from address output terminal of said input circuit means, each address control circuit generating an address enabling signal in response to a predetermined encoding of the address; and iii. a plurality of coupling means groups each connected to an address control circuit for receiving an enabling signal therefrom, each coupling means group including a plurality of coupling means each connected to a data line, one of said coupling means within a coupling means group coupling said data rom said input circuit means onto a data line in response to the receipt of said address enabling signal from said address circuit means, wherein said coupling means within said coupling means group are interconnected in a predetermined order, with a high order coupling means being connected to receive said address enabling signal from said address control circuit, and each coupling means being connected to transmit the address enabling signal to the next lower order coupling means if it does not couple said data from said input circuit means onto a data line.

42. A routing stage for transferring messages among a plurality of processing elements in a routing network, the routing stage including:

A. a plurality of output terminal groups each comprising a plurality of output terminal means, each output terminal group being identified by a decoding of a selected portion of an address, and each output terminal means includes means for generating a coupling enabling signal in response to a selected condition;

B. a plurality of data lines each connected to an output terminal means;

C. circuit means for receiving a message and coupling it onto a selected one of said data lines, said circuit means including:

i. input circuit means for receiving an input message and having an address output terminal for transmitting said address and a data output terminal for transmitting said data;

ii. a plurality of address control circuits for decoding the address from address output terminal of said input circuit means, each address control circuit generating an address enabling signal in response to a predetermined encoding of the address; and iii. a plurality of coupling means groups each connected to an address control circuit for receiving an enabling signal therefrom, each coupling means group including a plurality of coupling means each connected to a data line, one of said coupling means within a coupling means group coupling said data from said input circuit means onto a data line in response to the receipt of said address enabling signal from said address circuit means, wherein said coupling means within said coupling means group are interconnected in a predetermined order, with a high order coupling means being connected to receive said address enabling signal from said address control circuit, and each coupling means being connected to transmit the address enabling signal to the next lower order coupling means if it does not couple said data from said input circuit means onto a data line.

* * * * *